(12) United States Patent
Hoffman et al.

(10) Patent No.: US 9,309,594 B2
(45) Date of Patent: *Apr. 12, 2016

(54) SYSTEM, METHOD AND APPARATUS FOR CONTROLLING ION ENERGY DISTRIBUTION OF A PROJECTED PLASMA

(75) Inventors: Daniel J. Hoffman, Fort Collins, CO (US); Victor Brouk, Fort Collins, CO (US); Daniel Carter, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 90 days.

This patent is subject to a terminal disclaimer.

(21) Appl. No.: 13/193,345

(22) Filed: Jul. 28, 2011

(65) Prior Publication Data

US 2012/0217221 A1    Aug. 30, 2012

Related U.S. Application Data

(63) Continuation-in-part of application No. 12/870,837, filed on Aug. 29, 2010.

(51) Int. Cl.
| | |
|---|---|
| *C23C 16/50* | (2006.01) |
| *C23C 14/34* | (2006.01) |
| *H01J 37/32* | (2006.01) |

(52) U.S. Cl.
CPC ............... *C23C 16/50* (2013.01); *C23C 14/345* (2013.01); *H01J 37/32009* (2013.01); *H01J 37/32082* (2013.01); *H01J 37/3299* (2013.01); *H01J 37/32174* (2013.01); *H01J 37/32935* (2013.01)

(58) Field of Classification Search
CPC ..... C23F 1/02; H01L 21/3065; C23C 14/345; C23C 16/50; H01J 37/32009; H01J 37/3299; H01J 37/32174; H01J 37/32935; H01J 37/32082

USPC ........ 204/298.08; 118/723 ME, 723 E, 723 I; 216/61, 67; 156/345
See application file for complete search history.

(56) References Cited

U.S. PATENT DOCUMENTS

| | | | |
|---|---|---|---|
| 4,622,094 | A | 11/1986 | Otsubo |
| 4,693,805 | A | 9/1987 | Quazi |

(Continued)

FOREIGN PATENT DOCUMENTS

| | | |
|---|---|---|
| EP | 0383570 A2 | 8/1990 |
| EP | 1978542 A1 | 10/2008 |

(Continued)

OTHER PUBLICATIONS

Masaaki Awano, "Japanese Office Action re Application No. 2012-508593", Apr. 19, 2013, p. 11 Published in: JP.

(Continued)

*Primary Examiner* — John Brayton
(74) *Attorney, Agent, or Firm* — Neugeboren O'Dowd PC

(57) ABSTRACT

Systems, methods and apparatus for regulating ion energies in a plasma chamber are disclosed. An exemplary method includes placing a substrate in a plasma chamber, forming a plasma in the plasma chamber via a remotely generated ionizing electromagnetic field that extends into the plasma chamber from a remote projected source, controllably switching power to the substrate so as to apply a periodic voltage function to the substrate, and modulating, over multiple cycles of the periodic voltage function, the periodic voltage function responsive to a desired distribution of energies of ions at the surface of the substrate so as to effectuate the desired distribution of ion energies on a time-averaged basis.

7 Claims, 38 Drawing Sheets

(56) References Cited

U.S. PATENT DOCUMENTS

| | | | |
|---|---|---|---|
| 4,963,239 A | 10/1990 | Fujita et al. | |
| 5,057,185 A | 10/1991 | Singh et al. | |
| 5,156,703 A | 10/1992 | Oechsner | |
| 5,160,397 A * | 11/1992 | Doki et al. | 156/345.42 |
| 5,242,561 A * | 9/1993 | Sato | 204/192.33 |
| 5,247,669 A | 9/1993 | Abraham et al. | |
| 5,415,718 A | 5/1995 | Ohmi et al. | |
| 5,487,785 A | 1/1996 | Horiike et al. | |
| 5,535,906 A | 7/1996 | Drummond | |
| 5,770,972 A | 6/1998 | Collier et al. | |
| 5,859,428 A | 1/1999 | Fruchtman | |
| 5,983,828 A | 11/1999 | Savas | |
| 6,030,667 A | 2/2000 | Nakagawa et al. | |
| 6,051,114 A | 4/2000 | Yao et al. | |
| 6,110,287 A | 8/2000 | Arai et al. | |
| 6,156,667 A | 12/2000 | Jewett | |
| 6,201,208 B1 | 3/2001 | Wendt et al. | |
| 6,291,938 B1 | 9/2001 | Jewett et al. | |
| 6,313,583 B1 | 11/2001 | Arita et al. | |
| 6,326,584 B1 | 12/2001 | Jewett et al. | |
| 6,392,210 B1 | 5/2002 | Jewett et al. | |
| 6,544,895 B1 | 4/2003 | Donohoe | |
| 6,707,051 B2 | 3/2004 | Shun'ko | |
| 6,714,033 B1 | 3/2004 | Makhratchev et al. | |
| 6,724,148 B1 | 4/2004 | Gonzalez et al. | |
| 6,777,037 B2 | 8/2004 | Sumiya et al. | |
| 6,794,301 B2 | 9/2004 | Savas | |
| 6,819,096 B2 | 11/2004 | Gonzalez et al. | |
| 6,822,396 B2 | 11/2004 | Gonzalez et al. | |
| 6,863,018 B2 | 3/2005 | Koizumi et al. | |
| 6,872,289 B2 | 3/2005 | Mizuno et al. | |
| 6,885,153 B2 | 4/2005 | Quon | |
| 6,913,938 B2 | 7/2005 | Shanmugasundram et al. | |
| 6,920,312 B1 | 7/2005 | Benjamin | |
| 6,927,358 B2 | 8/2005 | Gonzalez et al. | |
| 6,946,063 B1 | 9/2005 | Gonzalez et al. | |
| 6,984,198 B2 | 1/2006 | Krishnamurthy et al. | |
| 7,005,845 B1 | 2/2006 | Gonzalez et al. | |
| 7,046,524 B2 | 5/2006 | Hoffman et al. | |
| 7,059,267 B2 | 6/2006 | Hedberg et al. | |
| 7,201,936 B2 | 4/2007 | Schwarm et al. | |
| 7,245,084 B1 | 7/2007 | Gonzalez et al. | |
| 7,253,117 B2 | 8/2007 | Donohoe | |
| 7,297,637 B2 | 11/2007 | Hedberg et al. | |
| 7,373,899 B2 | 5/2008 | Sumiya et al. | |
| 7,468,494 B2 | 12/2008 | Gonzalez et al. | |
| 7,520,956 B2 | 4/2009 | Samukawa et al. | |
| 7,528,386 B2 | 5/2009 | Ruzic et al. | |
| 7,725,208 B2 | 5/2010 | Shanmugasundram et al. | |
| 7,737,702 B2 | 6/2010 | Pipitone | |
| 7,764,140 B2 | 7/2010 | Nagarkatti et al. | |
| 7,777,179 B2 | 8/2010 | Chen et al. | |
| 7,783,375 B2 | 8/2010 | Shanmugasundram et al. | |
| 7,847,247 B2 | 12/2010 | Denpoh | |
| 8,140,292 B2 | 3/2012 | Wendt | |
| 2001/0014540 A1 | 8/2001 | Shan et al. | |
| 2002/0038631 A1 | 4/2002 | Sumiya et al. | |
| 2003/0033116 A1 | 2/2003 | Brcka et al. | |
| 2004/0094402 A1 | 5/2004 | Gopalraja et al. | |
| 2006/0088655 A1 | 4/2006 | Collins et al. | |
| 2006/0130971 A1 | 6/2006 | Chang et al. | |
| 2006/0226786 A1 | 10/2006 | Lin et al. | |
| 2007/0186856 A1 | 8/2007 | Yasui et al. | |
| 2007/0193975 A1 | 8/2007 | Wilson | |
| 2007/0246163 A1 | 10/2007 | Paterson et al. | |
| 2009/0077150 A1 | 3/2009 | Wendt | |
| 2009/0255800 A1 | 10/2009 | Koshimizu | |
| 2010/0072172 A1* | 3/2010 | Ui et al. | 216/67 |
| 2010/0154994 A1* | 6/2010 | Fischer | H01J 37/32623 156/345.24 |
| 2010/0208409 A1 | 8/2010 | Bluck et al. | |
| 2010/0276273 A1 | 11/2010 | Heckman et al. | |
| 2011/0089023 A1 | 4/2011 | Tanaka et al. | |
| 2011/0095689 A1 | 4/2011 | Gilbert | |
| 2011/0226617 A1 | 9/2011 | Hofmann et al. | |
| 2011/0259851 A1 | 10/2011 | Brouk et al. | |
| 2012/0052599 A1 | 3/2012 | Brouk et al. | |
| 2012/0187844 A1 | 7/2012 | Brouk et al. | |
| 2012/0318456 A1 | 12/2012 | Brouk et al. | |
| 2012/0319584 A1 | 12/2012 | Brouk et al. | |
| 2014/0062495 A1 | 3/2014 | Carter et al. | |

FOREIGN PATENT DOCUMENTS

| | | |
|---|---|---|
| EP | 1129481 B1 | 2/2012 |
| GB | 2382459 A | 5/2003 |
| GB | 2400613 A | 10/2004 |
| JP | 60-126832 | 7/1985 |
| JP | 0214572 A | 5/1990 |
| JP | 04-193329A A | 7/1992 |
| JP | 09293600 | 11/1997 |
| JP | 2004193564 | 7/2004 |
| JP | 200971133 | 4/2009 |
| TW | 200811905 A | 3/2008 |
| WO | 0215222 A2 | 2/2002 |
| WO | 2010013476 A1 | 2/2010 |
| WO | 2010126893 A2 | 11/2010 |
| WO | 2012030500 A1 | 3/2012 |
| WO | 2012103101 A1 | 8/2012 |
| WO | 2013016619 | 1/2013 |

OTHER PUBLICATIONS

Yamamoto, Shusaku, "Response to Japanese Office Action re Application No. 2012-508593", Aug. 16, 2013, p. 9, Published in: JP.

Duk Yeul Baek, "Korean Office Action re Applcation No. 10-2011-7009075", Mar. 25, 2013, p. 2 Published in: KR.

Brayton, John Joseph, "Office Action re U.S. Appl. No. 12/870,837", Mar. 22, 2013, p. 46 Published in: US.

Abraham, Ibrahime A., "Office Action re U.S. Appl. No. 12/767,775", Apr. 25, 2013, p. 28 Published in: US.

Brayton, John Joseph, "Office Action re U.S. Appl. No. 13/193,299", Aug. 8, 2013, p. 7 Published in: US.

O'Dowd, Sean R., "Response to Office Action re U.S. Appl. No. 12/870,837", Aug. 22, 2013, p. 9 Published in: US.

Baharlou, Simin, "International Preliminary Report on Patentability re Application No. PCT/US2011/047467", Mar. 14, 2013, p. 7 Published in: CH.

O'Dowd, Sean R. , "Response to Office Action re U.S. Appl. No. 12/767,775", Mar. 17, 2013, p. 6 Published in: US.

O'Dowd, Sean R., "Response to Office Action re U.S. Appl. No. 12/767,775", Jul. 25, 2013, p. 7 Published in: US.

Gruber, Stephen S., "Response to Office Action re U.S. Appl. No. 13/193,299", Aug. 28, 2013, p. 9 Published in: US.

Jeon, M., et al., "Hydrogenated amorphous silicon film as intrinsic passivation layer deposited at various temperatures using RF remote—PECVD technique", Current Applied Physics, Nov. 12, 2009, pp. S237-S240, vol. 10, (2010), Publisher: Elsevier B.V., Published in: US.

Bruno, G., et al., "Real time ellipsometry for monitoring plasma-assisted epitaxial growth of GaN", Applied Surface Sci., Jul. 7, 2006, pp. 219-223, vol. 253, (2006), Publisher: Elsevier B.V., Published in: US.

Giangregorio, M.M., et al., "Role of plasma activation in tailoring the nanostructure of multifunctional oxides thin films", Applied Surface Sci., Sep. 10, 2008, pp. 5396-5400, vol. 255, (2009), Publisher: Elsevier B.V., Published in: US.

Hoffman, D., et al., "Specification for related U.S. Appl. No. 13/173,752", filed Jun. 30, 2011, p. 48, to be published in: US.

Hoffman, D., et al., "Specification for related U.S. Appl. No. 13/425,159", filed Mar. 20, 2012, p. 33, to be published in: US.

Vahedi, V., et al., "Verification of frequency scaling laws for capacitive radio-frequency discharges using two-dimensional simulations", Phys. Fluids B Jul. 1993, pp. 2719-2729, vol. 5, No. 7, Publisher: Am. Inst. of Physics, Published in: US.

Rauf, S., et al., "Nonlinear Dynamics of Radio Frequency Plasma Processing Reactors Powered by Multifrequency Sources", IEEE Transactions on Plasma Science, Oct. 5, 1999, pp. 1329-1338, vol. 27, No. 5, Publisher: IEEE.

(56) References Cited

OTHER PUBLICATIONS

Raoux, S., et al., "Remote microwave plasma source for cleaning chemical vapor deposition chambers; Technology for reducing global warming gas emissions", J. Vac. Sci. Technol. B Mar./Apr. 1999, pp. 477-485, vol. 17, No. 2, Publisher: Am. Vacuum Soc'y, Published in: US.

Gangoli, S.P., et al., "Production and transport chemistry of atomic fluorine in remote plasma source and cylindrical reaction chamber", J. Phys. D: Appl. Phys., pp. 5140-5154, vol. 40, (2007), Publisher: IOP Publishing Ltd., Published in: UK.

Yun, Y.B., et al., "Effects of various additive gases on chemical dry etching rate enhancement of low-k SiOCH layer in F2/Ar remote plasmas", Thin Solid Films, Aug. 15, 2007, pp. 3549-3553, vol. 516, (2008), Publisher: Elsevier B.V., Published in: US.

Kuo, M.S., et al., "Influence of C4F8/Ar-based etching and H2-based remote plasma ashing processes on ultralow k materials modifications", J. Vac. Sci. Technol. B, Mar./Apr. 2010, Mar. 19, 2010, pp. 284-294, vol. 28, No. 2, Publisher: Am. Vacuum Soc'y, Published in: US.

Heil, S.B.S., et al., "Deposition of TiN and HfO2 in a commercial 200 mm plasma atomic layer deposition reactor", J. Vac. Sci. Technol. A Sep./Oct. 2007, Jul. 31, 2007, pp. 1357-1366, vol. 25, No. 5, Publisher: Am. Vacuum Soc'y, Published in: US.

Kim, J.Y., et al., "Remote plasma enhanced atomic layer deposition of TiN thin films using metalorganic precursor", J. Vac. Sci. Technol. A Jan./Feb. 2004, Nov. 13, 2003, pp. 8-12, vol. 22, No. 1, Publisher: Am. Vacuum Soc'y, Published in: US.

Wakeham, S.J., et al., "Low temperature remote plasma sputtering of indium tin oxide for flexible display applications", Thin Solid Films, May 12, 2009, pp. 1355-1358, vol. 519, (2009), Publisher: Elsevier B.V.

Ohachi, T., et al., "Measurement of nitrogen atomic flux for RF-MBE growth of GaN and AlN on Si substrates", J. of Crystal Growth, pp. 2987-2991, vol. 311, (2009), Publisher: Elsevier B.V.

Honda, S., et al., "Hydrogenation of polycrystalline silicon thin films", Thin Solid Films, Oct. 5, 2005, pp. 144-148, vol. 501, No. (2006), Publisher: Elsevier B.V., Published in: US.

Bryns, B., et al., "A VHF driven coaxial atmospheric air plasma: electrical and optical characterization", Dec. 16, 2011, pp. 118, No. Rev. 2-0, Publisher: N. C. ST. U., Dep't of Nuclear Engr., Published in: US.

Emsellem, G., "Electrodeless Plasma Thruster Design Characteristics", Jul. 11, 2005, p. 22 Publisher: 41st Joint Propulsion Conference, Tucson, Published in: US.

George, M.A., et al., "Silicon Nitride Arc Thin Films by New Plasma Enhanced Chemical Vapor Deposition Source Technology", Jul. 7, 2011, pp. 1-5, Publisher: Article downloaded from www.generalplasma.com, Published in: US.

Krolak, M, "Matthew Krolak's MyElectricEngine.Com Megnetoplasmadynamic (MPD) Thruster Design", Apr. 28, 2011, p. 7 Publisher: Webpage downloaded from http://myelectricengine.com/projects/mpdthruster/mpdthruster.html, Published in: US.

Rabbani, Firoozeh, International Search Report and Written Opinion re application No. PCT/US2012/022380, Mar. 14, 2012, Published in: AU.

Devlin, Martin, International Search Report and Written Opinion re application No. PCT/US2012/029953, May 28, 2012, p. 11 Published in: AU.

Buzzi, F.L., et al., "Energy Distribution of Bombarding Ions in Plasma Etching of Dielectrics", AVS 54th International Symposium, Oct. 15, 2007, Publisher: Univ. of Wisconsin—Madison, Published in: US.

Kudelka, Stephan, Supplementary European Search Report re EP Application 10 77 0205.2, PCT/US10/032582, Jan. 30, 2013, p. 8 Published in: NL.

McLeod, Austin, Office Action re U.S. Appl. No. 12/767,775, Oct. 17, 2012, Published in: US.

Brayton, John J., Office Action re U.S. Appl. No. 12/870,837, Dec. 19, 2012, Published in: US.

Atkinson, Gerard, International Search Report and Written Opinion re Application No. PCT/US10/032582, Feb. 21, 2011, Published in: AU.

Mitrovic, Bayer, International Search Report and Written Opinion re Application No. PCT/US11/047467, Feb. 12, 2011, Published in: AU.

Guinea, William, International Search Report and Written Opinion re Application No. PCT/US12/048504, Sep. 17, 2012, Published in: AU.

Lindner, Nora, International Preliminary Report on Patentability re Application PCT/US2010/032582, Nov. 1, 2011, p. 8 Published in: CH.

Gruber, Stephen S., Response to Office Action dated Dec. 19, 2012 re U.S. Appl. No. 12/870,837, filed Jan. 9, 2013, p. 8 Published in: US.

Silapunt, et al., "Ion bombardment energy control for selective fluorocarbon plasma etching", Mar. 22, 2004, Published in: US.

Wang, S.B., et al., "Control of ion energy distribution at substrates during plasma processing", J. Applied Physics, Jul. 15, 2000, pp. 643-646, vol. 88, No. 2, Publisher: Am. Inst. of Physics, Published in: US.

Yafeng, "Chinese Office Action re Application No. 201080003206.X", Sep. 4, 2013, p. 15 Published in: CN.

Brayton, John Joseph, "Office Action re U.S. Appl. No. 13/193,299", Dec. 18, 2013, p. 43 Published in: US.

Brayton, John Joseph, "Office Action re U.S. Appl. No. 12/870,837", Dec. 20, 2013, p. 33 Published in: US.

Baharlou, Simin, "International Preliminary Report on Patentability re Application No. PCT/US2012/048504", Feb. 6, 2014, p. 11 Published in: CH.

Ramachandran, Mani, "International Search Report and Written Opinion re Application No. PCT/US2013/056634", Nov. 15, 2013, p. 10 Published in: AU.

Williams, Jim, "International Search Report and Written Opinion re Application No. PCT/US2013/056647", Oct. 30, 2013, p. 10 Published in: AU.

Mitrovic, Bayer, "International Search Report and Written Opinion re Application No. PCT/US2013/056657", Oct. 28, 2013, p. 11 Published in: AU.

Panta, Kusha, "Internaitonal Search Report and Written Opinion re Application No. PCT/US2013/056659", Nov. 8, 2013, p. 11 Published in: AU.

Williams, Jim, "International Search Report and Written Opinion re Application No. PCT/US2013/056851", Nov. 18, 2013, p. 11 Published in: AU.

TIPO, "Taiwain Office Action re Application No. 099113815", Jan. 27, 2014, p. 6 Published in: TW.

Xiubo, et al., "Charging of dielectric substrate materials during plasma immersion ion implantation", Nov. 9, 2001, p. 7 Published in: HK.

Masaaki, Awano, "Japanese Office Action re Application No. 2012-508593", Sep. 11, 2013, p. 7 Published in: JP.

Abraham, Ibrahime A., "Office Action re U.S. Appl. No. 12/767,775", Sep. 10, 2013, p. 30 Published in: US.

O'Dowd, Sean R., "Reponse to Office Action re U.S. Appl. No. 12/767,775", Nov. 5, 2013, p. 6 Published in: US.

Brayton, John Joseph, "Office Action re U.S. Appl. No. 13/193,299", Sep. 26, 2014, p. 37 Published in: US.

O'Dowd, Sean R., "Response to Office Action re U.S. Appl. No. 12/767,775", Nov. 3, 2014, p. 13 Published in: US.

TIPO, "Taiwan Office Action re Application No. 101127182", Aug. 11, 2014, p. 11 Published in: TW.

Yafeng, Zhang, "Chinese Office Action re Application No. 201080003206.X", Nov. 26, 2014, p. 6 Published in: CN.

Shamim, Ahmed, "Office Action re U.S. Appl. No. 14/011,305", Dec. 4, 2014, p. 28 Published in: US.

Abraham, Ibrahime A., "Office Action re U.S. Appl. No. 12/767,775", Dec. 15, 2014, p. 37 Published in: US.

O'Dowd, Sean, "Office Action Response re U.S. Appl. No. 13/597,032", Dec. 16, 2014, p. 11 Published in: US.

SIPO, "Chinese Office Action re Application No. 201080003206.X", May 23, 2014, p. 6 Published in: CN.

Sathiraju, Srinivas, "Office Action re U.S. Appl. No. 13/597,032", Jun. 20, 2014, p. 42 Published in: US.

(56) References Cited

OTHER PUBLICATIONS

O'Dowd, Sean R., "Response to Office Action re U.S. Appl. No. 12/870,837", Mar. 20, 2014, p. 8 Published in: US.
Gruber, Stephen S., "Response to Office Action re U.S. Appl. No. 13/193,299", May 19, 2014, p. 18 Published in: US.
TIPO, "Taiwan Office Action re Application No. 099113815", Jun. 18, 2014, p. 2 Published in: TW.
The Korean Intellectual Property Office, "Korean Office Action re Application No. 10-2013-7007594", Jul. 28, 2014, p. 2 Published in: KR.
Abraham, Ibrahime A., "Office Action re U.S. Appl. No. 12/767,775", Jul. 1, 2014, p. 48 Published in: US.
SIPO, "Chinese Office Action re Application No. 201180046783.1", Mar. 24, 2015, p. 18 Published in: CN.
Moku, Tetsuji, "Japanese Office Action re Application No. 2013-527088", Apr. 21, 2015, p. 10 Published in: JP.
Moku, Tetsuji, "Japanese Office Action re Application No. 2014-523-057", Apr. 21, 2015, p. 11 Published in: JP.
Brayton, John Joseph, "Restriction Requirement re U.S. Appl. No. 13/597,050", Jan. 27, 2015, p. 7 Published in: US.
Brayton, John Joseph, "Restriction Requirement re U.S. Appl. No. 13/596,976", Feb. 23, 2015, p. 8 Published in: US.
Brayton, John Joseph, "Restriction Requirement re U.S. Appl. No. 13/597,093", Mar. 23, 2015, p. 9 Published in: US.
Brayton, John Joseph, "Office Action re U.S. Appl. No. 14/606,857", Apr. 8, 2015, p. 51 Published in: US.
Brayton, John Joseph, "Office Action re U.S. Appl. No. 12/870,837", Apr. 9, 2015, p. 40 Published in: US.
Sathiraju, Srinivas, "Office Action re U.S. Appl. No. 13/597,032", Apr. 9, 2015, p. 32 Published in: US.
Wittmann-Regis, Agnes, "International Preliminary Report on Patentability re Application No. PCT/US2013/056634", Mar. 12, 2015, p. 7 Published in: CH.
Nickitas-Etienne, Athina, "International Preliminary Report on Patentability re Application No. PCT/US2013/056647", Mar. 12, 2015, p. 7 Published in: CH.
Mohri, Mineko, "International Preliminary Report on Patentability re Application No. PCT/US2013/056657", Mar. 12, 2015, p. 8 Published in: CH.
Mohri, Mineko, "International Preliminary Report on Patentability re Application No. PCT/US2013/056659", Mar. 12, 2015, p. 8 Published in: CH.
Nakamura, Yukari, "International Preliminary Report on Patentability re Application No. PCT/US2013/056851", Mar. 12, 2015, p. 8 Published in: CH.
O'Dowd, Sean R., "Office Action Response re U.S. Appl. No. 12/767,775", Feb. 27, 2015, p. 6 Published in: US.
Gruber, Stephen S., "Response to Restriction Requirement re U.S. Appl. No. 13/597,050", Mar. 26, 2015, p. 11 Published in: US.
O'Dowd, Sean R., "Response to Office Action re U.S. Appl. No. 13/193,299", Mar. 26, 2015, p. 7 Published in: US.
Gruber, Stephen S. "Response to Office Action re U.S. Appl. No. 14/011,305", Mar. 4, 2015, p. 10 Published in: US.
SIPO, "Chinese Office Action re Application No. 201280047162.X", Sep. 6, 2015, p. 18 Published in: CN.
Aguilar, Maria, "European Search Report re Application No. EP11822326", Oct. 9, 2015, p. 3 Published in: EP.
Brayton, John Joseph, "US Office Action re U.S. Appl. No. 13/597,093", Nov. 5, 2015, p. 76 Published in: US.
Brayton, John Joseph, "US Office Action re U.S. Appl. No. 13/596,976", Nov. 6, 2015, p. 77 Published in: US.
O'Dowd, Sean R., "Response to Office Action re U.S. Appl. No. 14/606,857", Jul. 8, 2015, p. 10 Published in: US.
Percival, Shane, "Response to Office Action re U.S. Appl. No. 13/597,032", Aug. 7, 2015, p. 17 Published in: US.
O'Dowd, Sean, "Response to Office Action re U.S. Appl. No. 13/193,299", Aug. 20, 2015, p. 10 Published in: US.
O'Dowd, Sean R., "Response to Office Action re U.S. Appl. No. 12/870,837", Oct. 6, 2015, p. 7 Published in: US.
O'Dowd, Sean, "Response to Office Action re U.S. Appl. No. 12/767,775", Oct. 19, 2015, p. 9 Published in: US.
Yafeng, Zhang, "Chinese Office Action re Application No. 201080003206.X", Jun. 10, 2015, p. 8 Published in: CN.
Brayton, John Joseph, "Office Action re U.S. Appl. No. 13/193,299", May 21, 2015, p. 24 Published in: US.
Abraham, Ibrahime A., "Office Action re U.S. Appl. No. 12/767,775", Jun. 17, 2015, p. 28 Published in: US.
Brayton, John Joseph, "Office Action re U.S. Appl. No. 13/597,050", Jul. 17, 2015, p. 86 Published in: US.
O'Dowd, Sean R., "Response to Office Action re U.S. Appl. No. 13/596,976", Jul. 23, 2015, p. 10 Published in: US.
O'Dowd, Sean R., "Response to Office Action re U.S. Appl. No. 13/597,093", Jul. 23, 2015, p. 9 Published in: US.
SIPO, "Office Action re Chinese Application No. 2011800467811", "Office Action re Chinese Application No. 201180046783.1", Dec. 8, 2015, Published in: CN.

\* cited by examiner

SYSTEM, METHOD AND APPARATUS FOR CONTROLLING ION ENERGY DISTRIBUTION OF A PROJECTED PLASMA

PRIORITY AND CROSS REFERENCE TO RELATED APPLICATIONS

This application is a continuation-in-part of U.S. patent application Ser. No. 12/870,837 filed on Aug. 29, 2010 entitled SYSTEM, METHOD AND APPARATUS FOR CONTROLLING ION ENERGY DISTRIBUTION, which is a continuation-in-part of U.S. Patent Publication 2010/276,273 filed Apr. 26, 2010 entitled METHOD AND APPARATUS FOR CONTROLLING ION ENERGY DISTRIBUTION. Both of these applications are incorporated herein by reference.

FIELD OF THE DISCLOSURE

The present disclosure relates generally to plasma processing. In particular, but not by way of limitation, the present disclosure relates to methods and apparatuses for plasma-assisted etching and/or deposition.

BACKGROUND OF THE DISCLOSURE

Many types of semiconductor devices are fabricated using plasma-based etching techniques. If it is a conductor that is etched, a negative voltage with respect to ground may be applied to the conductive substrate so as to create a substantially uniform negative voltage across the surface of the substrate conductor, which attracts positively charged ions toward the conductor, and as a consequence, the positive ions that impact the conductor have substantially the same energy.

If the substrate is a dielectric, however, a non-varying voltage is ineffective to place a voltage across the surface of the substrate. But an AC voltage (e.g., high frequency) may be applied to the conductive plate (or chuck) so that the AC field induces a voltage on the surface of the substrate. During the positive half of the AC cycle, the substrate attracts electrons, which are light relative to the mass of the positive ions; thus many electrons will be attracted to the surface of the substrate during the positive part of the cycle. As a consequence, the surface of the substrate will be charged negatively, which causes ions to be attracted toward the negatively-charged surface. And when the ions impact the surface of the substrate, the impact dislodges material from the surface of the substrate-effectuating the etching.

In many instances, it is desirable to have a narrow ion energy distribution. For instance, when etching ion energy affects selectivity or the isotropic character of the etching, while plasma or ion density affects the etch rate. Ideally, low isotropic etching with a high etch rate are desired, yet typical plasma sources cannot control the isotropic character and etch rate independently. Rather, when power is increased, the etch rate increases, since there is greater plasma density, but the ions also have greater energy meaning that the etching is less selective.

Further, and regarding selectivity and the consistency of etching, as defined by the spread of ion energies, applying a sinusoidal waveform to the substrate induces a broad distribution of ion energies, which limits the ability of the plasma process to carry out a desired etch profile. Known techniques to achieve a narrow ion energy distribution are expensive, inefficient, difficult to control, and may adversely affect the plasma density. As a consequence, these known techniques have not been commercially adopted. Accordingly, a system and method are needed to address the shortfalls of present technology and to provide other new and innovative features.

SUMMARY

Illustrative embodiments of the present disclosure that are shown in the drawings are summarized below. These and other embodiments are more fully described in the Detailed Description section. It is to be understood, however, that there is no intention to limit the disclosure to the forms described in this Summary or in the Detailed Description. One skilled in the art can recognize that there are numerous modifications, equivalents, and alternative constructions that fall within the spirit and scope of the disclosure as expressed in the claims.

According to one embodiment, the disclosure may be characterized as a system for plasma-based processing. The system in this embodiment includes a field generation portion that generates an ionizing electromagnetic field, wherein the ionizing electromagnetic field extends out of the field generation portion. The system also includes a plasma processing chamber configured to receive the ionizing electromagnetic field and configured to contain the plasma. The plasma is sustained by the ionizing electromagnetic field, and wherein the ionizing electromagnetic field is attenuated en route to the plasma processing chamber. The system further includes a substrate support positioned within the plasma processing chamber and disposed to support a substrate. Additionally, the system includes an ion-energy control portion, the ion-energy control portion provides at least one ion-energy control signal responsive to at least one ion-energy distribution setting that is indicative of a desired ion energy distribution at the surface of the substrate. The system also includes a switch-mode power supply coupled to the substrate support and the ion-energy control portion. The switch-mode power supply includes one or more switching components configured to apply power to the substrate responsive to the ion-energy control signal so as to effectuate the desired ion energy distribution at the surface of the substrate.

According to another embodiment, the disclosure may be described as a method for plasma-based processing that includes forming a plasma in a plasma chamber via an ionizing electromagnetic field, where the ionizing electromagnetic field is remotely generated and then controllably attenuated en route to the plasma chamber. The method further includes switching power to a substrate in the plasma chamber so as to apply a periodic voltage function to the substrate. The method also includes modulating the periodic voltage function, over multiple cycles of the periodic voltage function, responsive to a desired ion energy distribution at the surface of the substrate so as to effectuate the desired ion energy distribution on a time-averaged basis.

According to yet another embodiment, the disclosure may be characterized as a method including placing a substrate in a plasma chamber. The method can further include forming a plasma in the chamber via an ionizing electromagnetic field received from a remote projected source. The method also includes receiving at least one ion-energy distribution setting, where the setting is indicative of one or more ion energies at a surface of the substrate. The method further includes controllably switching power to the substrate so as to effectuate a desired distribution of ion energies on a time-averaged basis.

According to another embodiment, the disclosure may be characterized as a system including a plasma processing chamber, a remote projected plasma source, and a switch mode power supply. The plasma processing chamber encloses a plasma and has a substrate support supporting a substrate. The remote projected plasma source generates an ionizing electromagnetic field that controls a plasma density inside the plasma processing chamber independent of an ion energy distribution of ions at a surface of the substrate. The switch mode power supply applies power to the substrate to effectuate a desired ion energy distribution at the surface of the substrate independent of the plasma density.

These and other embodiments are described in further detail herein.

BRIEF DESCRIPTION OF THE DRAWINGS

Various objects and advantages and a more complete understanding of the present disclosure are apparent and more readily appreciated by reference to the following Detailed Description and to the appended claims when taken in conjunction with the accompanying Drawings where like or similar elements are designated with identical reference numerals throughout the several views and wherein:

DETAILED DESCRIPTION

Figure 1A:
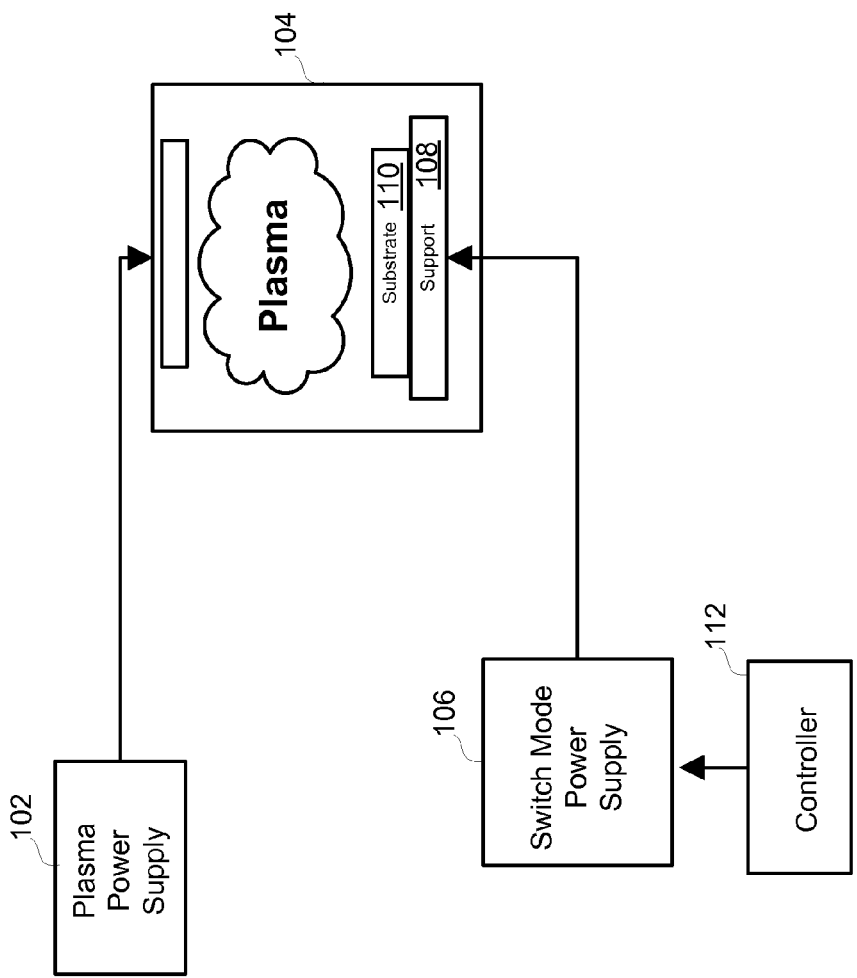
FIG. 1A illustrates a block diagram of a plasma processing system in accordance with one implementation of the present invention.

An exemplary embodiment of a plasma processing system is shown generally in FIG. 1A. As depicted, a plasma power supply 102 is coupled to a plasma processing chamber 104 and a switch-mode power supply 106 is coupled to a support 108 upon which a substrate 110 rests within the chamber 104. Also shown is a controller 112 that is coupled to the switch-mode power supply 106.

In this exemplary embodiment, the plasma processing chamber 104 may be realized by chambers of substantially conventional construction (e.g., including a vacuum enclosure which is evacuated by a pump or pumps (not shown)). And, as one of ordinary skill in the art will appreciate, the plasma excitation in the chamber 104 may be by any one of a variety of sources including, for example, a helicon type plasma source, which includes magnetic coil and antenna to ignite and sustain a plasma 114 in the reactor, and a gas inlet may be provided for introduction of a gas into the chamber 104.

As depicted, the exemplary plasma chamber 104 is arranged and configured to carry out plasma-assisted etching of materials utilizing energetic ion bombardment of the substrate 110. The plasma power supply 102 in this embodiment is configured to apply power (e.g., RF power) via a matching network (not shown)) at one or more frequencies (e.g., 13.56 MHz) to the chamber 104 so as to ignite and sustain the plasma 114. It should be understood that the present invention is not limited to any particular type of plasma power supply 102 or source to couple power to the chamber 104, and that a variety of frequencies and power levels may be may be capacitively or inductively coupled to the plasma 114.

As depicted, a dielectric substrate 110 to be treated (e.g., a semiconductor wafer), is supported at least in part by a support 108 that may include a portion of a conventional wafer chuck (e.g., for semiconductor wafer processing). The support 108 may be formed to have an insulating layer between the support 108 and the substrate 110 with the substrate 110 being capacitively coupled to the platform but may float at a different voltage than the support 108.

As discussed above, if the substrate 110 and support 108 are conductors, it is possible to apply a non-varying voltage to the support 108, and as a consequence of electric conduction through the substrate 110, the voltage that is applied to the support 108 is also applied to the surface of the substrate 110.

When the substrate 110 is a dielectric, however, the application of a non-varying voltage to the support 108 is ineffective to place a voltage across the treated surface of the substrate 110. As a consequence, the exemplary switch-mode power supply 106 is configured to be controlled so as to effectuate a voltage on the surface of the substrate 110 that is capable of attracting ions in the plasma 114 to collide with the substrate 110 so as to carry out a controlled etching and/or deposition of the substrate 110.

Moreover, as discussed further herein, embodiments of the switch-mode power supply 106 are configured to operate so that there is an insubstantial interaction between the power applied (to the plasma 114) by the plasma power supply 102 and the power that is applied to the substrate 110 by the switch-mode power supply 106. The power applied by the switch-mode power supply 106, for example, is controllable so as to enable control of ion energy without substantially affecting the density of the plasma 114.

Furthermore, many embodiments of the exemplary switch-mode supply 106 depicted in FIG. 1A are realized by relatively inexpensive components that may be controlled by relatively simple control algorithms. And as compared to prior art approaches, many embodiments of the switch mode power supply 106 are much more efficient; thus reducing energy costs and expensive materials that are associated with removing excess thermal energy.

One known technique for applying a voltage to a dielectric substrate utilizes a high-power linear amplifier in connection with complicated control schemes to apply power to a substrate support, which induces a voltage at the surface of the substrate. This technique, however, has not been adopted by commercial entities because it has not proven to be cost effective nor sufficiently manageable. In particular, the linear amplifier that is utilized is typically large, very expensive, inefficient, and difficult to control. Furthermore, linear amplifiers intrinsically require AC coupling (e.g., a blocking capacitor) and auxiliary functions like chucking are achieved with a parallel feed circuit which harms AC spectrum purity of the system for sources with a chuck.

Another technique that has been considered is to apply high frequency power (e.g., with one or more linear amplifiers) to the substrate. This technique, however, has been found to adversely affect the plasma density because the high frequency power that is applied to the substrate affects the plasma density.

In some embodiments, the switch-mode power supply 106 depicted in FIG. 1A may be realized by buck, boost, and/or buck-boost type power technologies. In these embodiments, the switch-mode power supply 106 may be controlled to apply varying levels of pulsed power to induce a potential on the surface of the substrate 110.

Figure 1B:
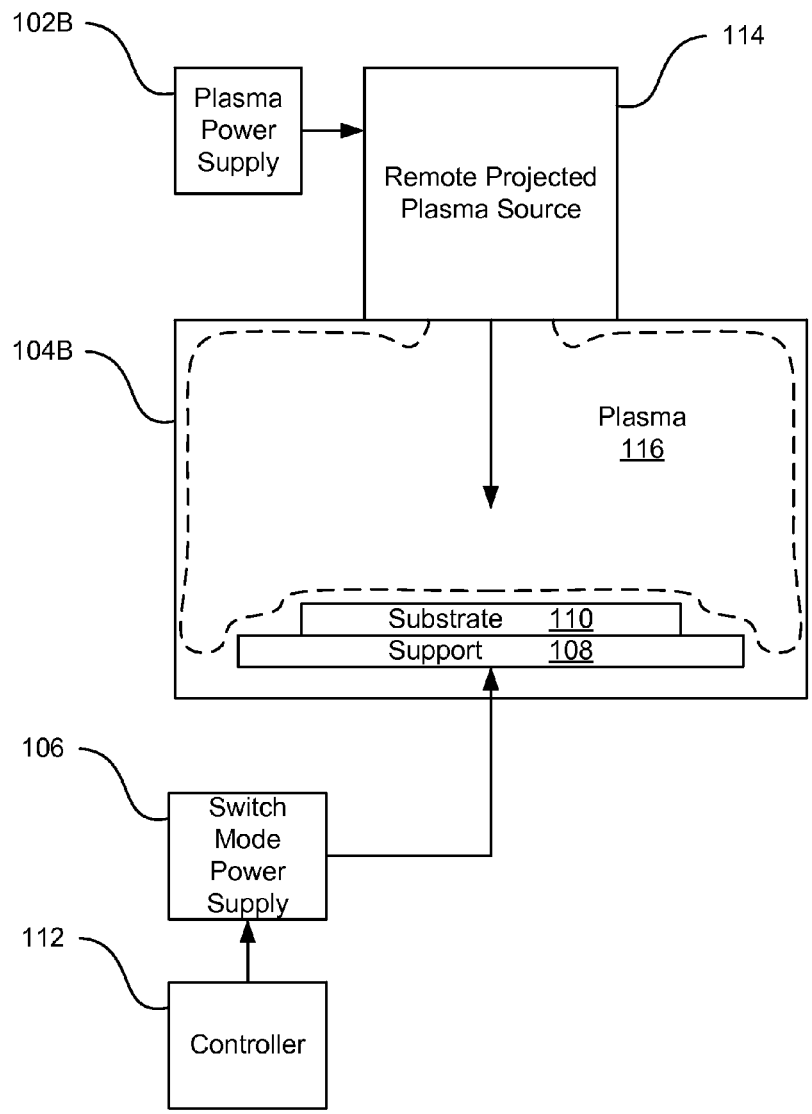
FIG. 1B illustrates a block diagram of an alternative embodiment of a plasma processing system in accordance with one implementation of the present invention.

FIG. 1B illustrates a block diagram of an embodiment of a plasma processing system. In the illustrated embodiment, the plasma 116 is sustained in the chamber 104 via an ionizing electromagnetic field generated in a remote projected plasma source 114 and projected into a plasma processing chamber 104B coupled to the remote projected plasma source 114. The plasma processing chamber 104B is configured to receive the ionizing electromagnetic field from the remote projected plasma source 114. A plasma power supply 102B can be coupled to the remote projected plasma source 114, and the projected plasma source 114 can be coupled to the plasma processing chamber 104B. The plasma processing chamber 104B includes a substrate 110 resting upon a support 108, where a switch-mode power supply 106 is coupled to the support 108 and coupled to a controller 112.

As depicted, the exemplary plasma processing chamber 104B is arranged and configured to carry out plasma-assisted etching of materials utilizing energetic ion bombardment of the substrate 110. The plasma power supply 102B in this embodiment is configured to apply power (e.g., RF power) via a matching network (not shown)) at one or more frequencies (e.g., 13.56 MHz) to the remote projected plasma source 114 so as to ignite and sustain the plasma 116 within the remote projected plasma source 114, and sustain the plasma 116 within the processing chamber 104B via projecting the ionizing electromagnetic field into the chamber 104B. The remote projected plasma source 114 can include a field projection portion wherein the ionizing electromagnetic field is attenuated such that the field strength when the ionizing electromagnetic field enters the plasma processing chamber 104B is strong enough to sustain the plasma 116, yet 10, 100, 1000 or more times smaller than it was before attenuation. It should be understood that the present disclosure is not limited to any particular type of plasma power supply 102B or means of coupling power to the remote projected plasma source 114, and that a variety of frequencies and power levels may be may be capacitively or inductively coupled to the plasma 116.

Moreover, as discussed further herein, embodiments of the switch-mode power supply 106 are configured to operate so that there is an insubstantial interaction between the power applied (to the plasma 116) by the plasma power supply 102B and the power that is applied to the substrate 110 by the switch-mode power supply 106. The power applied by the switch-mode power supply 106, for example, is controllable so as to enable control of ion energy without substantially affecting the density of the plasma 116. The power applied by the plasma power supply 102B, for example, is controllable so as to enable control of plasma density without substantially affecting the ion energy of the plasma 116. This embodiment allows control over plasma density via the remote projected plasma source 114 and the plasma power supply 102B independent of the ion energy distribution as controlled by the switch mode power supply 106 and the controller 112.

Figure 2A:
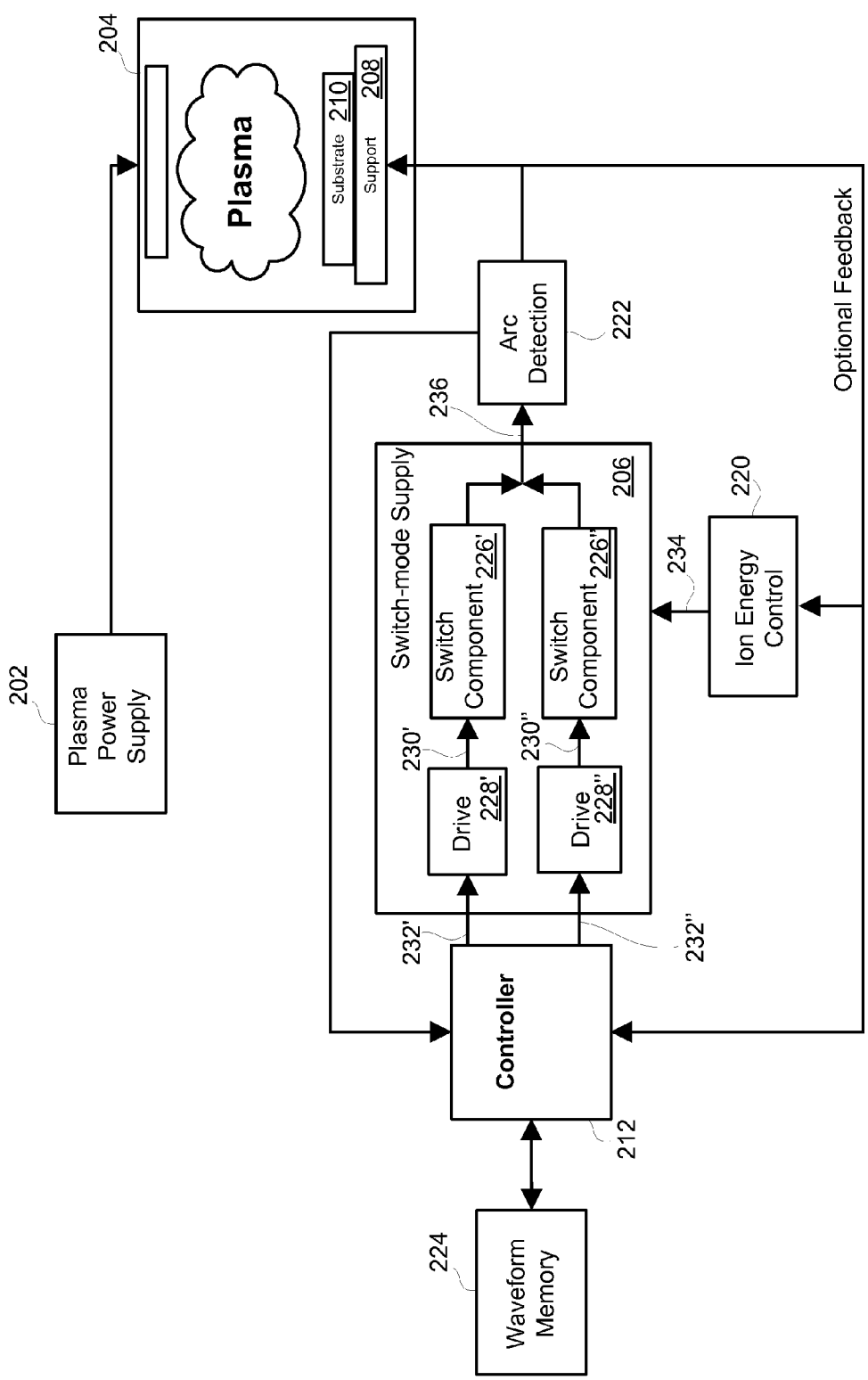
FIG. 2A is a block diagram depicting an exemplary embodiment of the switch-mode power system depicted in FIG. 1A.

In other embodiments, the switch-mode power supply 106 is realized by other more sophisticated switch mode power and control technologies. Referring next to FIG. 2A, for example, the switch-mode power supply described with reference to FIGS. 1A and 1B is realized by a switch-mode bias supply 206 that is utilized to apply power to the substrate 210 to effectuate one or more desired energies of the ions that bombard the substrate 210. Also shown are an ion energy control component 220, an arc detection component 222, and a controller 212 that is coupled to both the switch-mode bias supply 206 and a waveform memory 224.

The illustrated arrangement of these components is logical; thus the components can be combined or further separated in an actual implementation, and the components can be connected in a variety of ways without changing the basic operation of the system. In some embodiments for example, the controller 212, which may be realized by hardware, software, firmware, or a combination thereof, may be utilized to control both the power supply 202 and switch-mode bias supply 206. In alternative embodiments, however, the power supply 202 and the switch-mode bias supply 206 are realized by completely separated functional units. By way of further example, the controller 212, waveform memory 224, ion energy control portion 220 and the switch-mode bias supply 206 may be integrated into a single component (e.g., residing in a common housing) or may be distributed among discrete components.

The switch-mode bias supply 206 in this embodiment is generally configured to apply a voltage to the support 208 in a controllable manner so as to effectuate a desired distribution of the energies of ions bombarding the surface of the substrate. More specifically, the switch-mode bias supply 206 is configured to effectuate the desired distribution of ion energies by applying one or more particular waveforms at particular power levels to the substrate. And more particularly, responsive to an input from the ion energy control portion 220, the switch-mode bias supply 206 applies particular power levels to effectuate particular ion energies, and applies the particular power levels using one or more voltage waveforms defined by waveform data in the waveform memory 224. As a consequence, one or more particular ion bombardment energies may be selected with the ion control portion to carry out controlled etching of the substrate.

As depicted, the switch-mode power supply 206 includes switch components 226', 226" (e.g., high power field effect transistors) that are adapted to switch power to the support 208 of the substrate 210 responsive to drive signals from corresponding drive components 228', 228". And the drive signals 230', 230" that are generated by the drive components 228', 228" are controlled by the controller 212 based upon timing that is defined by the content of the waveform memory 224. For example, the controller 212 in many embodiments is adapted to interpret the content of the waveform memory and generate drive-control signals 232', 232", which are utilized by the drive components 228', 228" to control the drive signals 230', 230" to the switching components 226', 226".

Although two switch components 226', 226", which may be arranged in a half-bridge configuration, are depicted for exemplary purposes, it is certainly contemplated that fewer or additional switch components may be implemented in a variety of architectures (e.g., an H-bridge configuration).

In many modes of operation, the controller 212 (e.g., using the waveform data) modulates the timing of the drive-control signals 232', 232" to effectuate a desired waveform at the support 208 of the substrate 210. In addition, the switch mode bias supply 206 is adapted to supply power to the substrate 210 based upon an ion-energy control signal 234, which may be a DC signal or a time-varying waveform. Thus, the present embodiment enables control of ion distribution energies by controlling timing signals to the switching components and controlling the power (controlled by the ion-energy control component 220) that is applied by the switching components 226', 226".

In addition, the controller 212 in this embodiment is configured, responsive to an arc in the plasma chamber 204 being detected by the arc detection component 222, to carry out arc management functions. In some embodiments, when an arc is detected the controller 212 alters the drive-control signals 232', 232" so that the waveform applied at the output 236 of the switch mode bias supply 206 extinguishes arcs in the plasma 216. In other embodiments, the controller 212 extinguishes arcs by simply interrupting the application of drive-control signals 232', 232" so that the application of power at the output 236 of the switch-mode bias supply 206 is interrupted.

Figure 2B:
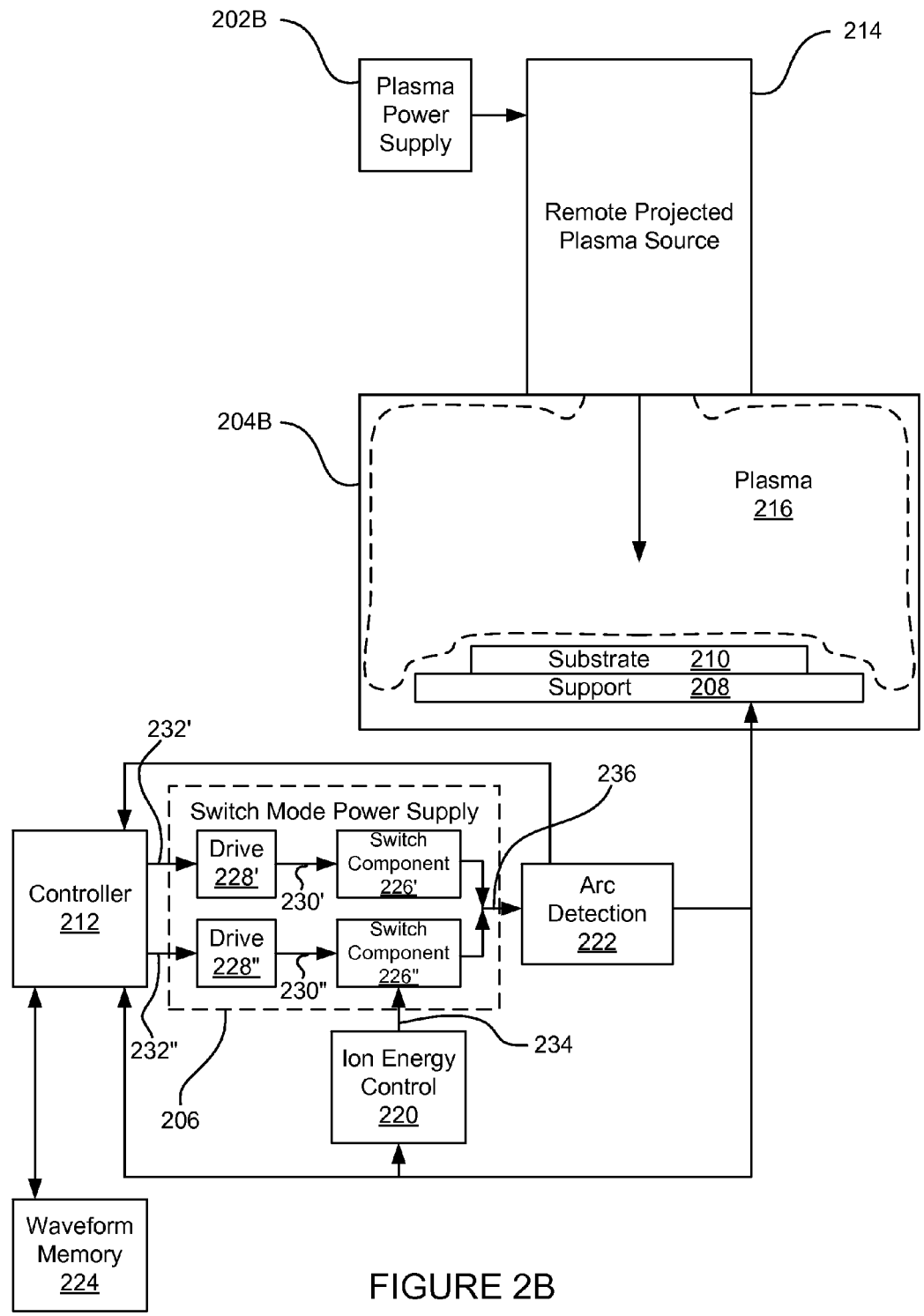
FIG. 2B is a block diagram depicting an alternative embodiment of the switch-mode power system depicted in FIG. 1B.

FIG. 2B illustrates another embodiment of a plasma processing system. In the illustrated embodiment, the plasma 216 is sustained in the plasma processing chamber 204B via an ionizing electromagnetic field generated in a remote projected plasma source 214 and projected into, and received by, the plasma processing chamber 204B. A plasma power supply 202B can be coupled to the remote projected plasma source 214, and the remote projected plasma source 214 can be coupled to the plasma processing chamber 204B. The plasma processing chamber 204B includes a substrate 210 resting upon a support 208, where the support 208 is biased by a switch mode power supply 206. This embodiment allows control over plasma density via the remote projected plasma source 214 and the plasma power supply 202B independent of the switch mode power supply 206 bias, and also allows control over the ion energy and ion energy distribution via the switch mode power supply 206 bias independent of the remote projected plasma source 214.

Figure 3:
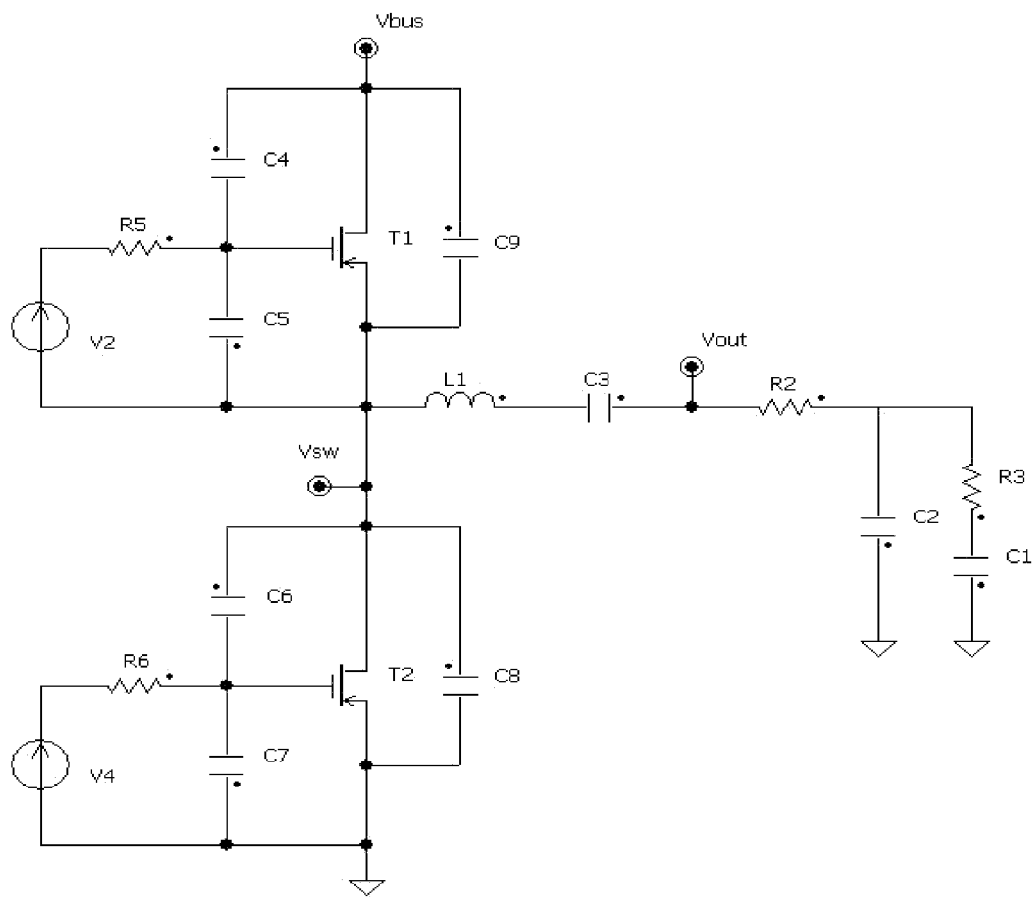
FIG. 3 is a schematic representation of components that may be utilized to realize the switch-mode bias supply described with reference to FIGS. 2A and 2B.

Referring next to FIG. 3, it is a schematic representation of components that may be utilized to realize the switch-mode bias supply 206 described with reference to FIGS. 2A and 2B. As shown, the switching components T1 and T2 in this embodiment are arranged in a half-bridge (also referred to as or totem pole) type topology. Collectively, R2, R3, C1, and C2 represent a plasma load, and C3 is an optional physical capacitor to prevent DC current from the voltage induced on the surface of the substrate or from the voltage of an electrostatic chuck (not shown) from flowing through the circuit. As depicted, L1 is stray inductance (e.g., the natural inductance of the conductor that feeds the power to the load). And in this embodiment, there are three inputs: Vbus, V2, and V4.

V2 and V4 represent drive signals (e.g., the drive signals 230', 230"output by the drive components 228', 228" described with reference to FIGS. 2A and 2B), and in this embodiment, V2 and V4 can be timed (e.g., the length of the pulses and/or the mutual delay) so that the closure of T1 and T2 may be modulated to control the shape of the voltage output at Vout, which is applied to the substrate support. In many implementations, the transistors used to realize the switching components T1 and T2 are not ideal switches, so to arrive at a desired waveform, the transistor-specific characteristics are taken into consideration. In many modes of operation, simply changing the timing of V2 and V4 enables a desired waveform to be applied at Vout.

For example, the switches T1, T2 may be operated so that the voltage at the surface of the substrate 110, 210 is generally negative with periodic voltage pulses approaching and/or slightly exceeding a positive voltage reference. The value of the voltage at the surface of the substrate 110, 210 is what defines the energy of the ions, which may be characterized in terms of an ion energy distribution function (IEDF). To effectuate desired voltage(s) at the surface of the substrate 110, 210, the pulses at Vout may be generally rectangular and have a width that is long enough to induce a brief positive voltage at the surface of the substrate 110, 210 so as to attract enough electrons to the surface of the substrate 110, 210 in order to achieve the desired voltage(s) and corresponding ion energies.

Vbus in this embodiment defines the amplitude of the pulses applied to Vout, which defines the voltage at the surface of the substrate, and as a consequence, the ion energy. Referring briefly again to FIGS. 2A and 2B, Vbus may be coupled to the ion energy control portion, which may be realized by a DC power supply that is adapted to apply a DC signal or a time-varying waveform to Vbus.

Figure 4:
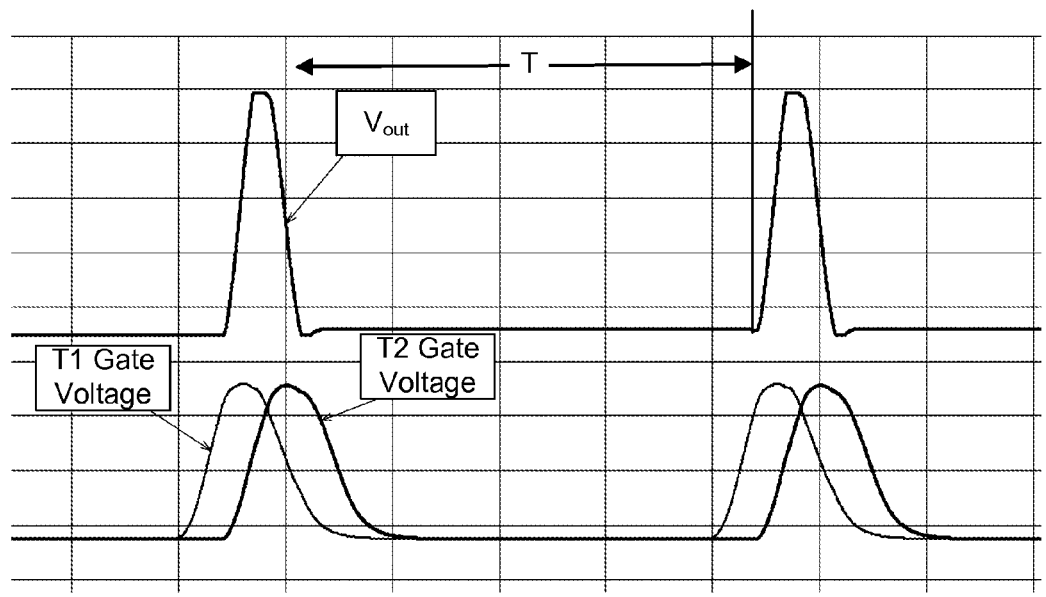
FIG. 4 is a timing diagram depicting two drive signal waveforms.

The pulse width, pulse shape, and/or mutual delay of the two signals V2, V4 may be modulated to arrive at a desired waveform at Vout, and the voltage applied to Vbus may affect the characteristics of the pulses. In other words, the voltage Vbus may affect the pulse width, pulse shape and/or the relative phase of the signals V2, V4. Referring briefly to FIG. 4, for example, shown is a timing diagram depicting two drive signal waveforms that may be applied to T1 and T2 (as V2 and V4) so as to generate the periodic voltage function at Vout as depicted in FIG. 4. To modulate the shape of the pulses at Vout (e.g. to achieve the smallest time for the pulse at Vout, yet reach a peak value of the pulses) the timing of the two gate drive signals V2, V4 may be controlled.

For example, the two gate drive signals V2, V4 may be applied to the switching components T1, T2 so the time that each of the pulses is applied at Vout may be short compared to the time T between pulses, but long enough to induce a positive voltage at the surface of the substrate 110, 210 to attract electrons to the surface of the substrate 110, 210. Moreover, it has been found that by changing the gate voltage level between the pulses, it is possible to control the slope of the voltage that is applied to Vout between the pulses (e.g., to achieve a substantially constant voltage at the surface of the substrate between pulses). In some modes of operation, the repetition rate of the gate pulses is about 400 kHz, but this rate may certainly vary from application to application.

Although not required, in practice, based upon modeling and refining upon actual implementation, waveforms that may be used to generate the desired ion energy distributions may be defined, and the waveforms can be stored (e.g., in the waveform memory portion described with reference to FIG. 1A as a sequence of voltage levels). In addition, in many implementations, the waveforms can be generated directly (e.g., without feedback from Vout); thus avoiding the undesirable aspects of a feedback control system (e.g., settling time).

Figure 5:
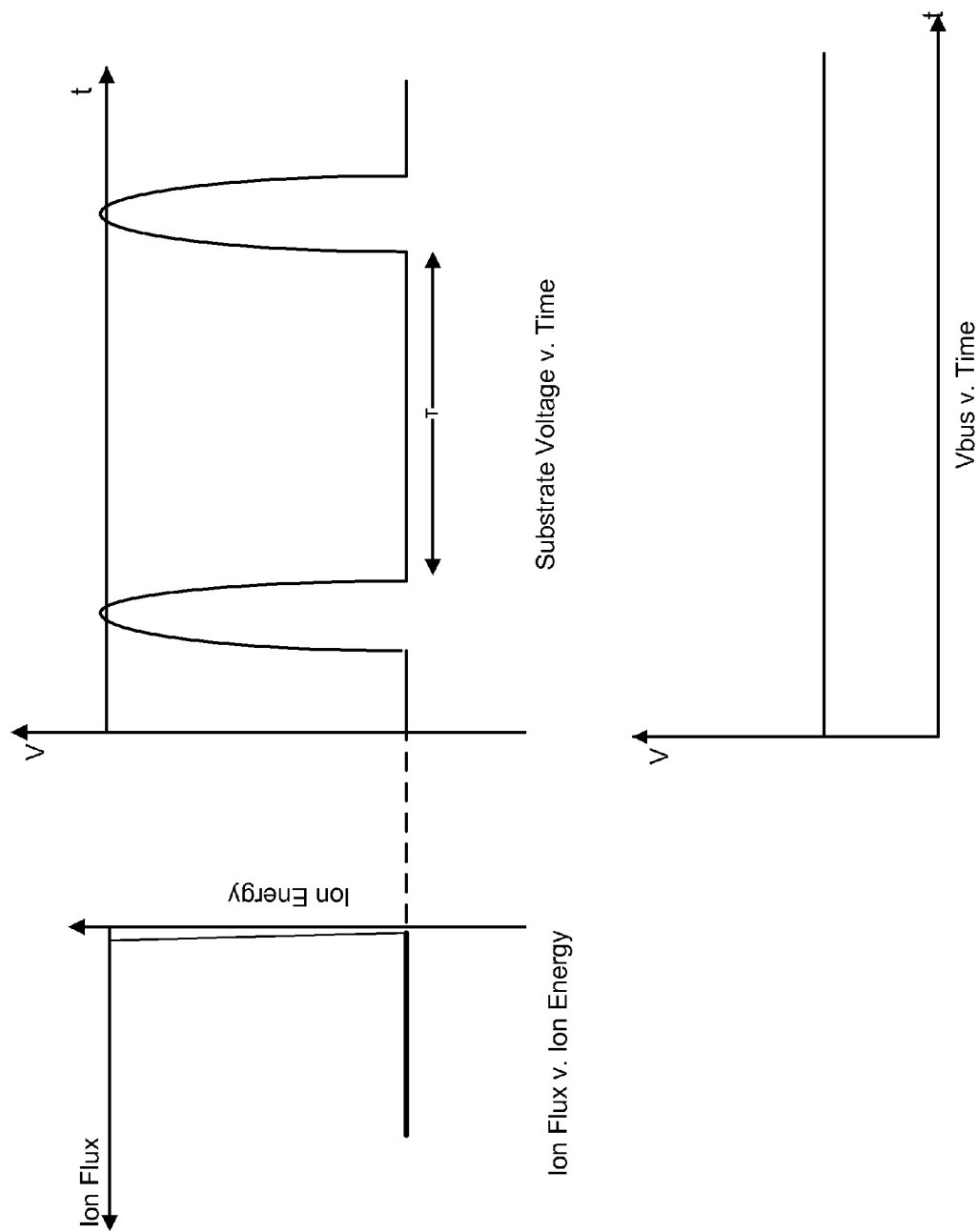
FIG. 5 is a graphical representation of a single mode of operating the switch mode bias supply, which effectuates an ion energy distribution that is concentrated at a particular ion energy.

Referring again to FIG. 3, Vbus can be modulated to control the energy of the ions, and the stored waveforms may be used to control the gate drive signals V2, V4 to achieve a desired pulse amplitude at Vout while minimizing the pulse width. Again, this is done in accordance with the particular characteristics of the transistors, which may be modeled or implemented and empirically established. Referring to FIG. 5, for example, shown are graphs depicting Vbus versus time, voltage at the surface of the substrate 110, 210 versus time, and the corresponding ion energy distribution.

The graphs in FIG. 5 depict a single mode of operating the switch mode bias supply 106, 206, which effectuates an ion energy distribution that is concentrated at a particular ion energy. As depicted, to effectuate the single concentration of ion energies in this example, the voltage applied at Vbus is maintained constant while the voltages applied to V2 and V4 are controlled (e.g., using the drive signals depicted in FIG. 3) so as to generate pulses at the output of the switch-mode bias supply 106, 206, which effectuates the corresponding ion energy distribution shown in FIG. 5.

As depicted in FIG. 5, the potential at the surface of the substrate 110, 210 is generally negative to attract the ions that bombard and etch the surface of the substrate 110, 210. The periodic short pulses that are applied to the substrate 110, 210 (by applying pulses to Vout) have a magnitude defined by the potential that is applied to Vbus, and these pulses cause a brief change in the potential of the substrate 110, 210 (e.g., close to positive or slightly positive potential), which attracts electrons to the surface of the substrate to achieve the generally negative potential along the surface of the substrate 110, 210. As depicted in FIG. 5, the constant voltage applied to Vbus effectuates a single concentration of ion flux at particular ion energy; thus a particular ion bombardment energy may be selected by simply setting Vbus to a particular potential. In other modes of operation, two or more separate concentrations of ion energies may be created.

Figure 6:
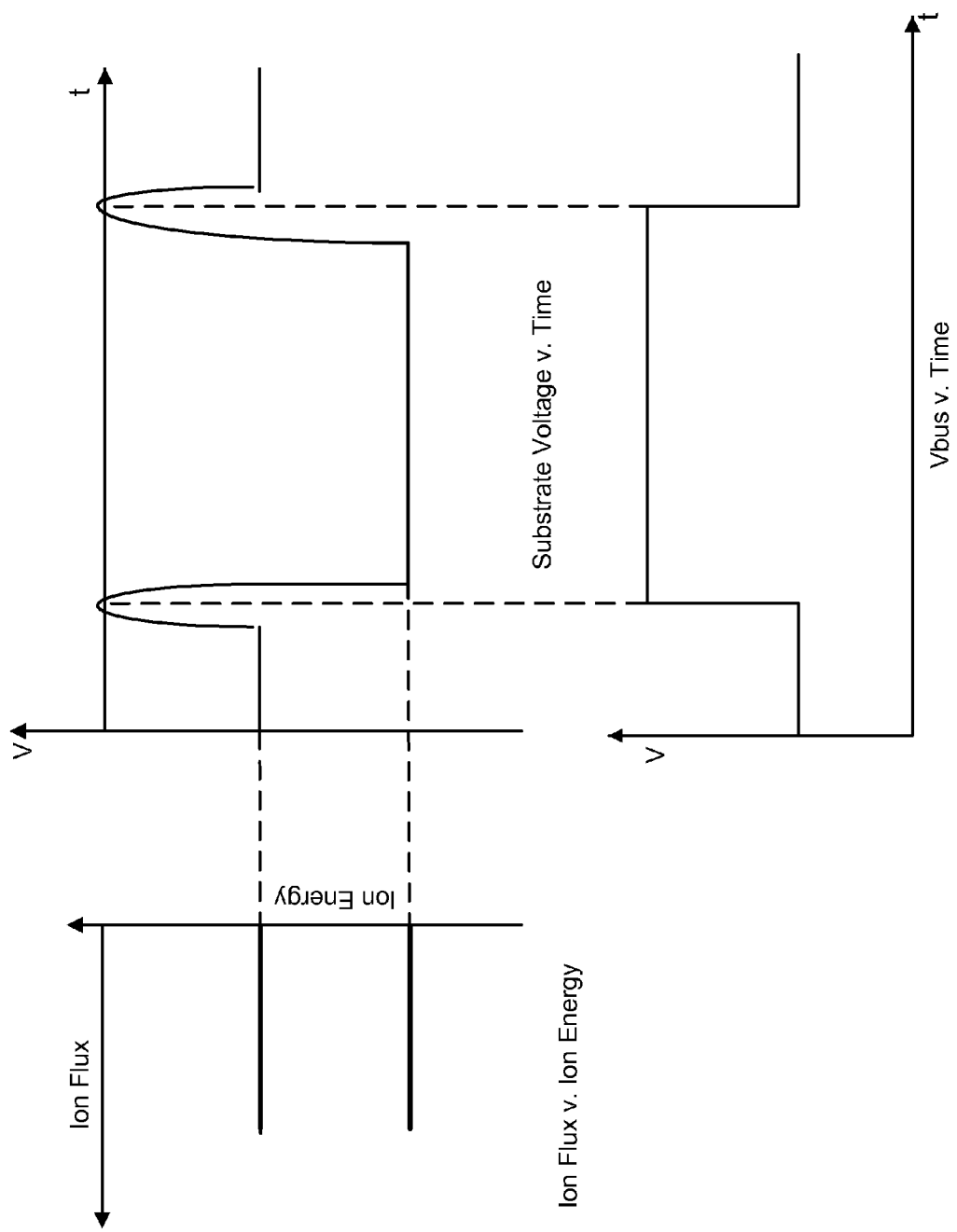
FIG. 6 are graphs depicting a bi-modal mode of operation in which two separate peaks in ion energy distribution are generated.

Referring next to FIG. 6, for example, shown are graphs depicting a bi-modal mode of operation in which two separate peaks in ion energy distribution are generated. As shown, in this mode of operation, the substrate experiences two distinct levels of voltages and periodic pulses, and as a consequence, two separate concentrations of ion energies are created. As depicted, to effectuate the two distinct ion energy concentrations, the voltage that is applied at Vbus alternates between two levels, and each level defines the energy level of the two ion energy concentrations.

Although FIG. 6 depicts the two voltages at the substrate 110, 210 as alternating after every pulse, this is certainly not required. In other modes of operation for example, the voltages applied to V2 and V4 are switched (e.g., using the drive signals depicted in FIG. 3) relative to the voltage applied to Vout so that the induced voltage at the surface of the substrate alternates from a first voltage to a second voltage (and vice versa) after two or more pulses.

In prior art techniques, attempts have been made to apply the combination of two waveforms (generated by waveform generators) to a linear amplifier and apply the amplified combination of the two waveforms to the substrate in order to effectuate multiple ion energies. This approach, however, is much more complex then the approach described with reference to FIG. 6, and requires an expensive linear amplifier, and waveform generators.

Figure 7A:
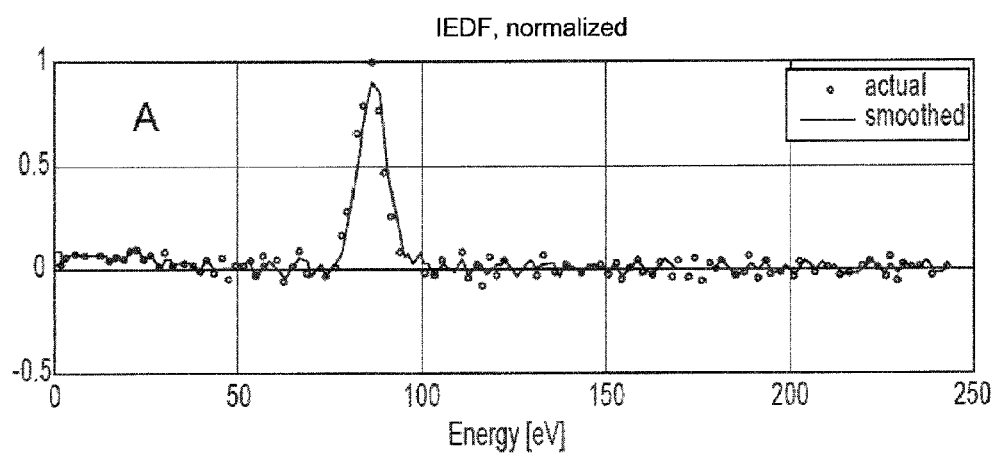
FIGS. 7A and 7B are is are graphs depicting actual, direct ion energy measurements made in a plasma.
Figure 7B:
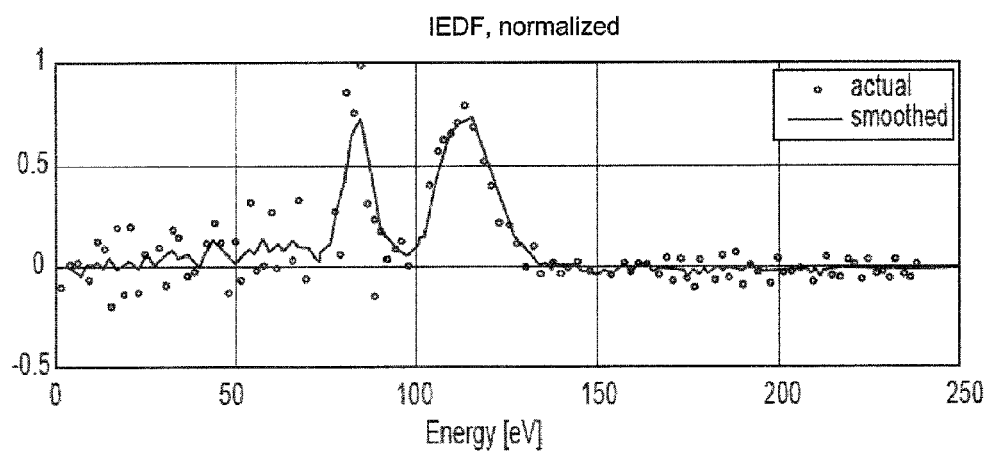

Referring next to FIGS. 7A and 7B, shown are graphs depicting actual, direct ion energy measurements made in a plasma corresponding to monoenergetic and dual-level regulation of the DC voltage applied to Vbus, respectively. As depicted in FIG. 7A, the ion energy distribution is concentrated around 80 eV responsive to a non-varying application of a voltage to Vbus (e.g., as depicted in FIG. 5). And in FIG. 7B, two separate concentrations of ion energies are present at around 85 eV and 115 eV responsive to a dual-level regulation of Vbus (e.g., as depicted in FIG. 6).

Figure 8A:
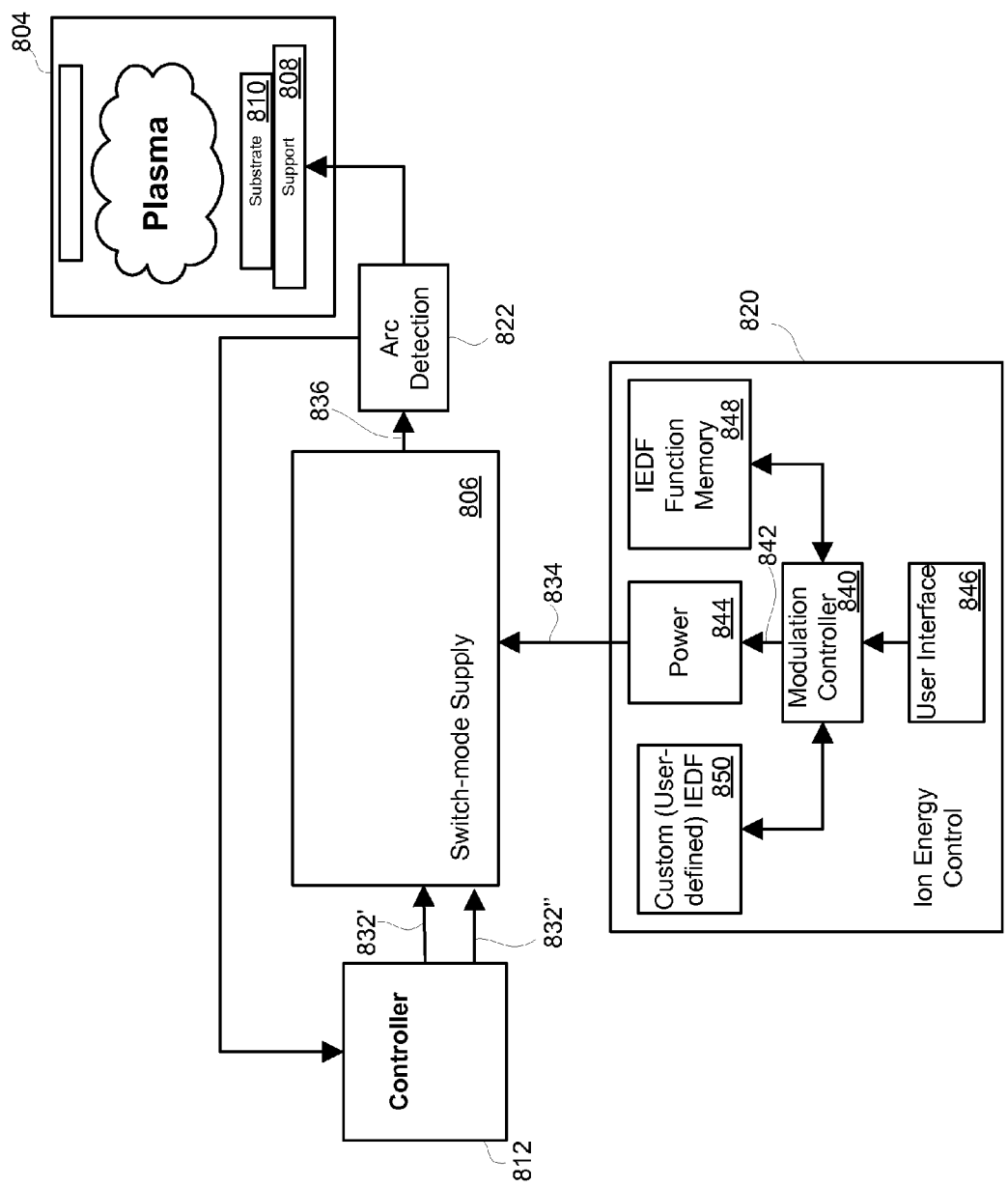
FIG. 8A is a block diagram depicting another embodiment of the present invention.

Referring next to FIG. 8A, shown is a block diagram depicting another embodiment of the present invention. As depicted, a switch-mode power supply 806 is coupled to a controller 812, an ion-energy control component 820, and a substrate support 808 via an arc detection component 822. The controller 812, switch-mode power supply 806, and ion energy control component 820 collectively operate to apply power to the substrate support 808 so as to effectuate, on a time-averaged basis, a desired ion energy distribution at the surface of the substrate 810.

Figure 8B:
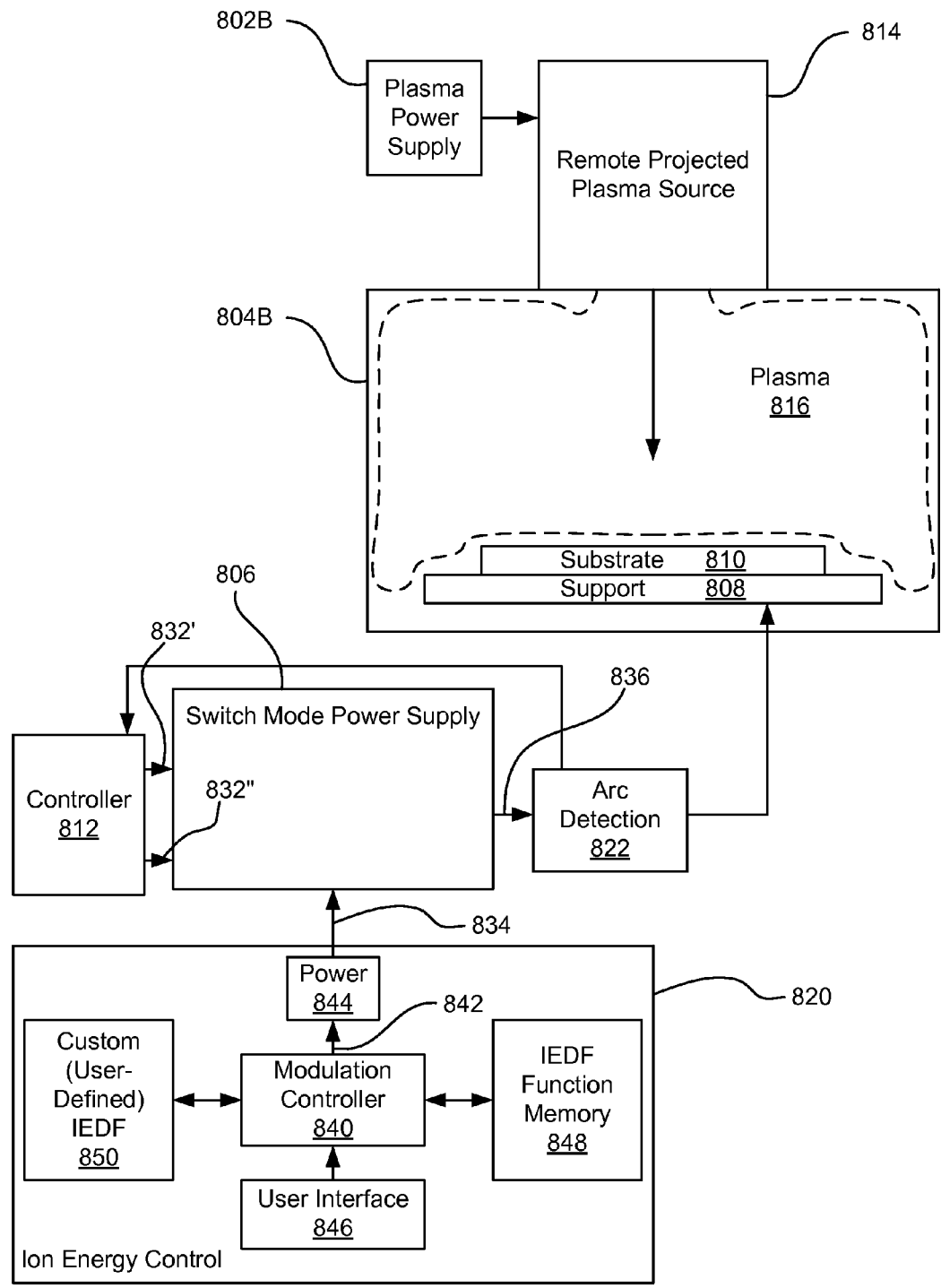
FIG. 8B is a block diagram depicting yet another embodiment of the present invention.

Referring next to FIG. 8B, shown is a block diagram depicting another embodiment of the present disclosure. As in FIG. 8A, the switch-mode power supply 806 is coupled to the controller 812, the ion-energy control component 820, and the substrate support 808 via an arc detection component 822. The controller 812, switch-mode power supply 806, and ion energy control component 820 collectively operate to apply power to the substrate support 808 so as to effectuate, on a time-averaged basis, a desired ion energy distribution at the surface of the substrate 810.

Additionally, a plasma power supply 802B is coupled to a remote projected plasma source 814, which projects an ionizing electromagnetic field into a plasma processing chamber 804B. The plasma power supply 802B and the remote projected plasma source 814 collectively operate to apply power to the plasma 816 so as to effectuate, on a time-averaged basis, a desired plasma density within the plasma processing chamber 804B, and in particular at the surface of the substrate 810.

This embodiment allows control over plasma density via the remote projected plasma source 814 and the plasma power supply 802B independent of the ion energy distribution as controlled by the switch mode power supply 806, the controller 812, the arc detection 822, and the ion energy control 820.

Figure 9A:
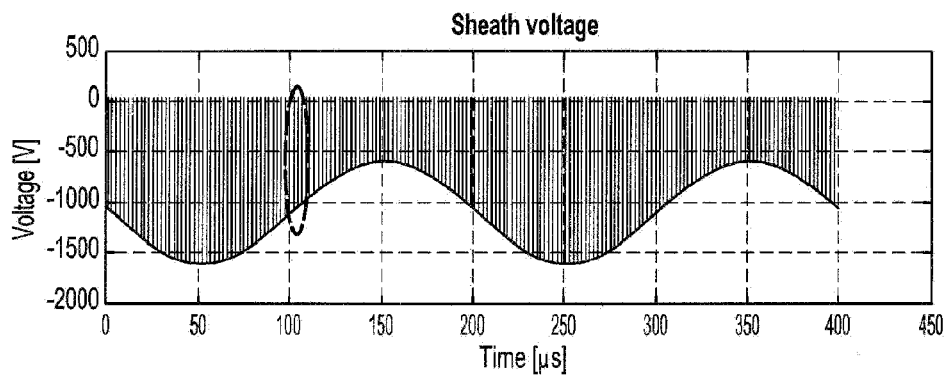
FIG. 9A is a graph depicting an exemplary periodic voltage function that is modulated by a sinusoidal modulating function.
Figure 9B:
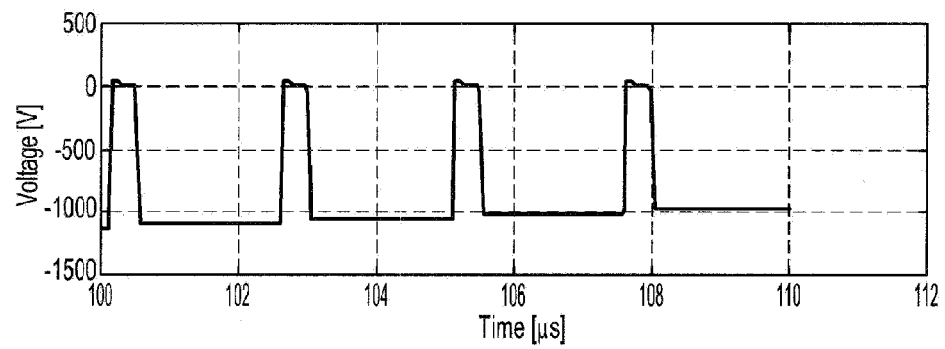
FIG. 9B is an exploded view of a portion of the periodic voltage function that is depicted in FIG. 9A.
Figure 9C:
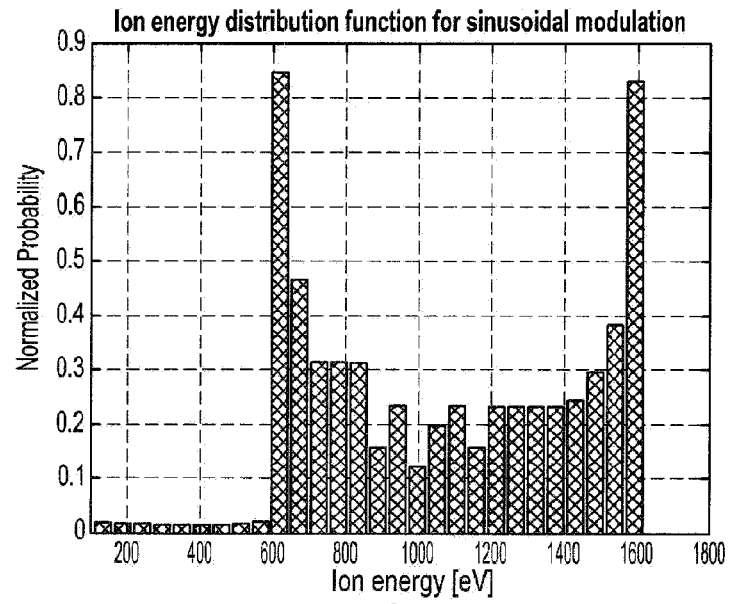
FIG. 9C depicts the resulting distribution of ion energies, on time-averaged basis, that results from the sinusoidal modulation of the periodic voltage function.
Figure 9D:
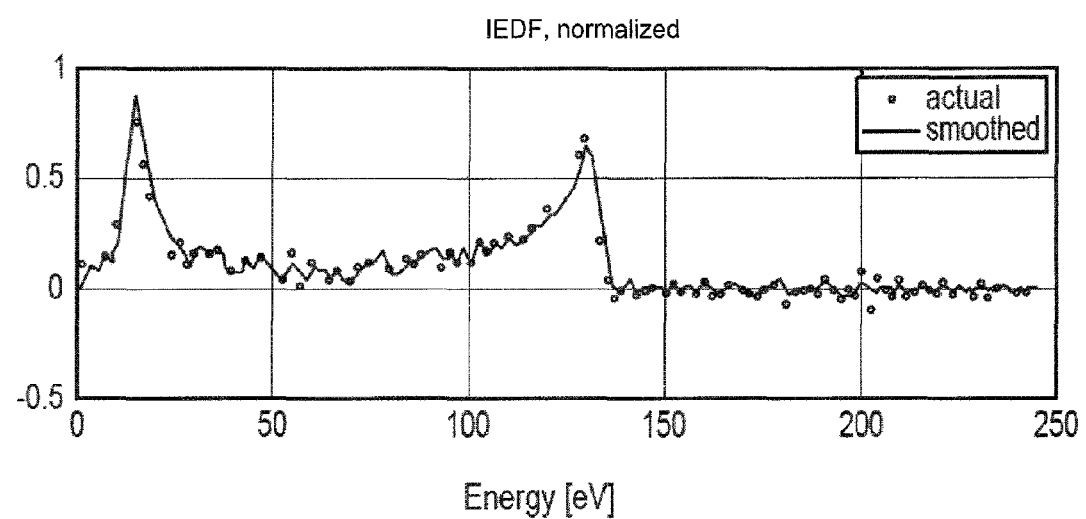
FIG. 9D depicts actual, direct, ion energy measurements made in a plasma of a resultant, time averaged, IEDF when a periodic voltage function is modulated by a sinusoidal modulating function.

Referring briefly to FIG. 9A for example, shown is a periodic voltage function with a frequency of about 400 kHz that is modulated by a sinusoidal modulating function of about 5 kHz over multiple cycles of the periodic voltage function. FIG. 9B is an exploded view of the portion of the periodic voltage function that is circled in FIG. 9A, and FIG. 9C depicts the resulting distribution of ion energies, on a time-averaged basis, that results from the sinusoidal modulation of the periodic voltage function. And FIG. 9D depicts actual, direct, ion energy measurements made in a plasma of a resultant, time-averaged, IEDF when a periodic voltage function is modulated by a sinusoidal modulating function. As discussed further herein, achieving a desired ion energy distribution, on a time-averaged basis, may be achieved by simply changing the modulating function that is applied to the periodic voltage.

Figure 10A:
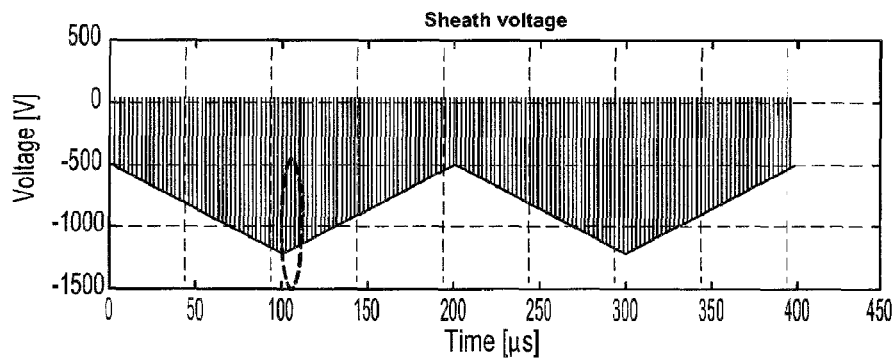
FIG. 10A depicts a periodic voltage function is modulated by a sawtooth modulating function.
Figure 10B:
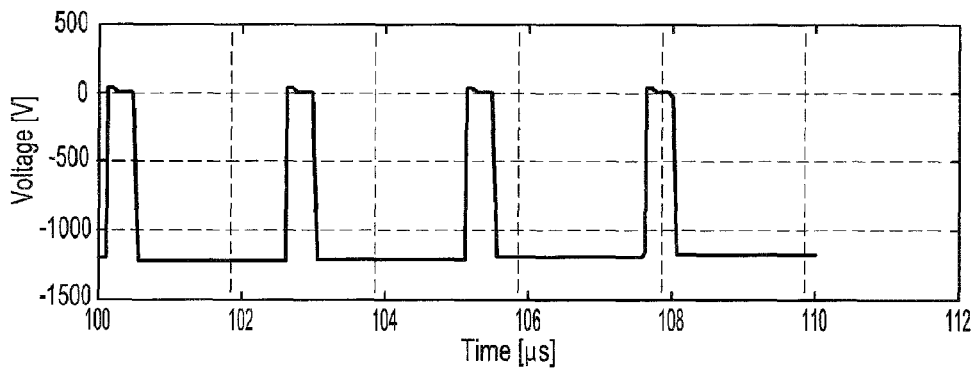
FIG. 10B is an exploded view of a portion of the periodic voltage function that is depicted in FIG. 10A.
Figure 10C:
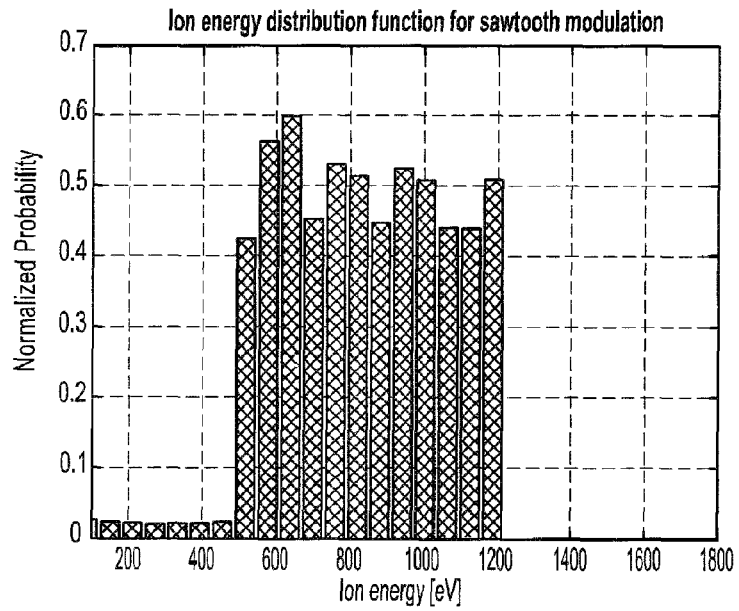
FIG. 10C is a graph depicting the resulting distribution of ion energies, on a time averaged basis, that results from the sinusoidal modulation of the periodic voltage function in FIGS. 10A and 10B.

Referring to FIGS. 10A and 10B as another example, a 400 kHz periodic voltage function is modulated by a sawtooth modulating function of approximately 5 kHz to arrive at the distribution of ion energies depicted in FIG. 10C on a time-averaged basis. As depicted, the periodic voltage function utilized in connection with FIG. 10 is the same as in FIG. 9, except that the periodic voltage function in FIG. 10 is modulated by a sawtooth function instead of a sinusoidal function.

It should be recognized that the ion energy distribution functions depicted in FIGS. 9C and 10C do not represent an instantaneous distribution of ion energies at the surface of the substrate 810, but instead represent the time average of the ion energies. With reference to FIG. 9C, for example, at a particular instant in time, the distribution of ion energies will be a subset of the depicted distribution of ion energies that exist over the course of a full cycle of the modulating function.

It should also be recognized that the modulating function need not be a fixed function nor need it be a fixed frequency. In some instances for example, it may be desirable to modulate the periodic voltage function with one or more cycles of a particular modulating function to effectuate a particular, time-averaged ion energy distribution, and then modulate the periodic voltage function with one or more cycles of another modulating function to effectuate another, time-averaged ion energy distribution. Such changes to the modulating function (which modulates the periodic voltage function) may be beneficial in many instances. For example, if a particular distribution of ion energies is needed to etch a particular geometric construct or to etch through a particular material, a first modulating function may be used, and then another modulating function may subsequently be used to effectuate a different etch geometry or to etch through another material.

Similarly, the periodic voltage function (e.g., the 400 kHz components in FIGS. 9A, 9B, 10A, and 10B and Vout in FIG. 4) need not be rigidly fixed (e.g., the shape and frequency of the periodic voltage function may vary), but generally its frequency is established by the transit time of ions within the chamber so that ions in the chamber are affected by the voltage that is applied to the substrate 810.

Referring back to FIGS. 8A and 8b the controller 812 provides drive-control signals 832', 832" to the switch-mode supply 806 so that the switch-mode supply 806 generates a periodic voltage function. The switch mode supply 806 may be realized by the components depicted in FIG. 3 (e.g., to create a periodic voltage function depicted in FIG. 4), but it is certainly contemplated that other switching architectures may be utilized.

In general, the ion energy control component 820 functions to apply a modulating function to the periodic voltage function (that is generated by the controller 812 in connection with the switch mode power supply 806). As shown in FIG. 8A, the ion energy control component 820 includes a modulation controller 840 that is in communication with a custom IEDF portion 850, an IEDF function memory 848, a user interface 846, and a power component 844. It should be recognized that the depiction of these components is intended to convey functional components, which in reality, may be effectuated by common or disparate components.

The modulation controller 840 in this embodiment generally controls the power component 844 (and hence its output 834) based upon data that defines a modulation function, and the power component 844 generates the modulation function 834 (based upon a control signal 842 from the modulation controller 840) that is applied to the periodic voltage function that is generated by the switch-mode supply 806. The user interface 846 in this embodiment is configured to enable a user to select a predefined IEDF function that is stored in the IEDF function memory 848, or in connection with the custom IEDF component 850, define a custom IEDF In many implementations, the power component 844 includes a DC power supply (e.g., a DC switch mode power supply or a linear amplifier), which applies the modulating function (e.g. a varying DC voltage) to the switch mode power supply 806 (e.g., to Vbus of the switch mode power supply depicted in FIG. 3). In these implementations, the modulation controller 840 controls the voltage level that is output by the power component 844 so that the power component 844 applies a voltage that conforms to the modulating function.

Figure 11:
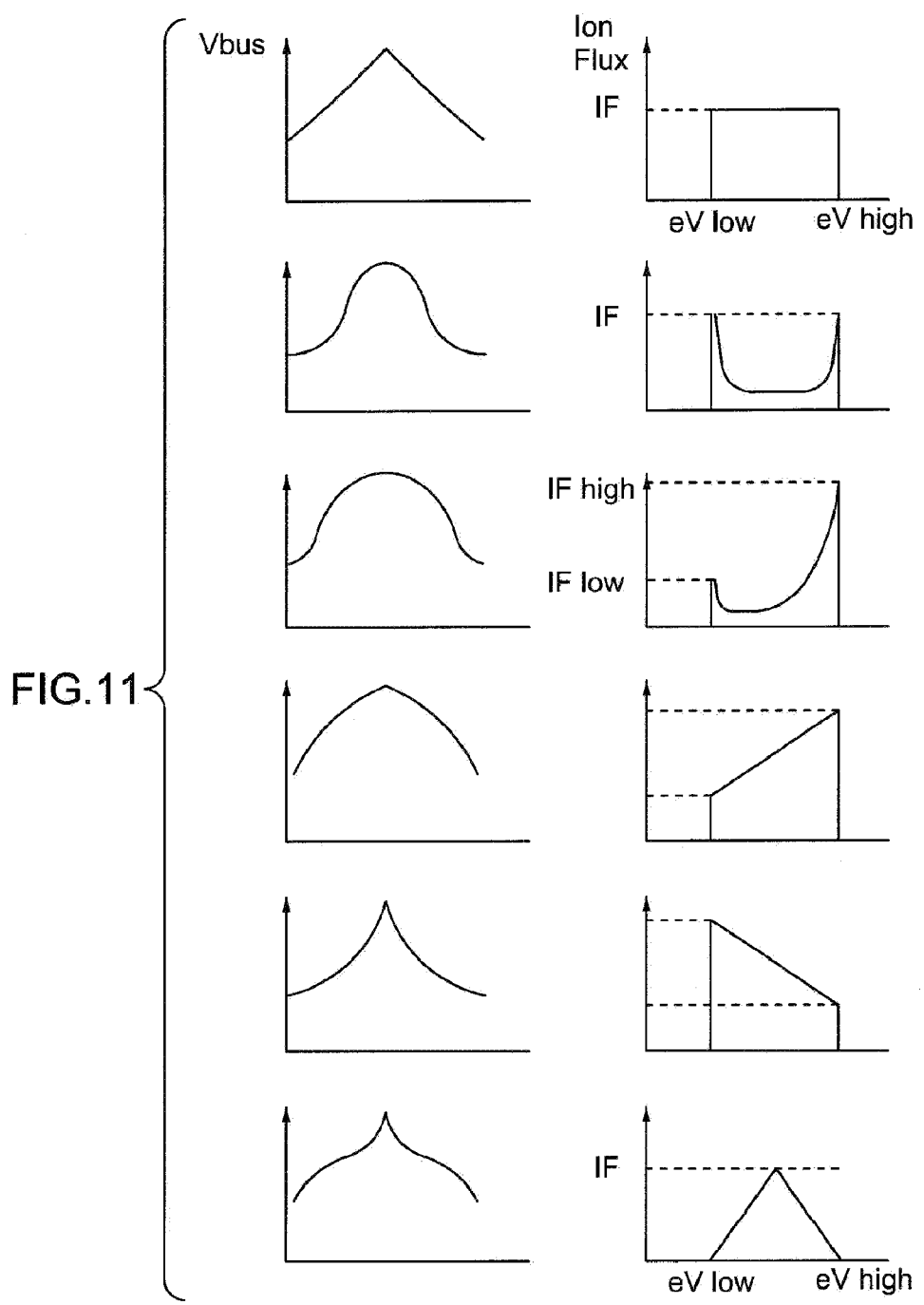
FIG. 11 are graphs showing IEDF functions in the right column and associated modulating functions in the left column.

In some implementations, the IEDF function memory 848 includes a plurality of data sets that correspond to each of a plurality of IEDF distribution functions, and the user interface 846 enables a user to select a desired IEDF function. Referring to FIG. 11 for example, shown in the right column are exemplary IEDF functions that may be available for a user to select. And the left column depicts the associated modulating function that the modulation controller 840 in connection with the power component 844 would apply to the periodic voltage function to effectuate the corresponding IEDF function. It should be recognized that the IEDF functions depicted in FIG. 11 are only exemplary and that other IEDF functions may be available for selection.

The custom IEDF component 850 generally functions to enable a user, via the user interface 846, to define a desired ion energy distribution function. In some implementations for example, the custom IEDF component 850 enables a user to establish values for particular parameters that define a distribution of ion energies.

For example, the custom IEDF component 850 may enable IEDF functions to be defined in terms of a relative level of flux (e.g., in terms of a percentage of flux) at a high-level (IF-high), a mid-level (IF-mid), and a low level (IF-low) in connection with a function(s) that defines the IEDF between these energy levels. In many instances, only IF-high, IF-low, and the IEDF function between these levels is sufficient to define an IEDF function. As a specific example, a user may request 1200 eV at a 20% contribution level (contribution to the overall IEDF), 700 eV at a 30% contribution level with a sinusoid IEDF between these two levels.

It is also contemplated that the custom IEDF portion 850 may enable a user to populate a table with a listing of one or more (e.g., multiple) energy levels and the corresponding percentage contribution of each energy level to the IEDF. And in yet alternative embodiments, it is contemplated that the custom IEDF component 850 in connection with the user interface 846 enables a user to graphically generate a desired IEDF by presenting the user with a graphical tool that enables a user to draw a desired IEDF.

In addition, it is also contemplated that the IEDF function memory 848 and the custom IEDF component 850 may interoperate to enable a user to select a predefined IEDF function and then alter the predefined IEDF function so as to produce a custom IEDF function that is derived from the predefined IEDF function.

Once an IEDF function is defined, the modulation controller 840 translates data that defines the desired IEDF function into a control signal 842, which controls the power component 844 so that the power component 844 effectuates the modulation function that corresponds to the desired IEDF. For example, the control signal 842 controls the power component 844 so that the power component 844 outputs a voltage that is defined by the modulating function.

Figure 12A:
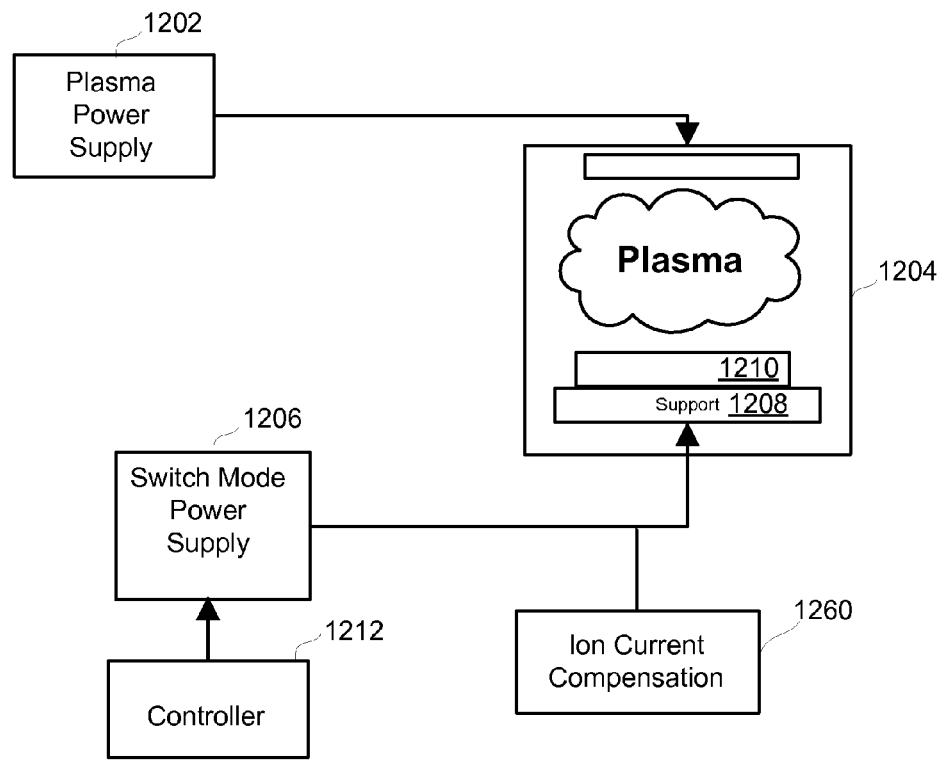
FIG. 12A is a block diagram depicting an embodiment in which an ion current compensation component compensates for ion current in a plasma chamber.
Figure 15A:
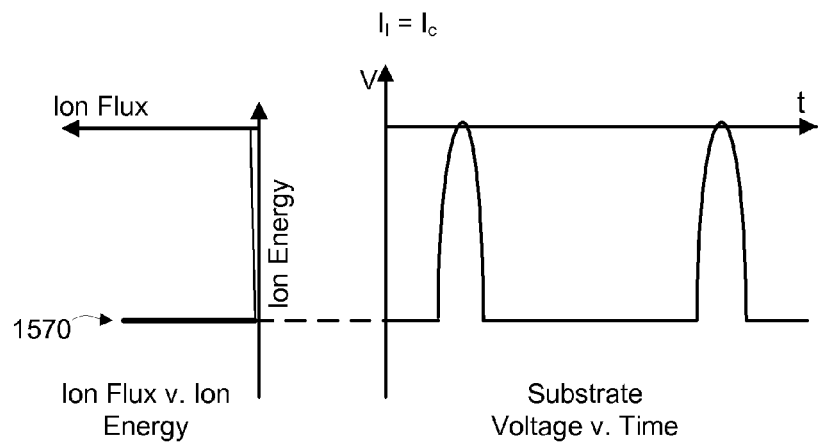
FIGS. 15A-15C are voltage waveforms as appearing at the surface of the substrate or wafer responsive to compensation current.
Figure 15B:
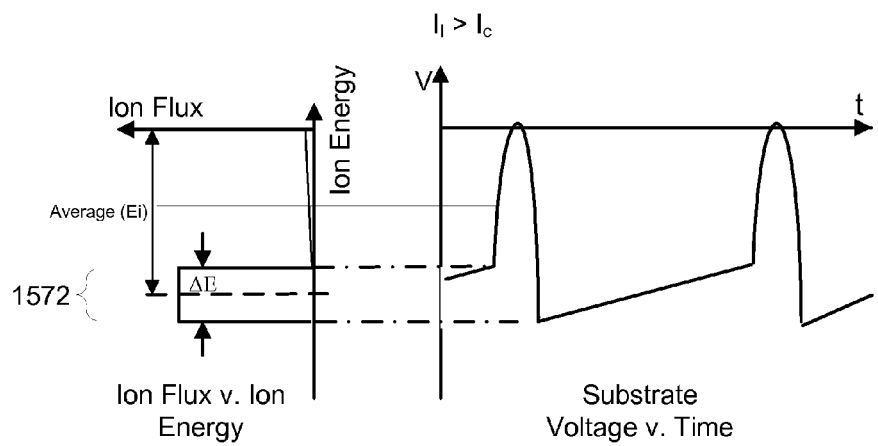
Figure 15C:
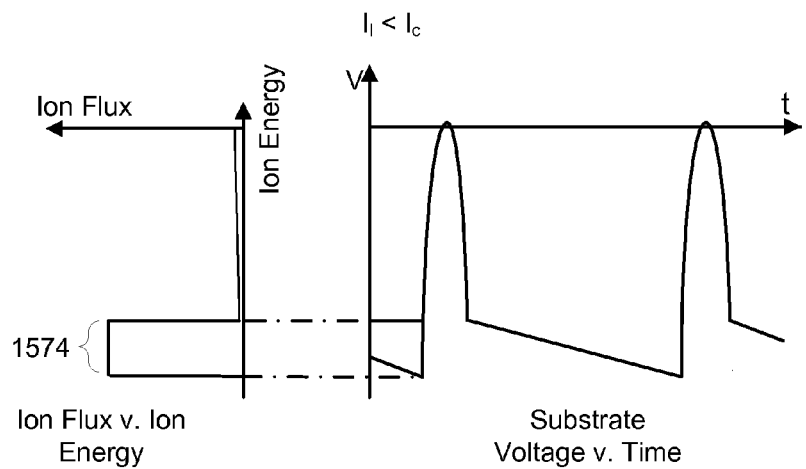

Referring next to FIG. 12A, it is a block diagram depicting an embodiment in which an ion current compensation component 1260 compensates for ion current in the plasma chamber 1204. Applicants have found that, at higher energy levels, higher levels of ion current within the chamber affect the voltage at the surface of the substrate, and as a consequence, the ion energy distribution is also affected. Referring briefly to FIGS. 15A-15C for example, shown are voltage waveforms as they appear at the surface of the substrate 1210 or wafer and their relationship to IEDF.

More specifically, FIG. 15A depicts a periodic voltage function at the surface of the substrate 1210 when ion current $I_I$ is equal to compensation current Ic; FIG. 15B depicts the voltage waveform at the surface of the substrate 1210 when ion current $I_I$ is greater than the compensation current Ic; and FIG. 15C depicts the voltage waveform at the surface of the substrate when ion current is less than the compensation current Ic.

As depicted in FIG. 15A, when $I_I$=Ic a spread of ion energies 1470 is relatively narrow as compared to a uniform spread 1472 of ion energies when $I_I$>Ic as depicted in FIG. 15B or a uniform spread 1474 of ion energies when $I_I$<Ic as depicted in FIG. 15C. Thus, the ion current compensation component 1260 enables a narrow spread of ion energies when the ion current is high (e.g., by compensating for effects of ion current), and it also enables a width of the spread 1572, 1574 of uniform ion energy to be controlled (e.g., when it is desirable to have a spread of ion energies).

As depicted in FIG. 15B, without ion current compensation (when $I_I$>Ic) the voltage at the surface of the substrate, between the positive portions of the periodic voltage function, becomes less negative in a ramp-like manner, which produces a broader spread 1572 of ion energies. Similarly, when ion current compensation is utilized to increase a level of compensation current to a level that exceeds the ion current ($I_I$<Ic) as depicted in FIG. 15C, the voltage at the surface of the substrate becomes more negative in a ramp-like manner between the positive portions of the periodic voltage function, and a broader spread 1574 of uniform ion energies is produced.

Referring back to FIG. 12A, the ion compensation component 1260 may be realized as a separate accessory that may optionally be added to the switch mode power supply 1206 and controller 1212. In other embodiments, (e.g., as depicted in FIG. 13) the ion current compensation component 1260 may share a common housing 1366 with other components described herein (e.g., the switch-mode power supply 106, 206, 806, 1206 and ion energy control 220, 820 components).

Figure 12B:
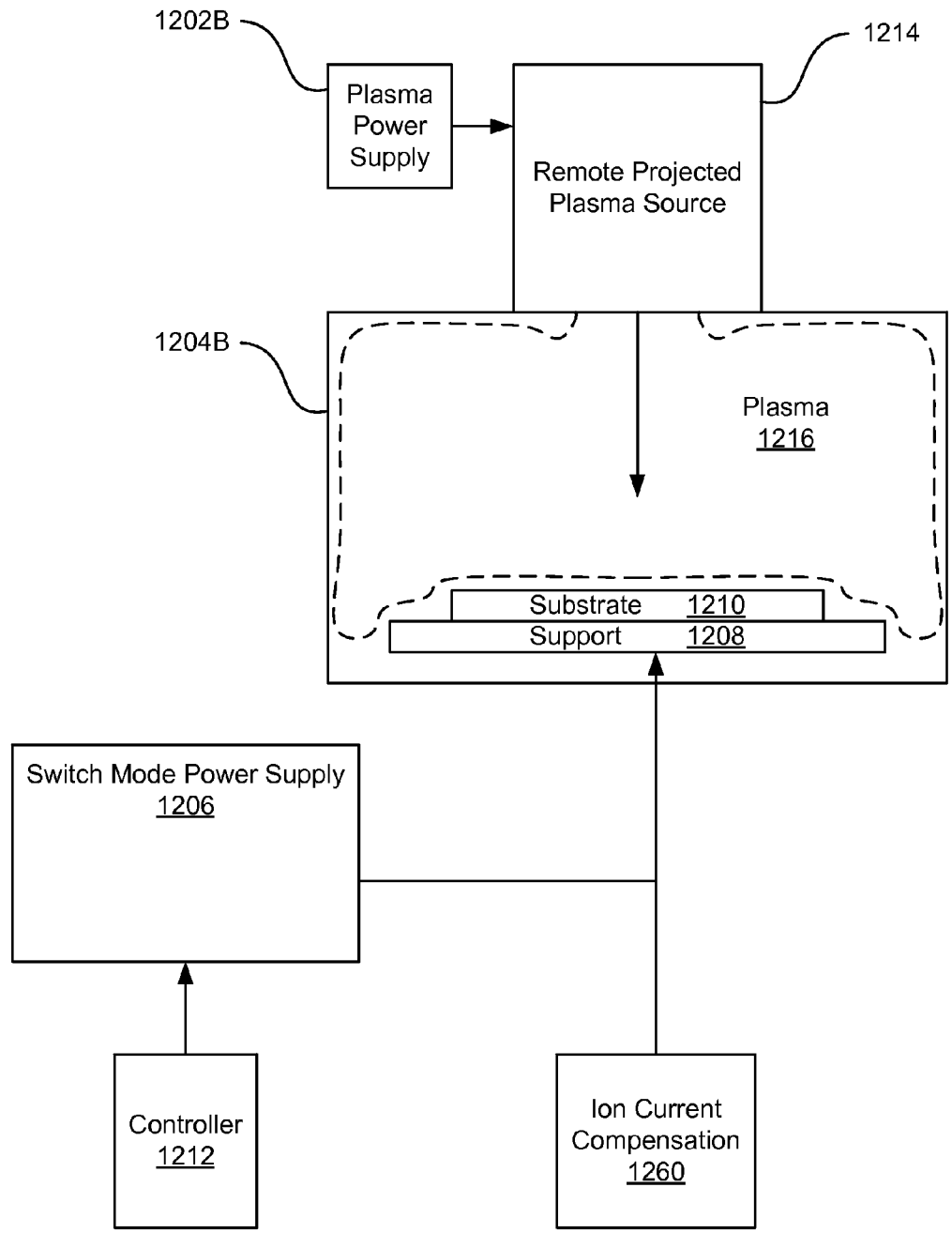
FIG. 12B is a block diagram depicting another embodiment in which an ion current compensation component compensates for ion current in a plasma chamber.

FIG. 12B illustrates an alternative embodiment of that shown in FIG. 12A. Here, the plasma chamber 1204B is coupled to a remote projected plasma source 1214. The remote projected plasma source 1214 is coupled to a plasma power supply 1202B, where the plasma power supply 1202B provides power to ignite and sustain the plasma 1216. The remote projected plasma source 1214 uses the power from the plasma power supply 1202B to generate an ionizing electromagnetic field that is projected into the plasma chamber 1204B where it ignites and sustains the plasma 1216. The remote projected plasma source 1214 can be used to modify the plasma density without affecting the ion energy distribution discussed with reference to FIG. 12A. This embodiment allows control over plasma density via the remote projected plasma source 1214 and the plasma power supply 1202B independent of the ion energy distribution as controlled by the switch mode power supply 1206, the controller 1212, and the ion current compensation 1260.

Figure 13:
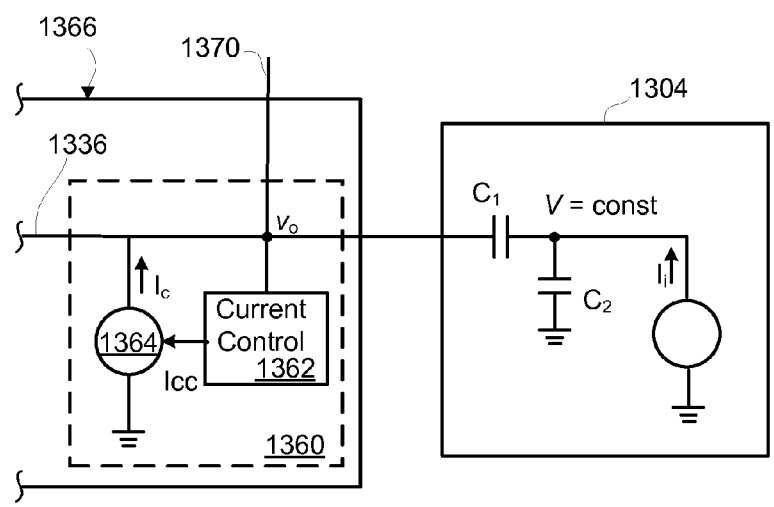
FIG. 13 is a diagram depicting an exemplary ion current compensation component.

As depicted in FIG. 13, shown is an exemplary ion current compensation component 1360 that includes a current source 1364 coupled to an output 1336 of a switch mode supply and a current controller 1362 that is coupled to both the current source 1364 and the output 1336. Also depicted in FIG. 13 is a plasma chamber 1304, and within the plasma chamber are capacitive elements $C_1$, $C_2$, and ion current $I_I$. As depicted, $C_1$ represents the inherent capacitance of components associated with the chamber 1304, which may include insulation, the substrate, substrate support, and an electrostatic-chuck ("e-chuck"), and $C_2$ represents sheath capacitance and stray capacitances.

It should be noted that because $C_1$ in this embodiment is an inherent capacitance of components associated with the chamber 1304, it is not an accessible capacitance that is added to gain control of processing. For example, some prior art approaches that utilize a linear amplifier couple bias power to the substrate with a blocking capacitor, and then utilize a monitored voltage across the blocking capacitor as feedback to control their linear amplifier. Although a capacitor could couple a switch mode power supply to a substrate support in many of the embodiments disclosed herein, it is unnecessary to do so because feedback control using a blocking capacitor is not required in several embodiments of the present invention.

Figure 14:
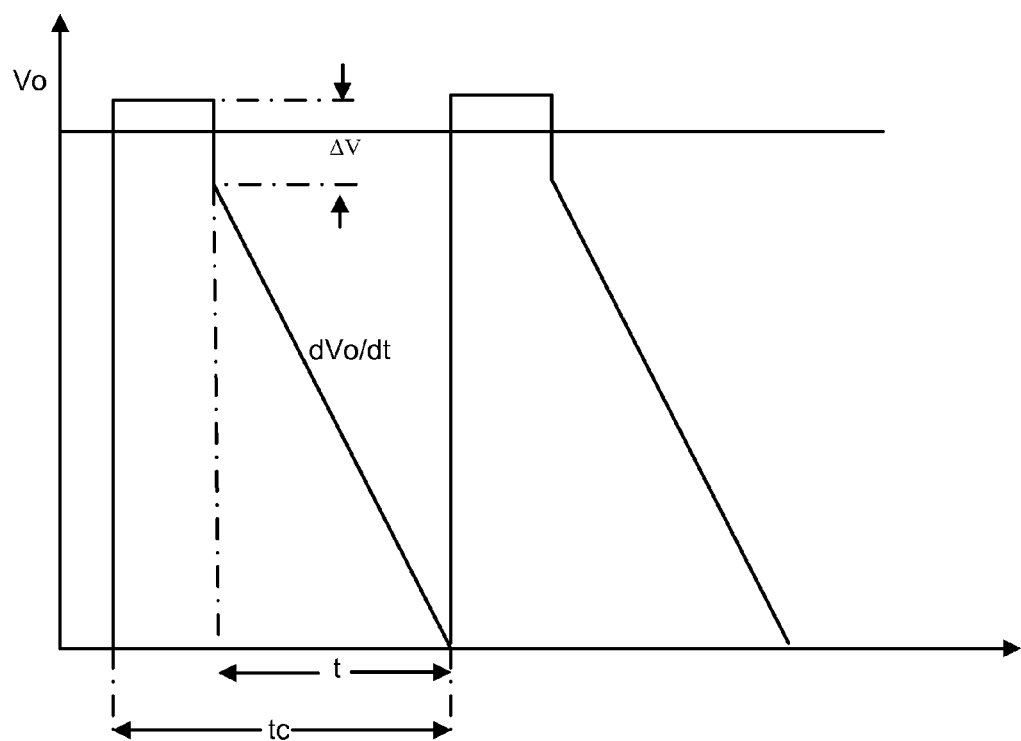
FIG. 14 is a graph depicting an exemplary voltage at node Vo depicted in FIG. 13.

While referring to FIG. 13, simultaneous reference is made to FIG. 14, which is a graph depicting an exemplary voltage at Vo depicted in FIG. 13. In operation, the current controller 1362 monitors the voltage at Vo, and ion current is calculated over an interval t (depicted in FIG. 14) as:

$$I_1 = C_1 \frac{dVo}{dt}$$

Because $C_1$ is substantially constant for a given tool and is measureable, only Vo needs to be monitored to enable ongoing control of compensation current. As discussed above, to obtain a more mono-energetic distribution of ion energy (e.g., as depicted in FIG. 15A) the current controller controls the current source 1364 so that Ic is substantially the same as $I_I$. In this way, a narrow spread of ion energies may be maintained even when the ion current reaches a level that affects the voltage at the surface of the substrate. And in addition, if desired, the spread of the ion energy may be controlled as depicted in FIGS. 15B and 15C so that additional ion energies are realized at the surface of the substrate.

Also depicted in FIG. 13 is a feedback line 1370, which may be utilized in connection with controlling an ion energy distribution. For example, the value of ΔV depicted in FIG. 14, is indicative of instantaneous ion energy and may be used in many embodiments as part of a feedback control loop.

Figure 16:
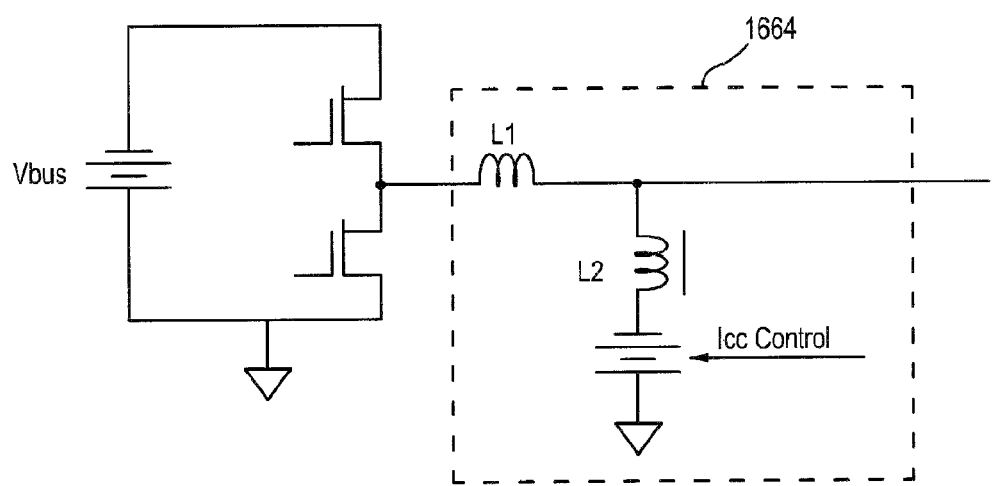
FIG. 16 is an exemplary embodiment of a current source, which may be implemented to realize the current source described with reference to FIG. 13.

Referring next to FIG. 16, shown is an exemplary embodiment of a current source 1664, which may be implemented to realize the current source 1364 described with reference to FIG. 13. In this embodiment, a controllable negative DC voltage source, in connection with a series inductor L2, function as a current source, but one of ordinary skill in the art will appreciate, in light of this specification, that a current source may be realized by other components and/or configurations.

Figure 17A:
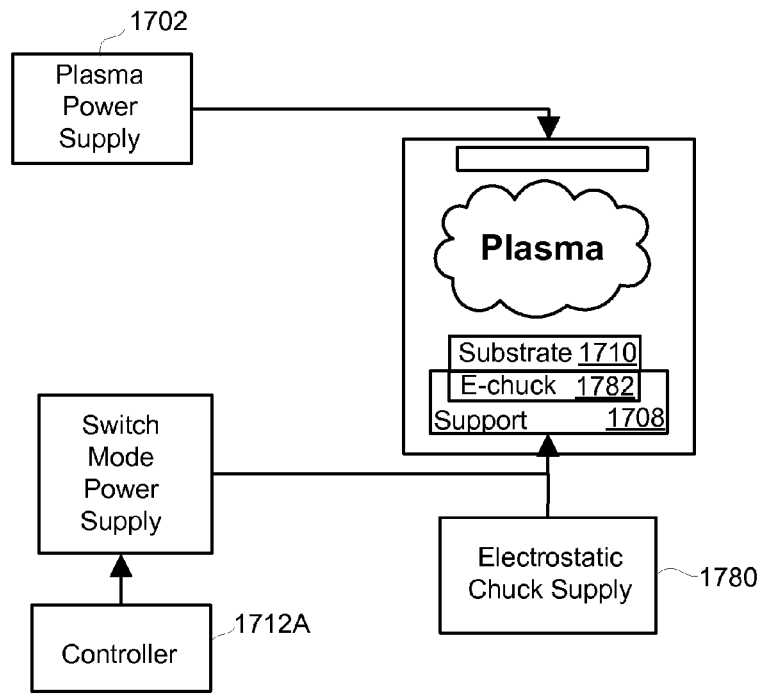
FIGS. 17A and 17B are block diagrams depicting other embodiments of the present invention.
Figure 17B:
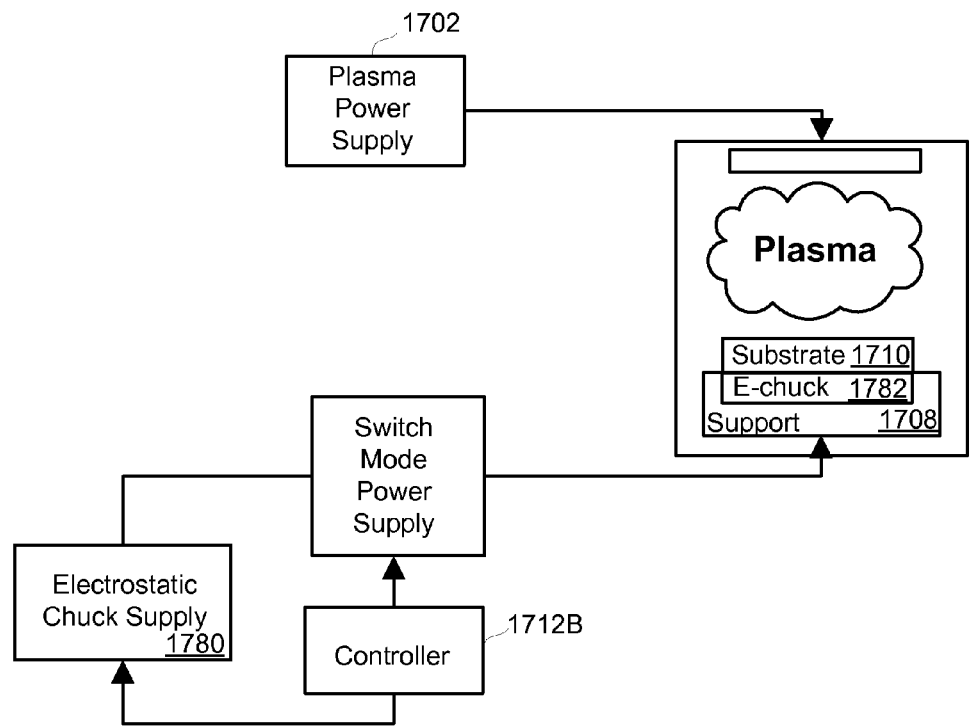

Referring next to FIGS. 17A and 17B, shown are block diagrams depicting other embodiments of the present invention. As shown, the substrate support 1708 in these embodiments includes an electrostatic chuck 1782, and an electrostatic chuck supply 1780 is utilized to apply power to the electrostatic chuck 1782. In some variations, as depicted in FIG. 17A, the electrostatic chuck supply 1780 is positioned to apply power directly to the substrate support 1708, and in other variations, the electrostatic chuck supply 1780 is positioned to apply power in connection with the switch mode power supply. It should be noted that serial chucking can be carried out by either a separate supply or by use of the controller to effect a net DC chucking function. In this DC-coupled (e.g., no blocking capacitor), series chucking function, undesired interference with other RF sources can be minimized.

Figure 17C:
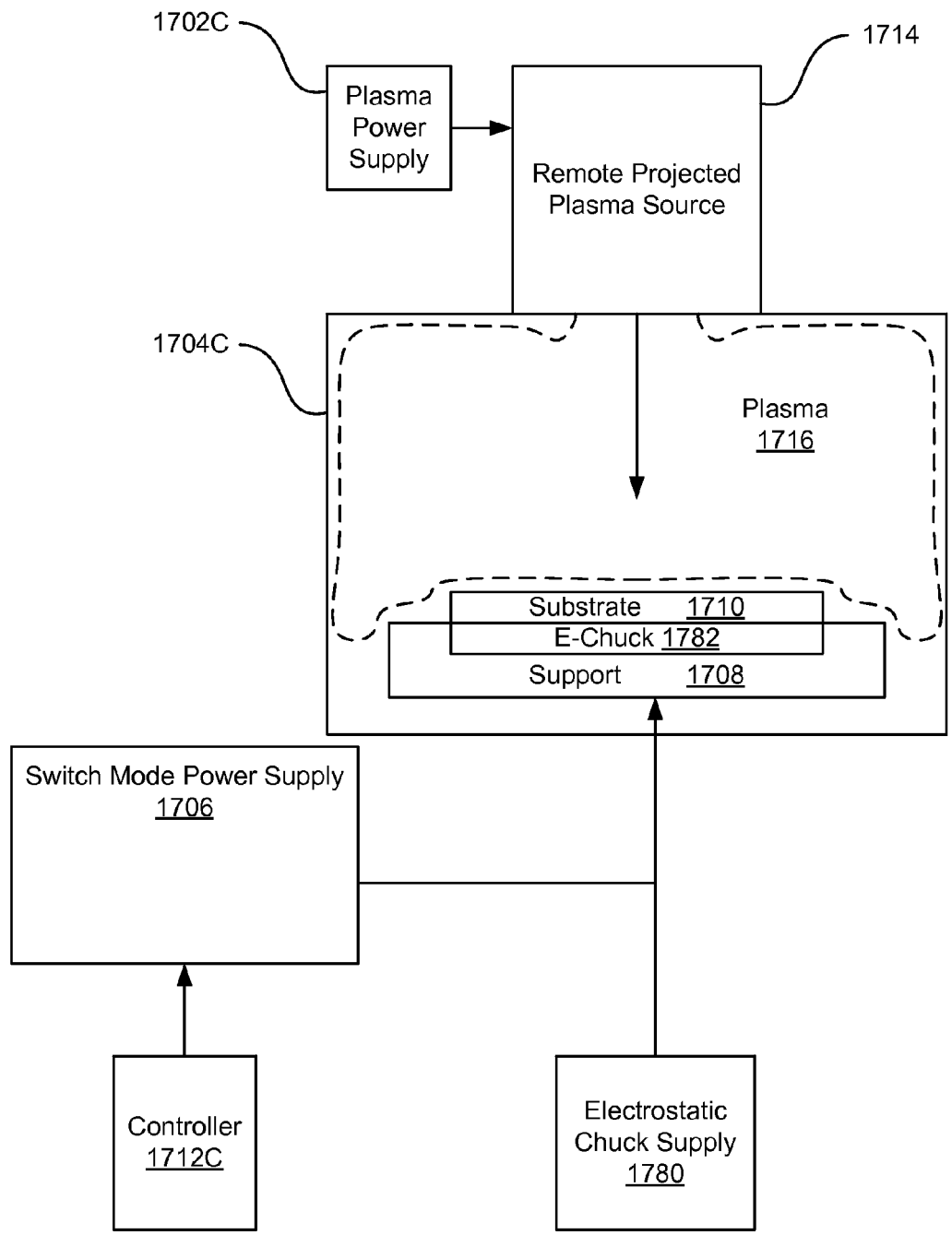
FIG. 17C is a block diagram depicting further embodiments of the present invention.
Figure 17D:
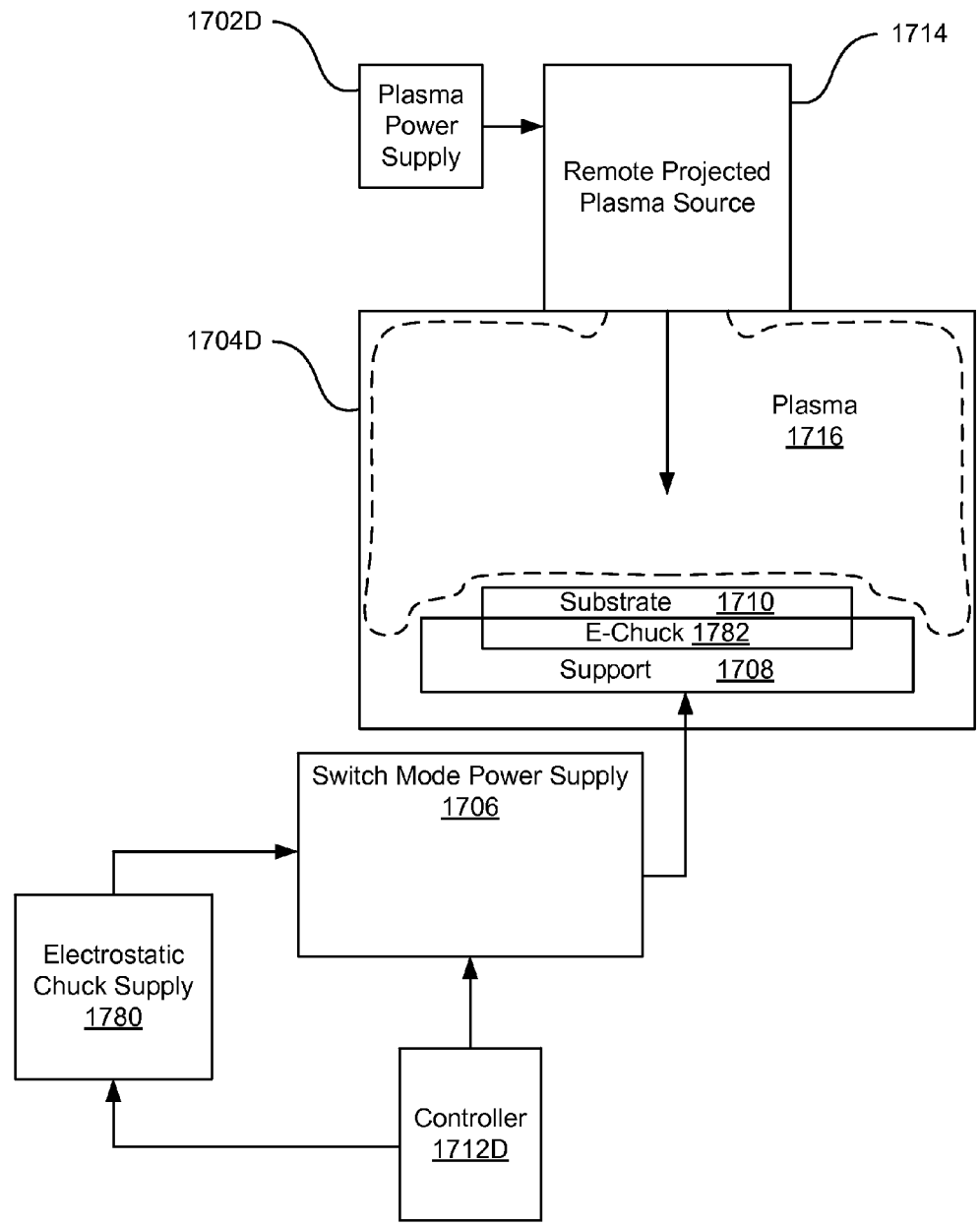
FIG. 17D is a block diagram depicting further embodiments of the present invention.

FIGS. 17C and 17D illustrate alternative embodiments of those illustrated in FIGS. 17A and 17B. However, here the plasma chamber 1704C, 1704D is coupled to a remote projected plasma source 1714C, 1714D, which is coupled to a plasma power supply 1702C, 1702D that provides power to ignite and sustain the plasma 1716. The remote projected plasma source 1714 uses the power from the plasma power supply 1702C, 1702D to generate an ionizing electromagnetic field that is projected into the plasma chamber 1704C, 1704D where it ignites and sustains the plasma 1716. These embodiments ignite and sustain the plasma 1716 such that the ionizing electromagnetic field does not affect a chucking force between the substrate 1710 and the e-chuck 1782. In other words, the chucking bias is independent of the ionizing electromagnetic field.

Figure 18:
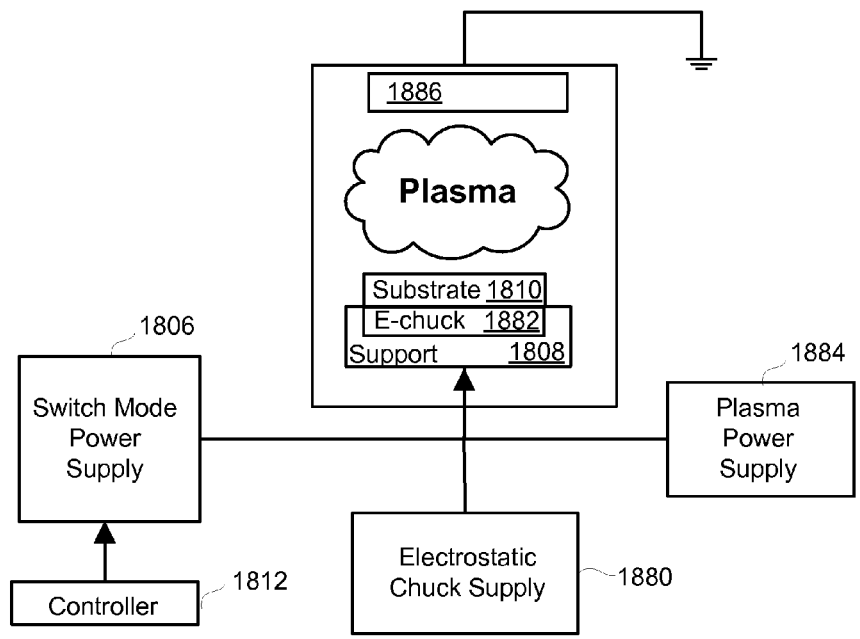
FIG. 18 is a block diagram depicting yet another embodiment of the present invention.

Shown in FIG. 18 is a block diagram depicting yet another embodiment of the present invention in which a plasma power supply 1884 that generally functions to generate plasma density is also configured to drive the substrate support 1808 alongside the switch mode power supply 1806 and electrostatic chuck supply 1880. In this implementation, each of the plasma power supply 1884, the electrostatic chuck supply 1880, and the switch mode power supply 1806 may reside in separate assemblies, or two or more of the supplies 1806, 1880, 1884 may be architected to reside in the same physical assembly. Beneficially, the embodiment depicted in FIG. 18 enables a top electrode 1886 (e.g., shower head) to be electrically grounded so as to obtain electrical symmetry and reduced level of damage due to fewer arcing events.

Figure 19:
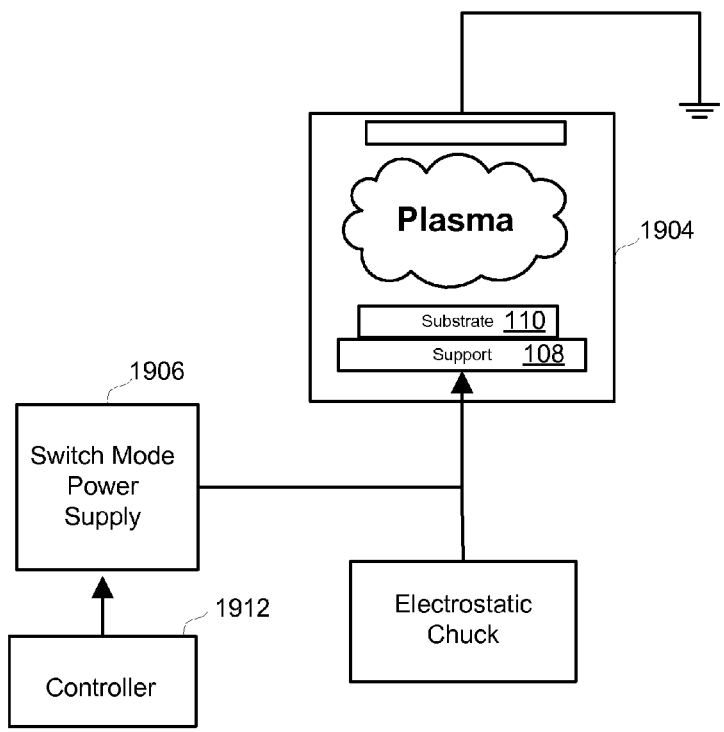
FIG. 19 is a block diagram depicting still another embodiment of the present invention.

Referring to FIG. 19, shown is a block diagram depicting still another embodiment of the present invention. As depicted, the switch mode power supply 1906 in this embodiment is configured to apply power to the substrate support and the chamber 1904 so as to both bias the substrate and ignite (and sustain) the plasma without the need for an additional plasma power supply (e.g., without the plasma power supply 102, 202, 1202, 1702, 1884). For example, the switch-mode power supply 1806 may be operated at a duty cycle that is sufficient to ignite and sustain the plasma while providing a bias to the substrate support.

Figure 20:
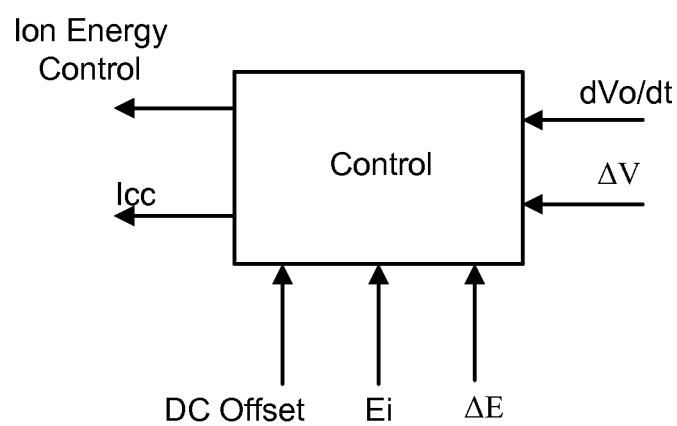
FIG. 20 is a block diagram input parameters and control outputs that may be utilized in connection with the embodiments described with reference to FIGS. 1-19.

Referring next to FIG. 20, it is a block diagram depicting input parameters and control outputs of a control portion that may be utilized in connection with the embodiments described with reference to FIGS. 1-19. The depiction of the control portion is intended to provide a simplified depiction of exemplary control inputs and outputs that may be utilized in connection with the embodiments discussed herein—it is not intended to a be hardware diagram. In actual implementation, the depicted control portion may be distributed among several discrete components that may be realized by hardware, software, firmware, or a combination thereof.

With reference to the embodiments previously discussed herein, the controller depicted in FIG. 20 may provide the functionality of one or more of the controller 112 described with reference to FIGS. 1A and 1B; the controller 212 and ion energy control 220 components described with reference to FIGS. 2A and 2B; the controller 812 and ion energy control portion 820 described with reference to FIGS. 8A and 8B; the ion compensation component 1260 described with reference to FIGS. 12A and 12B; the current controller 1362 described with reference to FIG. 13; the Icc control depicted in FIG. 16, controllers 1712A, 1712B, 1712C, 1712D depicted in FIGS. 17A, 17B, 17C, and 17D, respectively; and controllers 1812, 1912 depicted in FIGS. 18 and 19, respectively.

As shown, the parameters that may be utilized as inputs to the control portion include dVo/dt and ΔV, which are described in more detail with reference to FIGS. 13 and 14. As discussed, dVo/dt may be utilized to in connection with an ion-energy-distribution-spread input ΔE to provide a control signal Icc, which controls a width of the ion energy distribution spread as described with reference to FIGS. 12, 13, 14, 15A-C, and FIG. 16. In addition, an ion energy control input (Ei) in connection with optional feedback ΔV may be utilized to generate an ion energy control signal (e.g., that affects Vbus depicted in FIG. 3) to effectuate a desired ion energy distribution as described in more detail with reference to FIGS. 1-11. And another parameter that may be utilized in connection with many e-chucking embodiments is a DC offset input, which provides electrostatic force to hold the wafer to the chuck for efficient thermal control.

Figure 21:
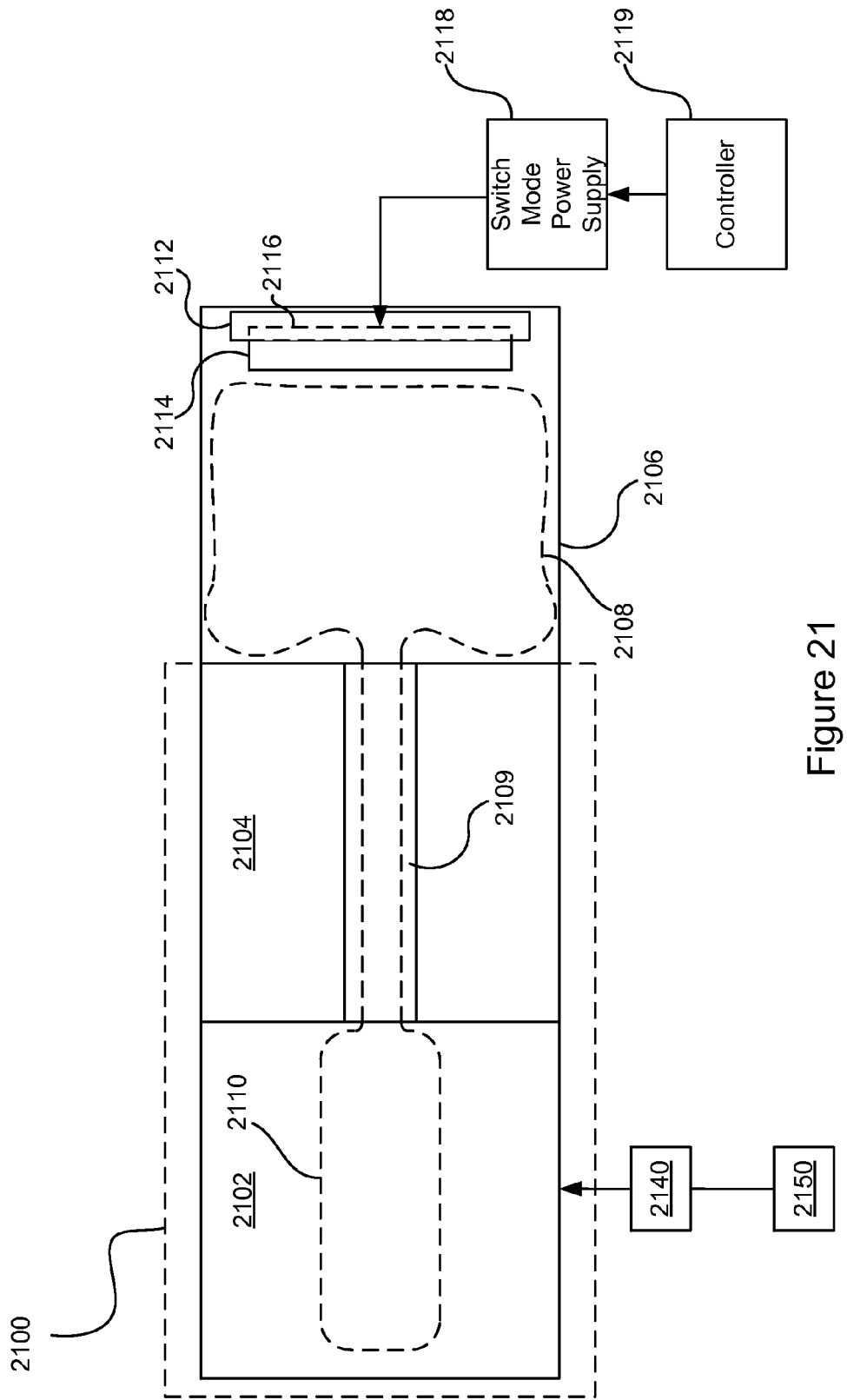
FIG. 21 illustrates an embodiment of a projected plasma source.

FIG. 21 illustrates an embodiment of a projected plasma source 2100. The projected plasma source 2100 can include a field generation portion 2102 and a field projection portion 2104, and the projected plasma source 2100 can be coupled to a receiving portion 2106.

The field generation portion 2102 ignites and sustains a first portion of a plasma 2110 via an ionizing electromagnetic field (e.g., electric, magnetic, or combination of the two) that extends or projects through a field projection portion 2104 to the receiving portion 2106. The field can couple into the first portion of the plasma 2110, once ignited, via inductive or electrostatic (capacitive) means, or via a combination of the two. The field is generated via energy provided from a power source 2140 that is controlled via control circuitry or logic 2150. The plasma power supply 2140 can be realized by one or more power supplies providing AC, pulsed DC, or other time-varying currents and voltages as well as DC current and voltage. The plasma power supply 2140 can be external from the remote projected source 2100 or internal to it.

The ionizing electromagnetic field can be controllably attenuated in the field projection portion 2104 to form an attenuated ionizing electromagnetic field. The ionizing electromagnetic field can be considered the attenuated ionizing electromagnetic field for instance, within the receiving portion 2106.

The attenuated ionizing electromagnetic field can extend into the receiving portion 2106 and can retain sufficient energy to sustain a second portion of the plasma 2108. The second portion of the plasma 2108 can also exist within the receiving portion 2106. This second portion of the plasma 2108 can have low energy and can be used in one or more processing steps of the receiving portion 2106 (e.g., substrate etching or generation of radicals for chamber cleaning, to name two).

The ionizing electromagnetic field can have a strength sufficient to ionize at least some particles and sustain a plasma. The ionizing electromagnetic field may have a field strength that varies by location. For example the ionizing electromagnetic field in the field generation portion 2102 may be stronger than the ionizing electromagnetic field in the field projection portion 2104, which may be stronger than the ionizing electromagnetic field in the receiving portion 2106. For purposes of this disclosure, a plasma is sustained by maintaining a desired plasma density (also known as electron or ion density), or by maintaining a rate of ionization that exceeds the rate of electron-ion recombination by a desired value. In an embodiment, a plasma is sustained when there is a plasma density of $10^8$ to $10^{13}$ free electrons per $cm^3$.

The plasma density can drop off or decrease near edges or surfaces within the remote projection source 2100 and the receiving portion 2106, in a region called a sheath 2108. The sheath 2109 is a region of plasma having a net positive charge due to a greater density of ions than electrons. A substantial percentage of voltage drops across the sheath 2109 due to strong electric fields in the sheath 2109 resulting from charge imbalance. The high field strength can be responsible for accelerating electrons into the plasma where they can impact neutral atoms and molecules in the plasma and ionize them. Thus, the field strength in the sheath 2109 can be responsible for accelerating electrons that ionize gas within the receiving portion 2106 and sustain the second portion of the plasma 2108. The sheath 2109 can exist in the generation portion 2102, the field projection portion 2104, and in the receiving portion 2106.

The field generation portion 2102 can operate at a range of AC frequencies, for instance in the VHF range, but can also sustain the first and second portions of the plasma 2108, 2110 via DC or pulsed-DC fields. The power, frequency, DC and/or AC bias, pulse width, and pulse modulation, along with other electrical characteristics of the field generation portion 2102 can be controlled via the control circuitry or logic 2150, which can be embodied in hardware, software, firmware, or a combination of these. One skilled in the art will recognize that the control circuitry or logic 2150 can be used with any of the embodiments that will be discussed in more depth later in this disclosure. Sensors for detecting plasma density or field strength (e.g., within the receiving portion 2106) can be in communication with the control circuitry or logic 2150 such that the field generation portion 2102 operates as a feedback or feedforward system. Detailed descriptions and figures of various non-limiting embodiments of field generation portions 2102 will be discussed with reference to FIGS. 22-25.

The field projection portion 2104 is a path (e.g., a grounded conductive tube with an inner surface made of a dielectric) wherein a voltage in the first portion of the plasma 2110 can be attenuated en route to the receiving portion 2106. In an embodiment, the voltage in the second portion of the plasma 2108 can be attenuated to a level lower than the voltage in the first portion of the plasma 2110, but still large enough to sustain the second portion of the plasma 2108 in the receiving portion 2106. The field projection portion 2104 can be a tube or other pathway having dimensions such that it attenuates the electromagnetic field that extends through it. Detailed descriptions and figures of various non-limiting embodiments of field projection portions 2104 will be discussed with reference to FIGS. 26a, 26b, 26c.

The receiving portion 2106 can receive the ionizing electromagnetic field from the field projection portion 2104. An exemplary receiving portion 2106 is a processing chamber (e.g., plasma processing chamber or a plasma chamber) where the second portion of the plasma 2108, free radicals, or both, can interact with a semiconductor or other substrate 2114 to carry out one or more processing steps (e.g., plasma enhanced etching, plasma enhanced chemical vapor deposition, or plasma sputtering, to name a few non-limiting examples). The substrate 2114 can rest upon a substrate support 2112. A switch mode power supply 2118, controlled by a ion energy controller 2119, can provide a periodic voltage to the substrate support 2112, or to an optional e-chuck 2112 embedded in the substrate support 2116. The periodic voltage can control an ion energy and ion energy distribution of ions in the plasma 2108. Additional circuitry for further controlling the ion energy and ion energy density as well as for generating a chucking force between the substrate 2114 and the substrate support 2112 will be discussed with reference to FIGS. 31-33. Detailed descriptions and figures of various non-limiting embodiments of the receiving portion 2106 will be discussed with reference to FIGS. 27-28.

The details of FIG. 21 are for illustrative purposes only and are not meant to limit the embodiments of each portion to the structures illustrated. Specific embodiments of each portion will be described in detail in the following discussions of FIGS. 22-28. Each figure will focus on an embodiment of one of the three portions 2102, 2104, 2106 and it is to be understood that in many instances embodiments of each portion 2102, 2104, 2106 are interchangeable with each other.

One advantage of the remote projected source 2100 and other embodiments discussed with reference to the other figures, is that the degrading effects of a high voltage plasma can be avoided within the processing chamber when plasma is desired in the chamber (e.g., for etching or creating radicals for chamber cleaning), while in low-ion-energy etching applications, a low-voltage plasma enables lower ion energy distributions. Furthermore, high frequency plasmas (e.g., 5-300 MHz) can be used in processing chambers that are only built for low frequency plasma.

Low energy ion applications such as chemical etching and ion-assisted deposition may not be compatible with the hundreds or thousands of volts often used to generate a plasma. No matter how low a sputtering or etching substrate holder bias is set to, for instance, ions will still have a significant portion of the energy used to generate them. Thus, a lower limit to ion energy may be set by the plasma generation energy rather than by the sputtering or etching bias on the substrate. By remotely generating high voltage fields and projecting them into the processing chamber, plasma can be generated and sustained within the processing chamber, but with orders of magnitude lower voltage (e.g., 0.5 V-10 V). With such projected and attenuated fields, the low limit of the ion energy distribution can be set independently of the plasma generation voltage.

Very high frequency (VHF) plasmas (e.g., 60 MHz) have a number of advantages, but when plasma is formed at VHF, the VHF waves in the plasma may require a more expensive and complex processing chamber to handle the VHF. For instance, the shorter wavelengths of VHF energy may be on the order of the size of a chamber window and thus able to escape the chamber. VHF chambers have smaller windows and other modifications that allow them to contain VHF radiation and last longer under the stresses of such radiation. By generating a plasma using projected fields that are attenuated when they reach the processing chamber, low frequency chambers can be used even where the remote plasma source generates the plasma using VHF energy.

Figure 22:
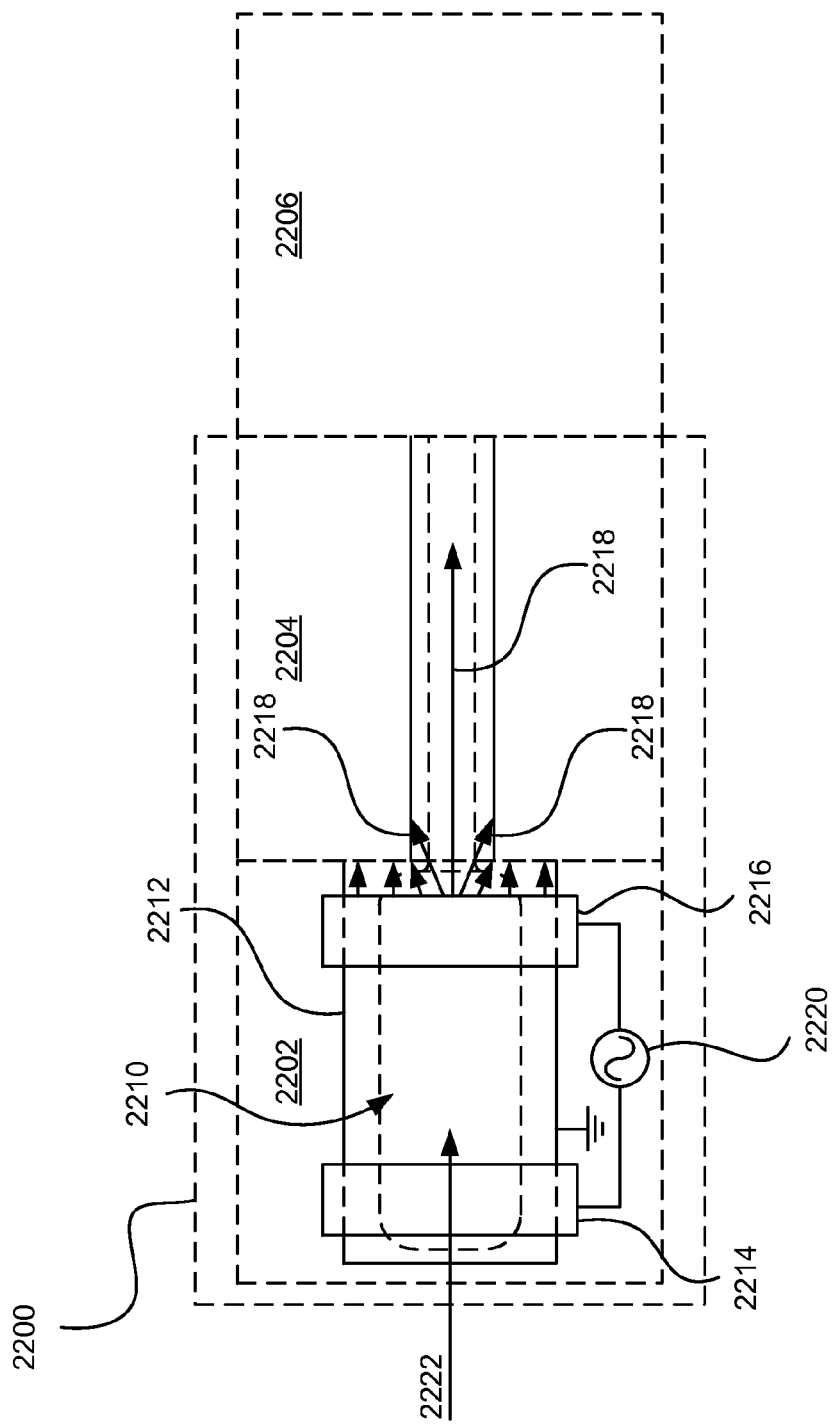
FIG. 22 illustrates another embodiment of a projected plasma source.

FIG. 22 illustrates another embodiment of a projected plasma source 2200. The projected plasma source 2200 has a field generation portion 2202 having two electrodes 2214, 2216 that electrostatically couple energy into a first portion of the plasma 2210 both for ignition of the first portion of the plasma 2210 and generation of an ionizing electric field 2218. The ionizing electric field 2218 extends through a field projection portion 2204 to a receiving portion 2206. A non-activated gas 2222 can be fed into a plasma generation chamber 2212 where a power source 2220 can apply power (e.g., a voltage) to a first electrode 2214 and a second electrode 2216 to electrostatically (capacitively) ionize at least a portion of the gas 2222 and ignite the first portion of the plasma 2210. A current loop through the power source 2220 and the electrodes 2214, 2216 can be completed via the first portion of the plasma 2210, which is conductive once ignited. Both electrodes 2214, 2216 can encircle or wrap around the plasma generation chamber 2212.

The ionizing electric field 2218 extends or is projected from the electrode 2216 towards any lower-potential surfaces. In the illustrated embodiment, the field projection portion 2204 can be grounded or biased (DC or AC or pulsed DC) at a lower potential than the electrode 2216, and thus the field 2218 can extend from the electrode 2216 to various portions of the field projection portion 2204. The receiving portion 2206 can also be grounded or at a lower potential than the electrode 2216 and thus the field 2218 can extend to the receiving portion 2206. Since plasma is generally charge neutral, a voltage potential difference and thus the start of the ionizing electric field 2218 may coincide with the interface between the generation portion 2202 and the field projection portion 2204.

In the exemplary embodiment depicted in FIG. 22, the ionizing electric field 2218 that generates and sustains the first portion of the plasma 2210 extends or is projected from the field generation portion 2202 to the receiving portion 2206 such that a second portion of the plasma (e.g., the second portion 2108 of FIG. 21) can be generated and sustained in the receiving portion 2206 remotely from the electrodes 2214, 2216 and the strongest portions of the ionizing electric field 2218. The ionizing electric field 2218 may also project ions from the field generation portion 2202 to the receiving portion 2206. However, under certain circumstances the force of the gas 2222 passing through the generation portion 2202 can have a larger effect on the movement of ions and non-charged particles towards the receiving portion 2206 than the ionizing electric field 2218. At the same time, the ionizing electric field 2218 that reaches the receiving portion 2206 continues to ionize at least a portion the gas 2222 that is pushed into the receiving portion 2206 and maintain ionizing of ionized particles.

While the power source 2220 is illustrated as an AC (e.g., RF) source, in some variations the power source 2220 can be a DC or pulsed DC power source. The power source 2220 can be a voltage or current source, for example. In some embodiments, high or low frequency RF can be applied to or coupled into the first portion of the plasma 2210, and in a particular embodiment, frequencies can be in the VHF range. RF frequencies can include the range 10 kHz to 1 GHz, 2-500 MHz, or 30-150 MHz. Some common plasma processing frequencies include 450 kHz, 2 MHz, 4 MHz, 13.56 MHz, and 27.12 MHz. In an embodiment, a single RF frequency can be coupled into the first portion of the plasma 2210 at the generation portion 2202, and in another embodiment, two or more RF frequencies can be coupled into the first portion of the plasma 2210. In an alternative embodiment, the first and second electrodes 2214, 2216 can be coupled via an inductor (not illustrated) generating a magnetic field that inductively couples power into the first portion of the plasma 2210. The inductor can be connected in parallel with the illustrated power source 2220.

The plasma generation chamber 2212 can be sized or have a cross section to match the cross section of the field projection portion 2204, although as illustrated, the plasma generation chamber 2212 has a larger cross section than a tube of the field projection portion 2204. The plasma generation chamber 2212 can also have a shape that enhances gas 2222 flow into the field projection section 2204 (e.g., a shape that matches that of the field projection portion 2204). In an embodiment, the plasma generation chamber 2212 includes a dielectric such as glass. In the illustrated embodiment, the plasma generation chamber 2212 is grounded, but it can also be floating and/or biased (e.g., a DC, AC, or pulsed DC). The plasma generation chamber 2212 can thus be DC biased in order to add an additional control over the ion energy and ion energy distribution of the plasma in the receiving portion 22106

The second electrode 2216 can generate an ionizing electric field 2218 and be arranged either flush with the field projection portion 2204 or offset from the field projection portion 2204 as illustrated. A voltage at the interface between the field generation portion 2202 and the field projection portion 2204 can be large enough to sustain a plasma within the receiving portion 2206. In other words, a sufficient density of plasma can be sustained within at least a portion of the receiving portion 2206. This can be facilitated by either a sufficiently-large ionizing electric field 2218 or by generating a greater plasma density in the field generation portion 2202. In an embodiment, a voltage at the interface between the field generation portion 2202 and the field projection portion 2204 is large enough to sustain a plasma density of at least $10^9$ free electrons per cm$^3$, and up to $10^{13}$ free electrons per cm$^3$, at the interface between the field projection portion 2204 and the receiving portion 2206 or in at least a portion of the receiving portion 2206.

Figure 23:
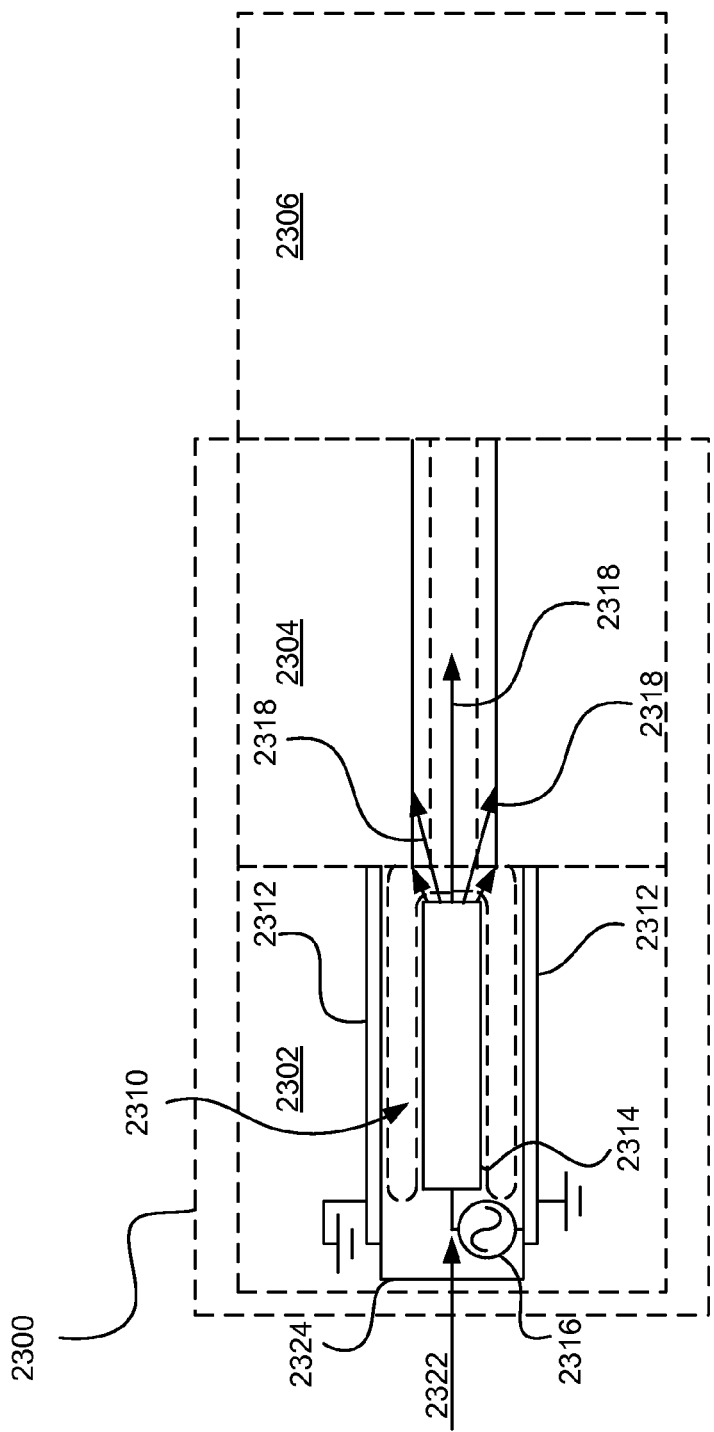
FIG. 23 illustrates yet another embodiment of projected plasma source.

FIG. 23 illustrates yet another embodiment of a projected plasma source 2300. The projected plasma source 2300 includes a field generation portion 2302 having a central electrode 2314 and a perimeter electrode 2312 that together electrostatically couple energy into a first portion of a plasma 2310 to both ignite and sustain the first portion of the plasma 2310. The electrodes 2312, 2314 also generate an ionizing electric field 2318 that extends or projects into a receiving portion 2306. A power source 2316 generates a current between the central electrode 2314 and the perimeter electrode 2312 of a plasma generation chamber 2324. The perimeter electrode 2312 can be part of an outer surface or enveloping surface of the plasma generation chamber 2324. The perimeter electrode 2312 can be grounded as illustrated, or can be floating or AC, DC, or pulsed DC biased. The central electrode 2314 can be axially arranged in the plasma generation chamber 2324. Non-activated gas 2322 can pass into the plasma generation chamber 2324 and be at least partially ionized by the ionizing electric field 2318 generated by a voltage between the central electrode 2314 and the perimeter electrode 2312. This ionizing electric field 2318 can include radial components when the plasma generation chamber 2324 is tubular. The plasma generation chamber 2324 can also be rectangular or have a square cross section, to name two other non-limiting examples.

The plasma generation chamber 2324 can be shaped and sized to match the cross section of the field projection portion 2304. In the illustrated embodiment, the plasma generation chamber 2324 diameter is larger than that of a tube of the field projection portion 2304. In other embodiments, the chamber 2324 diameter can be less than or equal to the diameter of the tube of the field projection portion 2304.

The illustrated electric field lines of the electric field 2318 are illustrative only and should not be interpreted as having a limiting shape. For instance, in some variations a more accurate rendition of the electric field lines might show an inflection point in the electric field lines at edges of the plasma, for instance where the electric field lines enter the sheath region. Also, the shape of the first portion of the plasma 2310 is illustrative only and should not be interpreted as a limitation. While the power source 2316 is illustrated as an AC (e.g., RF) source, in some variations the power source 2316 can be a DC or pulsed DC power source. The power source 2316 can be a voltage or current source, for example.

Figure 24:
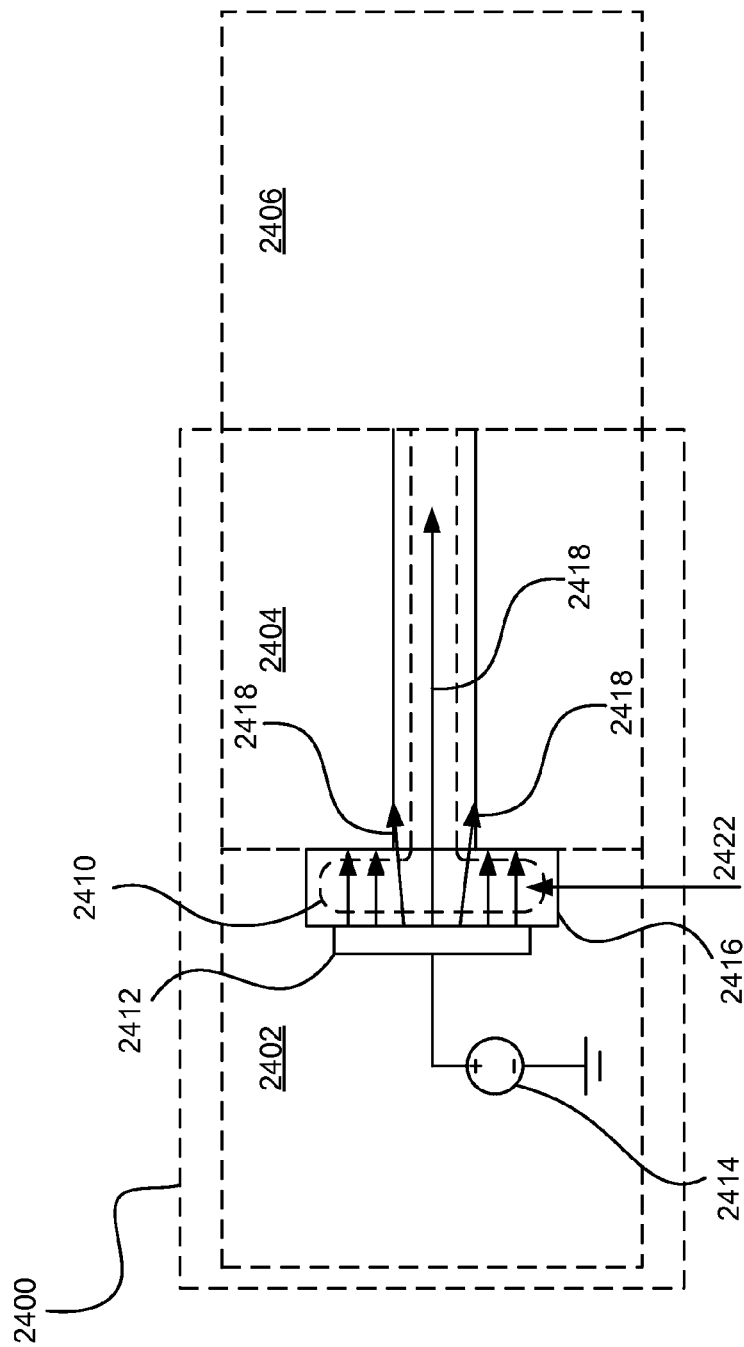
FIG. 24 illustrates still another embodiment of projected plasma.

FIG. 24 illustrates still another embodiment of a projected plasma source 2400. The projected plasma source 2400 includes a field generation portion 2402 having a single electrode 2412 that electrostatically couples energy into a first portion of a plasma 2410 to ignite and sustain the first portion of the plasma 2410. The electrode 2412 also generates an ionizing electric field 2418 that extends or projects into the receiving portion 2406. A non-activated gas 2422 can be fed into a plasma generation chamber 2416 as illustrated, or via a conduit that passes through the electrode 2412 and is perpendicular to the electrode 2412. In some variations the power source 2414 can be AC, pulsed AC, or DC. The power source 2414 can be a voltage or current source, for example.

In some implementations of the exemplary embodiment, the electrode 2412 can form one of two capacitive electrodes with the second being formed from a substrate holder of the receiving portion 2406. The second electrode can also be distributed between the substrate holder, a substrate, and walls or other lower potential surfaces of the receiving portion 2406 and the field projection portion 2404. The electrode 2412 can generate a voltage at the interface between the field generation portion 2402 and the field projection portion 2404 where the voltage decreases as a function of distance from the electrode 2412. The electrode 2412 is illustrated as being coupled to an outside of the plasma generation chamber 2416, but in variations can form an outer surface of the plasma generation chamber 2416, or can be arranged within the plasma generation chamber 2416. The plasma generation chamber 2416 is illustrated as having a greater cross section or diameter than that of a tube of the field projection portion 2404; however in some embodiments the plasma generation chamber 2416 can be shaped and sized to match a cross section of the tube of the field projection portion 2404. Moreover, the illustrated plasma 2410 shape is merely illustrative and should not be interpreted as a limitation.

The ionizing electric field 2418 is directed from the electrode 2412 towards any surfaces having a lower potential. For instance, in the illustrated embodiment, the field projection portion 2404 comprises a tube at a lower potential (e.g., grounded) than the electrode 2412, and thus the ionizing electric field 2418 is directed axially down the field projection portion 2404 tube as well as into the tube sidewalls. This example is merely illustrative, and many other embodiments include features and structure that can affect the ionizing electric field 2418 field lines in various alternative fashions.

Figure 25:
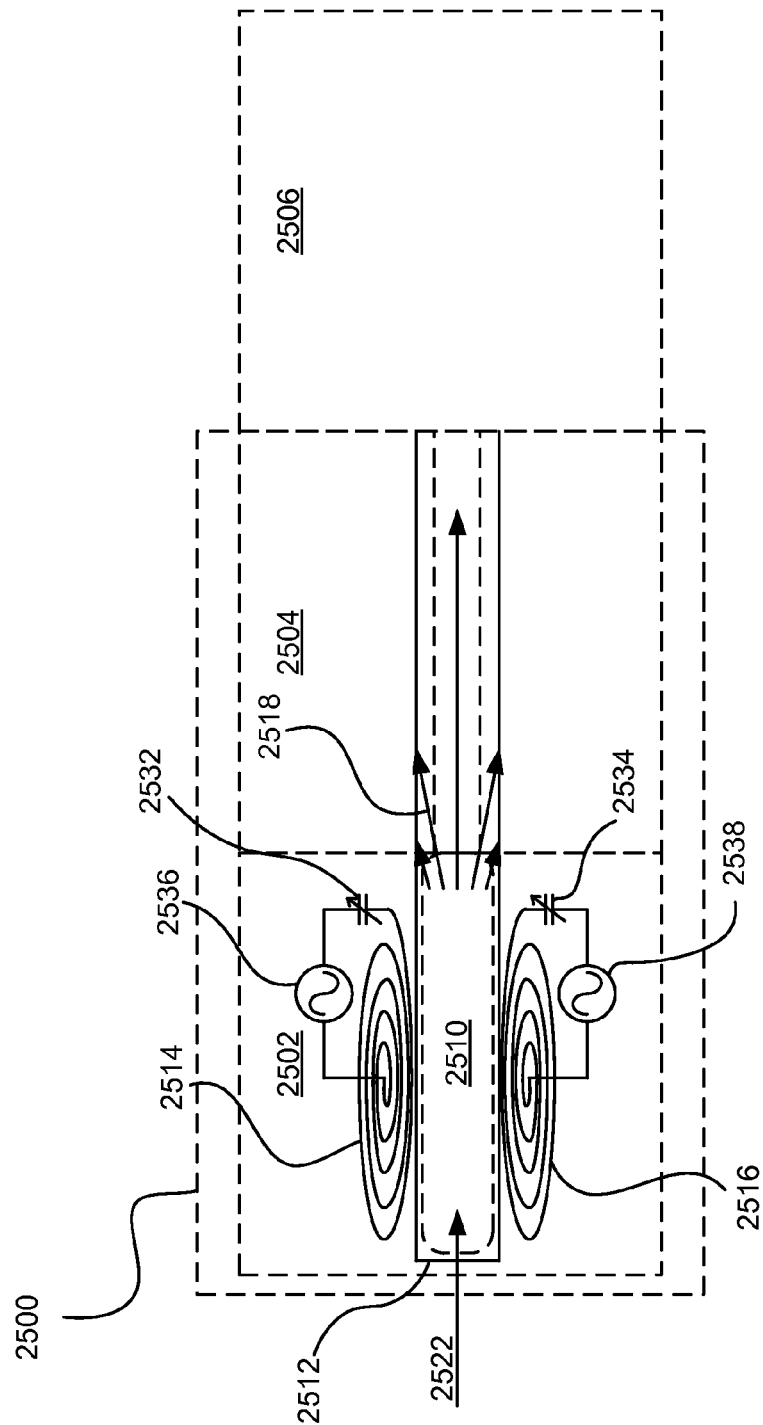
FIG. 25 illustrates another embodiment of a projected plasma source.

FIG. 25 illustrates another embodiment of a projected plasma source 2500. The projected plasma source 2500 has a field generation portion 2502 that can inductively (and somewhat capacitively) couple to a first portion of a plasma 2510 and generate an ionizing electric field 2518 that extends or projects into the receiving portion 2506. The field generation portion 2502 includes two inductors 2514, 2516 to inductively sustain the plasma 2510. As shown, a non-activated gas 2522 is fed into a plasma generation chamber 2512 and AC current passing through the first and second inductors 2514, 2516 inductively couples power into the first portion of the plasma 2510 to sustain the first portion of the plasma 2510 and ionize at least a portion of the gas 2522. Inductive coupling is the result of an AC (e.g., RF), pulsed DC, or any other time-varying current being passed through each of the inductors 2514, 2516, and is generated by power sources 2536, 2538.

The power sources 2536, 2538 can generate a radial bias on the inductors 2514, 2516 (e.g., highest potential on an outermost loop of each inductor 2514, 2516 and gradually decreasing potential on each smaller-diameter loop) such that an ionizing electric field 2518 is generated that extends or projects towards and into the receiving portion 2506 with enough energy to sustain a plasma within the receiving portion 2506. Such a bias can be established via variable capacitors 2532, 2534, although non-variable capacitors can also be used. The variable capacitors 2532, 2534 can control the potential between outer and inner loops of the inductors 2514, 2516 (e.g., via control circuitry or logic 2150 as described with reference to FIG. 21) and consequently control the ionizing electric field strength 2518, which in turn controls the plasma density within the receiving portion 2506.

A non-activated gas 2522 can be fed into the plasma generation chamber 2512 wherein AC current passing through the first and second inductors 2514, 2516 inductively couples into first portion of the plasma 2510 to sustain the first portion of the plasma 2510 and ionize at least a portion of the gas 2522.

The ionizing electric field 2518 can be generated via a potential difference between outer loops of each of the inductors 2514, 2516 and the field projection portion 2504 and/or the receiving portion 2506. For instance, where the field projection portion 2504 is a grounded conductive tube, outer loops of the inductors 2514, 2516 will be at a higher potential than the field projection portion 2504 and thus the ionizing electric field 2518 will be directed from the inductors 2514, 2516 to portions of the field projection portion 2504 (e.g., walls of a conductive tube). In another example, the receiving portion 2506 may also be grounded such that the ionizing electric field 2518 is directed towards the field projection portion 2504 and the receiving portion 2506. The center of the inductors 2514, 2516 (innermost loops) can be at a higher or lower potential than the outer loops of the inductors 2514, 2516. However, whatever the potential difference between the central loops of the inductors 2514, 2516 and the outer loops, the outer loops are at a higher potential than the field projection portion 2504 and the receiving portion 2506. As such, the inductors 2514, 2516 generate the ionizing electric field 2518 that extends or projects into the receiving portion 2506.

The inductors 2514, 2516 of the illustrated embodiment are angled slightly for illustrative purposes only. In implementation, the two inductors 2514, 2516 are parallel to each other, to the plasma generation chamber 2512, and to first portion of the plasma 2510. In an embodiment, the first and second inductors 2514, 2516 are spiral-shaped conductors comprising a plurality of coils or loops, and are in planar arrangements, where a plane through the first inductor 2514 is parallel to a plane through the second inductor 2516. In this embodiment, power primarily couples inductively to the first portion of the plasma 2510, although capacitive coupling also can occur and can be used for ignition. While the inductors are illustrated as separate and as having separate power sources 2536, 2538, they can also be conductively coupled and/or biased via a single power source (e.g., power source 2536).

Various embodiments of a plasma generating portion 2502 utilizing inductive coupling via two inductors 2514, 2516 are described in greater detail in provisional patent application 61/466,024, which is incorporated herein by reference.

As illustrated, there can be an offset, space, or gap between the inductors 2514, 2516 and the field projection portion 2504. Such a gap can diminish the ionizing electric field 2518 strength at the interface between the field generation portion 2502 and the field projection portion 2504. If the inductors 2514, 2516 are arranged closer to the field projection portion 2504 such that the gap is reduced or eliminated, then a stronger ionizing electric field 2518 can exist in the field projection portion 2504 and in the receiving portion 2506.

Although the illustrated embodiment shows each of the inductors being capacitively biased, in variations, only one of the inductors 2514, 2516 is capacitively biased. While capacitors 2532 and 2534 are illustrated, other types of reactive impedances can replace the capacitors 2532, 2534 (e.g., inductors). Although not illustrated, a dielectric can be arranged between each of the inductors 2514, 2516 and first portion of the plasma 2510. For instance an inner surface of the plasma generation chamber 2512 can be coated in a dielectric. The chamber 2512 can even be partially made from a dielectric. The ionizing electric field 2518 and plasma 2510 shapes are illustrative only and should not be interpreted as limiting.

Figure 26A:
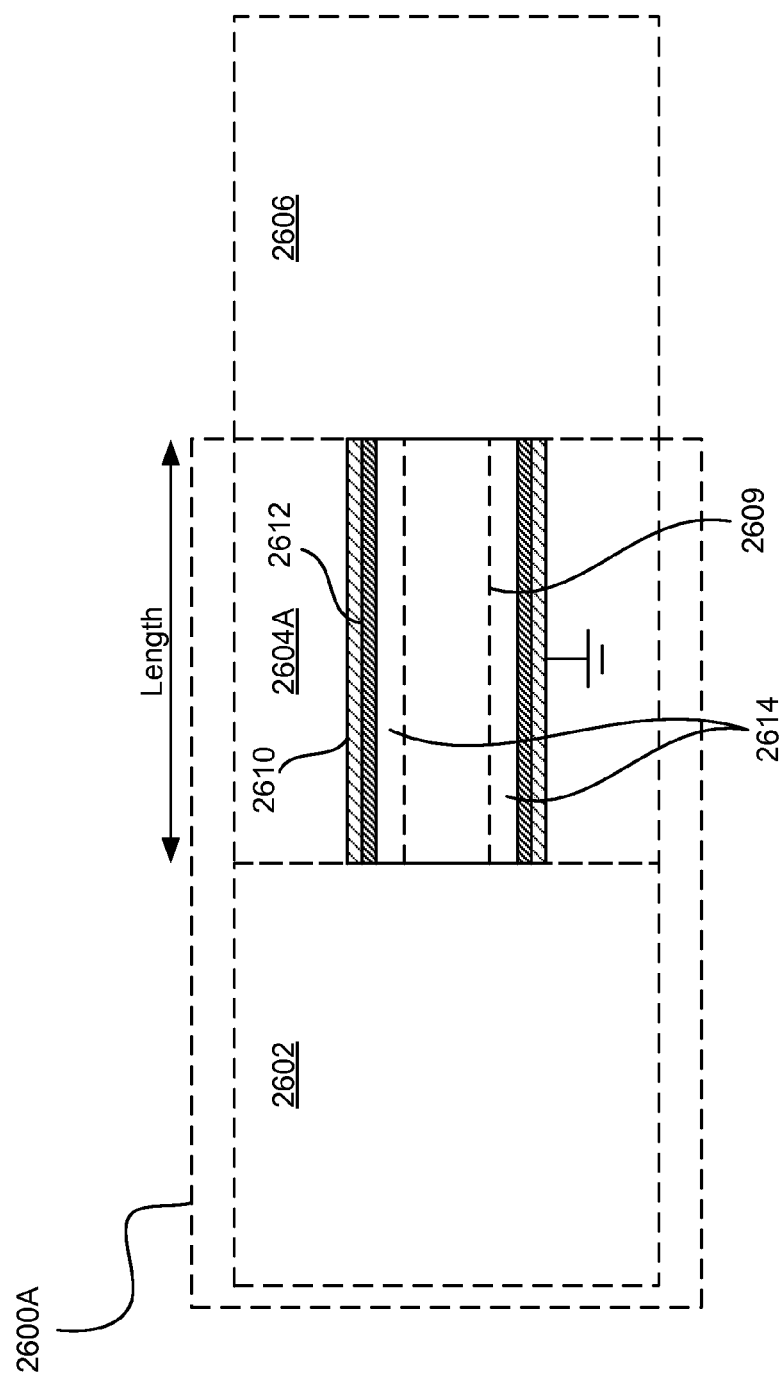
FIG. 26A illustrates an embodiment a field projection portion of a projected plasma source.

FIG. 26a illustrates an embodiment a field projection portion 2604A of a projected plasma source 2600. The projected plasma source 2600A has a field projection portion 2604A comprising a grounded conductive tube 2610 with a dielectric layer 2612 between a third portion of a plasma 2609 and the conductive tube 2610. An ionizing electric field generated in the field generation portion 2602 extends or is projected into and through the field projection portion 2604A and then into the receiving portion 2606. The field strength at the interface between the field generation portion 2602 and the field projection portion 2604A can be greater than the field strength at the interface between the field projection portion 2604A and the receiving portion 2606. The field strength decays or is attenuated during passage through the field projection portion 2604A, and this attenuation is controllable. At one extreme, the attenuation can be negligible, while at the other extreme, the attenuation can cause the field strength to attenuate to a level just large enough to sustain a second portion of the plasma in the receiving portion 2606. A controller or other mechanism can be used to controllably set the attenuation to any level within this range.

The attenuation can be controlled by the length of the field projection portion 2604A, by the field projection portion 2604A cross section (e.g., height and width), and/or by the dielectric 2612. For example, changing the field projection portion 2604A to include one or more of a greater length, smaller cross section, higher dielectric constant, and greater dielectric thickness, will cause greater attenuation. Additionally, if less than the entire inner surface of the grounded conductive tube 2610 is covered by the dielectric 2612, then attenuation will be smaller. A decreased cross section not only attenuates the field strength, but the gas pressure increases, which causes a higher rate of particle collisions which can quench the plasma and decrease plasma density (e.g., at high electron energies electron collisions tend to be ionizing, while at lower electron energies, collisions tend to lead to electron absorption). Thus, a desired plasma density at the interface of the field projection portion 2604A and the receiving portion 2606 can be selected and varied based on the above-mentioned parameters. The above-mentioned parameters can also control a sheath 2614 thickness, where the sheath 2614 is a region of plasma having a net positive charge due to a greater density of ions than electrons. The sheath 2614 thickness can be modified in order to control a plasma density within the receiving portion 2606.

The grounded conductive tube 2610 can also have shapes other than a tube, such as a square, rectangular, or ovular cross section, to name just a few non-limiting examples. The conductive tube 2610 is illustrated as being grounded, but may also be floating, or have a DC bias.

Figure 26B:
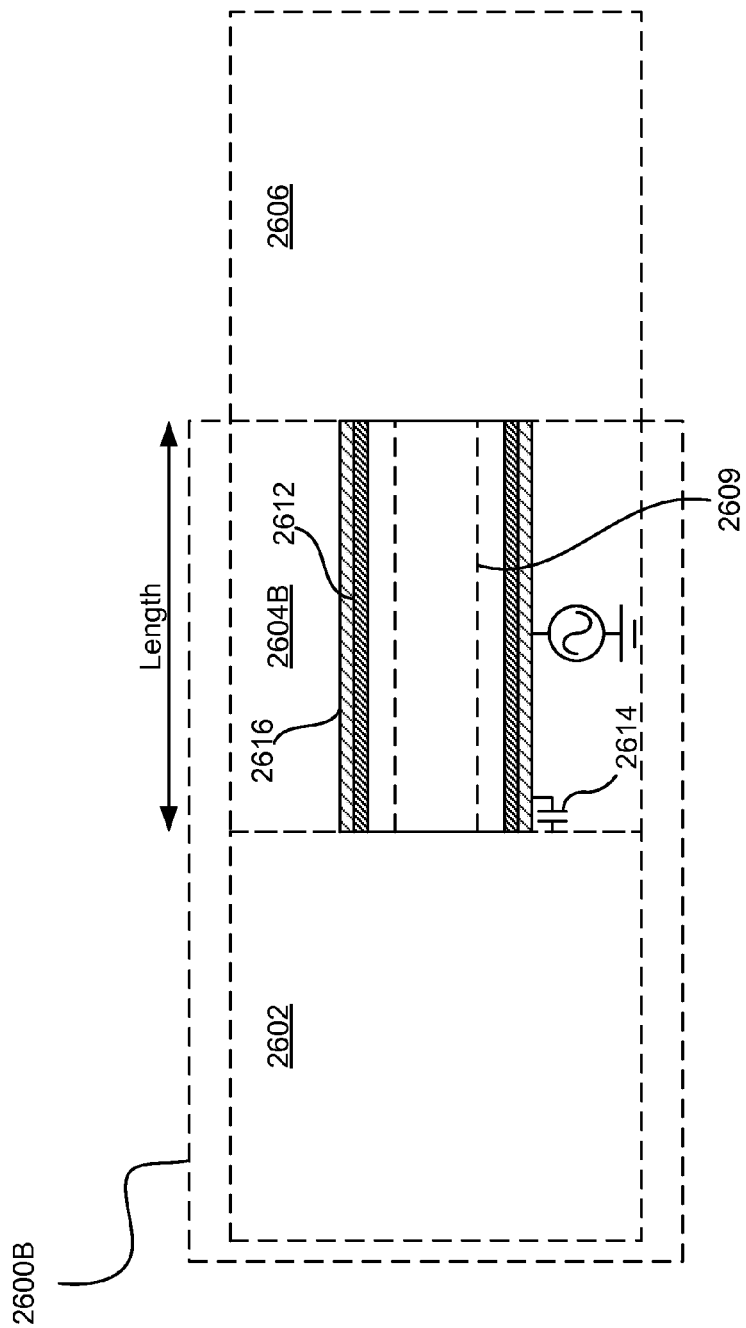
FIG. 26B illustrates another embodiment of a field projection portion of a projected plasma source.

FIG. 26b illustrates another embodiment of a field projection portion 2604B of a projected plasma source 2600B. The projected plasma source 2600B can have a field projection portion 2604B comprising a biased conductive tube 2616 with a dielectric layer 2612 between the third portion of the plasma 2609 and the biased conductive tube 2616. The biased conductive tube 2616 can have an AC bias (as illustrated) that is phase shifted from the AC applied in the field generation portion 2602, where the phase shift can be selected so that an additional electric field component enhances the electric field strength reaching the receiving portion 2606. Additional field strength may enable greater plasma densities in the receiving portion 2606. The AC bias can be controlled via control circuitry or logic such as that discussed with reference to FIG. 21. The control circuitry or logic can be in communication with one or more sensors within the projected plasma source 2600B and/or the receiving portion 2606 in order to provide feedback or feedforward control of the AC bias. In a variation, no bias is applied to the conductive tube 2616, and instead the conductive tube 2616 is floating.

The biased conductive tube 2616 can be flush with an opening in the receiving portion 2606. However, in an embodiment, a portion of the biased conductive tube 2616 can extend into the receiving portion 2606. Such extension can help keep the third portion of the plasma 2609 from interacting with the inner walls of the receiving portion 2606. Additionally, magnetic fields can enhance confinement of the third portion of the plasma 2609 within the field projection portion 2604B (e.g., coaxial magnetic fields). Coaxial magnetic fields can also be used to enhance field extension and projection into the receiving portion 2606.

The biased conductive tube 2616 may be electrically isolated from the structure of the field generation portion 2602 via one or more capacitors 2614 or any other device having an impedance with a reactive component. The capacitor 2614 can be variable in order to add a further parameter of control over the ionizing electric field, and can be controlled by control circuitry or logic such as control circuitry or logic 2150 as discussed with reference to FIG. 21. The location of the capacitor 2614 is merely illustrative, and not meant to limit where the capacitor 2614 can be coupled to the field generation portion 2602.

In one variation, the biased conductive tube 2616 can be DC biased (possibly in combination with an AC bias) so as to controllably attenuate the ionizing electric field. By altering the DC bias, the level of attenuation, and thus the field strength in the receiving portion 2606, can be controlled.

Figure 26C:
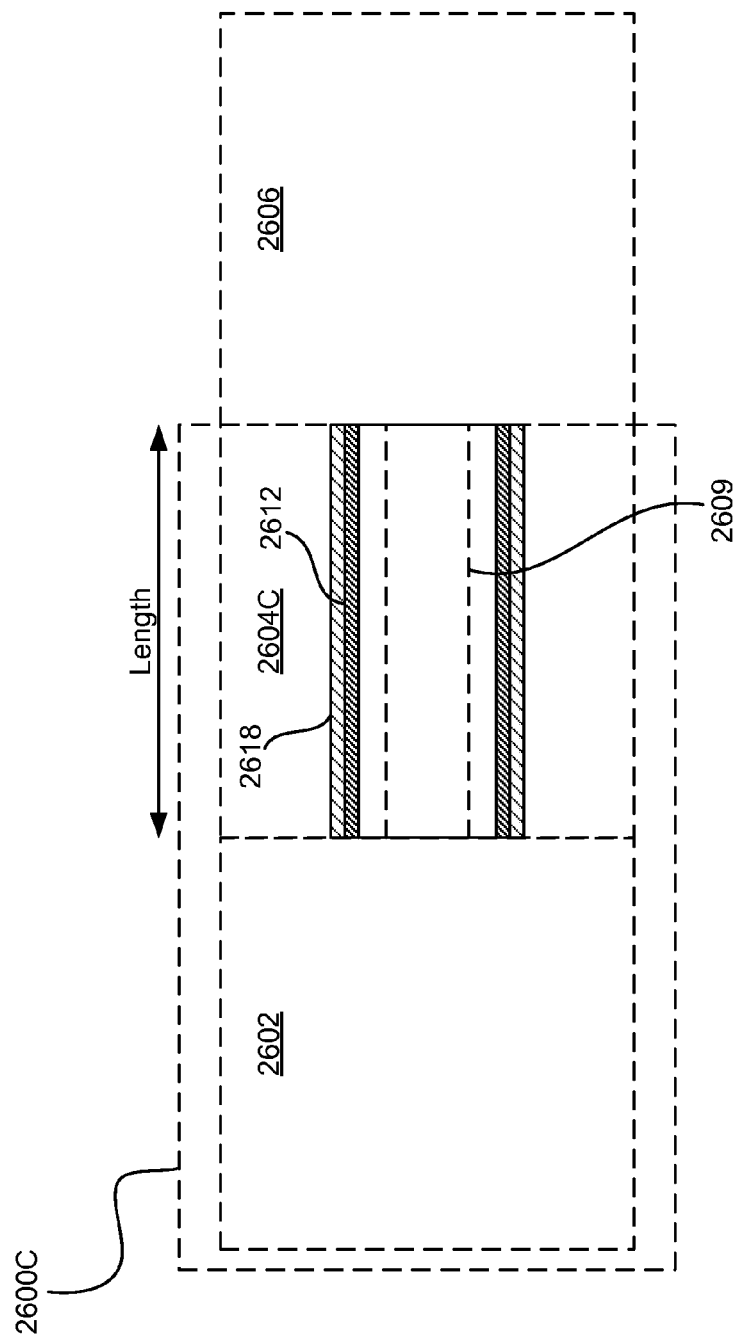
FIG. 26C illustrates yet another embodiment of a field projection portion.

FIG. 26c illustrates yet another embodiment of a field projection portion 2604C. The projected plasma source 2600C has a field projection portion 2604C comprising a floating conductive tube 2618 with a dielectric layer 2612 between the third portion of the plasma 2609 and the floating conductive tube 2618.

The plasma 2609 shape in FIGS. 26a, 26b, and 26c is merely illustrative and should not be interpreted as limiting.

Figure 27A:
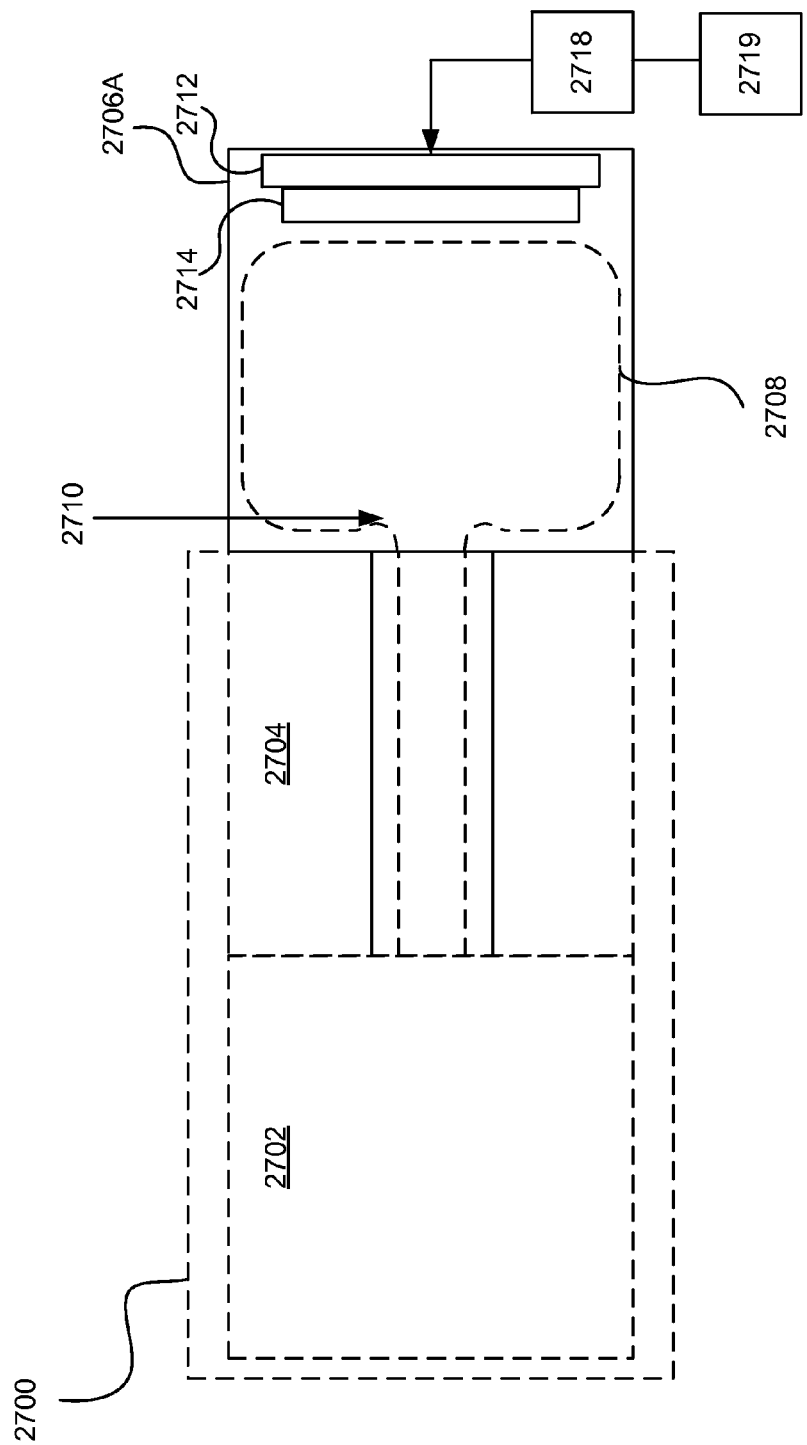
FIG. 27A illustrates an embodiment of a receiving portion coupled to an exemplary projected plasma source.

FIG. 27a illustrates an embodiment of a receiving portion 2706A coupled to an exemplary projected plasma source 2700. The projected plasma source 2700 is coupled to a receiving portion 2706A with a second portion of a plasma 2708 being sustained in the receiving portion 2706A. The ionizing electric field enters the receiving portion 2706A with enough strength and voltage to ionize some particles and sustain the second portion of the plasma 2708. Since the second portion of the plasma 2708 may be entering the receiving portion 2706A, an energy to sustain the second portion of the plasma 2708 may be lower than it would be were there no plasma 2708 to assist the ionization process. The second portion of the plasma 2708 can be used for any of a variety of semiconductor and thin-film processing and chamber cleaning operations. For instance, etching a substrate 2714 fixed to a substrate holder 2712 and biased via power source 2718, or generating radicals for cleaning surfaces inside the receiving portion 2706A after a deposition process, or assisting in deposition of a thin film on the substrate 2714, to name just three non-limiting examples.

The power source 2718, whether AC, DC, pulsed DC or any other time-varying power, can be controlled via control circuitry or logic such as the control circuitry or logic 2150 discussed with reference to FIG. 21. Sensors in the receiving portion 2706A can communicate with the control circuitry or logic so that the power source 2718 can be feedback or feedforward controlled.

Substrates can include semiconductor wafers, glass sheets, and polymer sheets, to name just a few non-limiting examples. The substrate 2714 can be biased through the conductive substrate holder 2712 via an AC, pulsed DC, or other time-varying bias 2718 as illustrated, or can be DC biased or grounded. In an embodiment, the substrate 2714 can be biased with both an AC and DC bias.

Figure 27B:
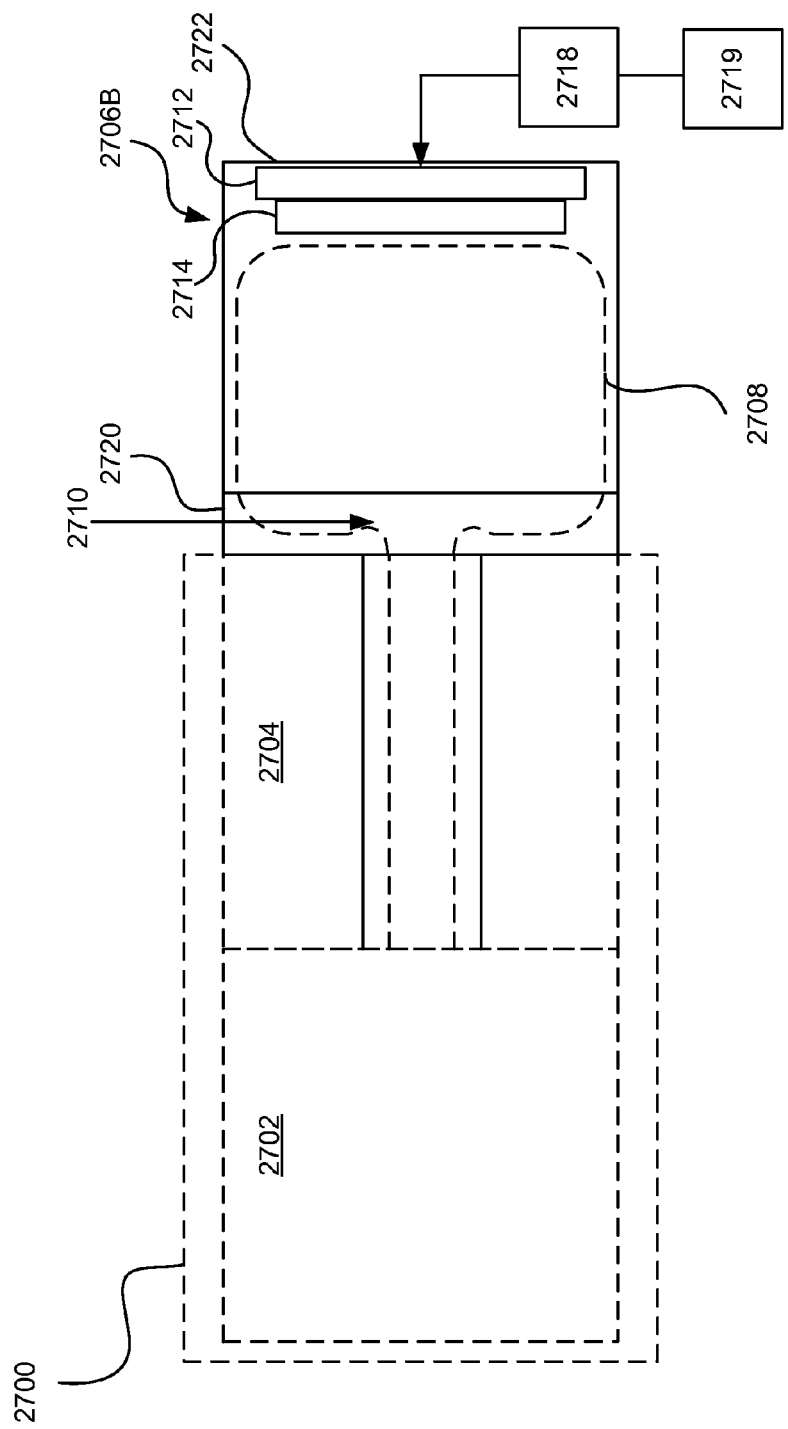
FIG. 27B illustrates another embodiment of a receiving portion coupled to an exemplary plasma source.

In an embodiment, the receiving portion 2706A includes a plasma processing chamber. The plasma processing chamber can be constructed to handle and contain low frequency plasma. In an embodiment, the receiving portion 2706A includes an optional gas-plasma interaction chamber 2720 coupled to a plasma processing chamber 2722. Non-activated gas 2710 and the second portion of the plasma 2708 can interact to form radicals in the gas-plasma interaction chamber 2720 (see FIG. 27b). In FIG. 27b, the receiving portion 2706B includes a plasma processing chamber 2722 and a gas-plasma interaction chamber 2720.

Referring again to FIG. 27a, in some plasma processing applications (e.g., metal etching) it can be desirable to use a plasma with a negligible voltage relative to a primary ion bias (e.g., power supply 2718). Typically, in-situ-generated plasma has an inherent voltage that adds to the primary ion bias, and even where the primary ion bias is set to zero, the sum of the plasma bias and the primary ion bias can be greater than desired. Thus, in-situ generated plasma can set a lower limit on ion energy.

By providing an attenuated ionizing electric field to the receiving portion 2706A, the plasma bias can be significantly reduced or eliminated, for instance, to a point at which the plasma bias can be neglected relative to the primary ion bias. The receiving portion 2706A can include a substrate 2714 biased via power source 2718 through the substrate holder 2712 with a bias that is dominated by the power source 2718 rather than energy in the second portion of the plasma 2708. In other words, the second portion of the plasma 2708 energy bias effect on ions in the receiving portion 2706A or on the substrate bias 2714 can be negligible relative to the bias of the power source 2718. In an embodiment, the effective minimum voltage bias (or the minimum ion energy distribution) applied to the substrate 2714 is less than that associated with in-situ plasma generation. The second portion of the plasma 2708 can be associated with ion energies in the receiving portion 2706A of around 1 V or less. For instance, ion energies of the second portion of the plasma 2708 can be 0.001 to 0.1 of the voltage of an in-situ-generated plasma.

The second portion of the plasma 2708 having low ion energy has a variety of semiconductor and thin-film processing applications. For instance, the second portion of the plasma 2708 can be used in etching (e.g., plasma-assisted chemical etching) where experimental results demonstrate that silicon etch rates of at least 34 microns per minute are possible using the systems, methods, and apparatuses herein disclosed. This high etch rate has particular application to through-wafer vias, silicon thinning, and other silicon etching. If scaled, this high etch rate may be applicable to large area uniform etching of multiple wafers within a single processing chamber, for instance via an array of projected plasma sources. The second portion of the plasma 2708 can also be used in sputtering, ion implantation, deposition (e.g., plasma assisted chemical vapor deposition, ALD, and MOCVD, to name a few), photoresist strip, polymer etching, low-K ashing, and in-situ cleaning.

The plasma can be directed and distributed throughout the receiving portion 2706A via a variety of means including physical deflectors (e.g., baffles, angled deflectors, showerheads) or electromagnetic plasma directing means (e.g., an electric field that changes a plasma direction as it enters the receiving portion 2706A).

In an embodiment, non-activated gas 2710 can be directed to contact the second portion of the plasma 2708 after the plasma 2708 enters the receiving portion 2706A. As the non-activated gas 2710 contacts the second portion of the plasma 2708, the second portion of the plasma 2708 excites particles in the non-activated gas 2710 and energizes at least a portion of the gas 2710 to form radicals that can be used for various semiconductor and thin-film processing applications. Advantageously, this embodiment allows radicals to be formed without the disadvantages of remote sources or traditional in-situ sources. Specifically, since the radicals are formed inside the plasma receiving portion 2706A, they do not have to travel from a remote source and potentially interact with system components and gas molecules en route to a processing chamber. Also, since the high energy used to form the ionizing electric field is remote from the receiving portion 2706A and the ionizing electric field has just enough energy to sustain the second portion of the plasma 2708, the receiving portion 2706A will not be damaged by high energy power in the plasma, etched by high energy ions, nor release high frequency power, for instance via a glass viewing window of the processing chamber. Thus, several embodiments combine the advantages of remote sources and in-situ sources while avoiding their disadvantages.

In another embodiment, two or more different streams of radicals can be formed at different locations in the projected plasma source 2700. For instance, a first non-activated gas (e.g., $NF_3$ or $N_2$, to name two) can pass through the plasma in the field generation portion 2702 and be at least partially ionized to form first radicals. The first radicals and the ionizing electric field can pass through the field projection portion 2704 and into the receiving portion 2706A. A second non-activated gas (e.g., silane) 2710 can interact with the second portion of the plasma 2708 at or near an entrance to the receiving portion 2706A and be at least partially ionized by the second portion of the plasma 2708 to form second radicals. Both the first and second radicals can then be used in the receiving portion 2706A for various semiconductor and thin-film processes (e.g., chamber cleaning). In an embodiment, the non-activated gas 2710 such as silane can be dispersed into the receiving portion 2706A via a ring-shaped dispersing mechanism (not illustrated) so that the non-activated gas 2710 is distributed in a ring pattern.

Figure 28:
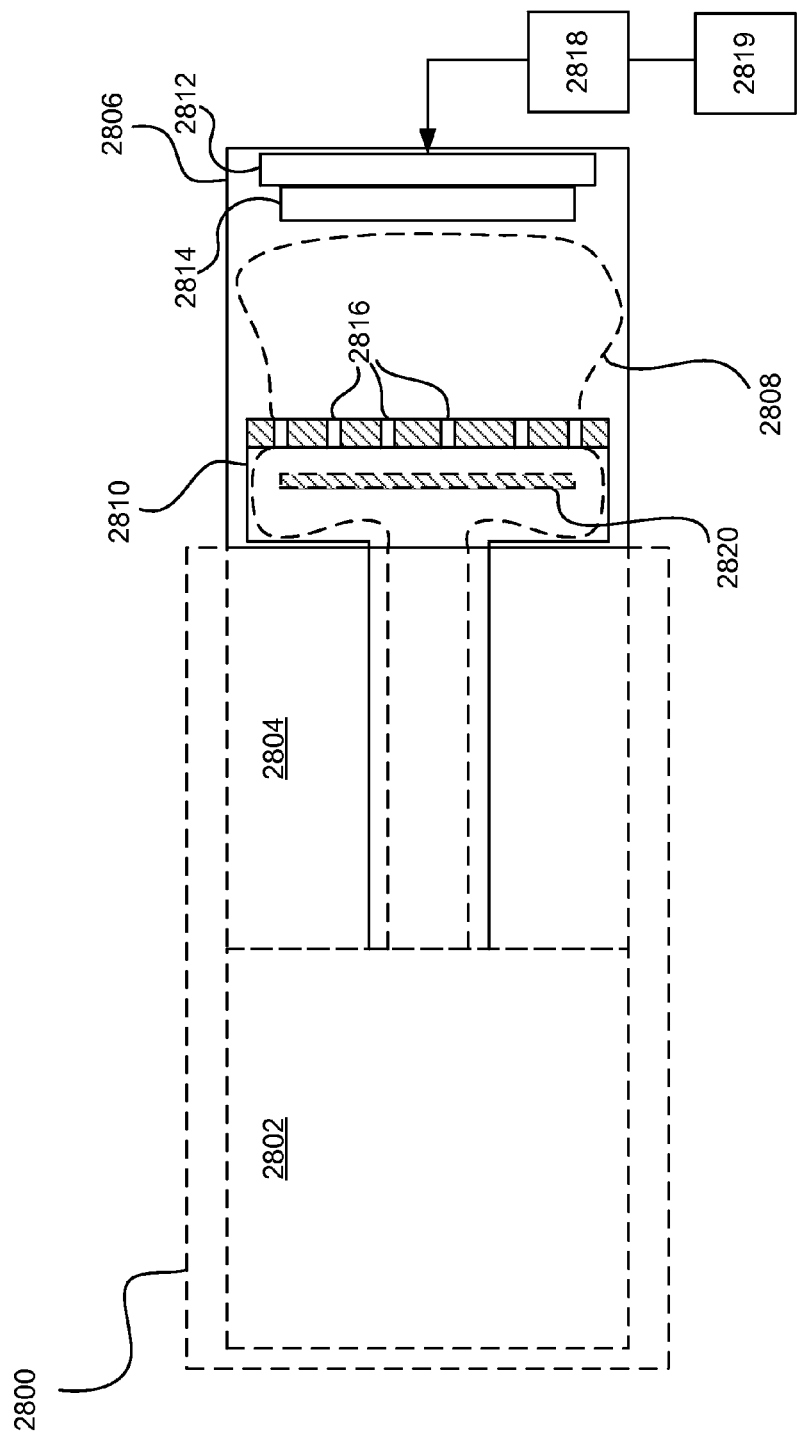
FIG. 28 illustrates yet another embodiment of a receiving portion.

FIG. 28 illustrates yet another embodiment of a receiving portion 2806. The receiving portion 2806 is coupled to a projected plasma source 2800 and includes a gas displacer 2820 and a showerhead 2810 for dispersing and directing gas flow to a substrate 2814 coupled to a biased substrate holder 2812. For plasma-assisted deposition, a gas can feed into the showerhead 2810 and pass through a plurality of apertures 2816 in order to direct and disperse the gas in the receiving portion 2806. Optionally, a displacer 2820 can further disperse the gas within the showerhead 2810. The gas can then be used to deposit thin films on the substrate 2814, which is biased through the substrate holder 2812 by a power source 2818.

Thin film tends to deposit throughout the processing chamber rather than just on the substrate 2814. These surfaces can be cleaned (after removing the substrate 2814) via exposing them to radicals formed when a non-activated gas is passed through a plasma. One way to do this is via radical formation in a remote source. However, some of the radicals, in particular charged particles and energetic atomic species, neutralize before they reach the receiving portion 2806 and are thus not typically part of the cleaning process (e.g., ions become non-ionized and energized particles lose some of their energy). Yet, these charged particles or energetic atomic species are desirable since they can enhance cleaning.

A projected plasma increases the number of energetic particles that can be used in cleaning the receiving portion 2806 by generating some radicals within the receiving portion 2806 itself. While many radicals are still formed by passing a non-activated gas through a first portion of a plasma in the generation portion 2802, a second portion of the plasma 2808 is sustained within the receiving portion 2806 such that radicals continue to be formed even within the receiving portion 2806. Since these radicals are far closer to the surfaces to be cleaned, more energetic particles are available to take part in cleaning than when a remote non-projected source is used. Hence, the projected plasma source 2800 produces a far more effective mix of radicals for cleaning the receiving portion 2806 than known remote sources.

While the power source 2818 is illustrated as an AC (e.g., RF) source, in some variations the power source 2818 can be a DC or pulsed DC power source. The power source 2818 can be a voltage or current source, for example. In some variations, the substrate holder 2812 and the substrate 2808 are not biased (e.g., the substrate holder 2812 can be grounded or floating).

Traditional showerheads 2810 may not stand up to the heat and reactivity of plasma and thus may have to be reengineered in order to withstand interaction with the second portion of the plasma 2808. However, in some embodiments, the projected plasma source as disclosed herein can be used in combination with typical and unaltered receiving portions 2806. Avoiding the showerhead 2810 of FIG. 28 may be preferable where a greater density of the second portion of the plasma 2808 is desired for direct interaction with the substrate 2814 (e.g., etching). For such applications, the showerhead 2810 can reduce the plasma density since the second portion of the plasma 2808 can be extinguished when passing through the apertures 2816 (e.g., via contact with 'cool' surfaces of the apertures 2816 and higher pressure as the second portion of the plasma 2808 passes through the apertures 2816).

Figure 29:
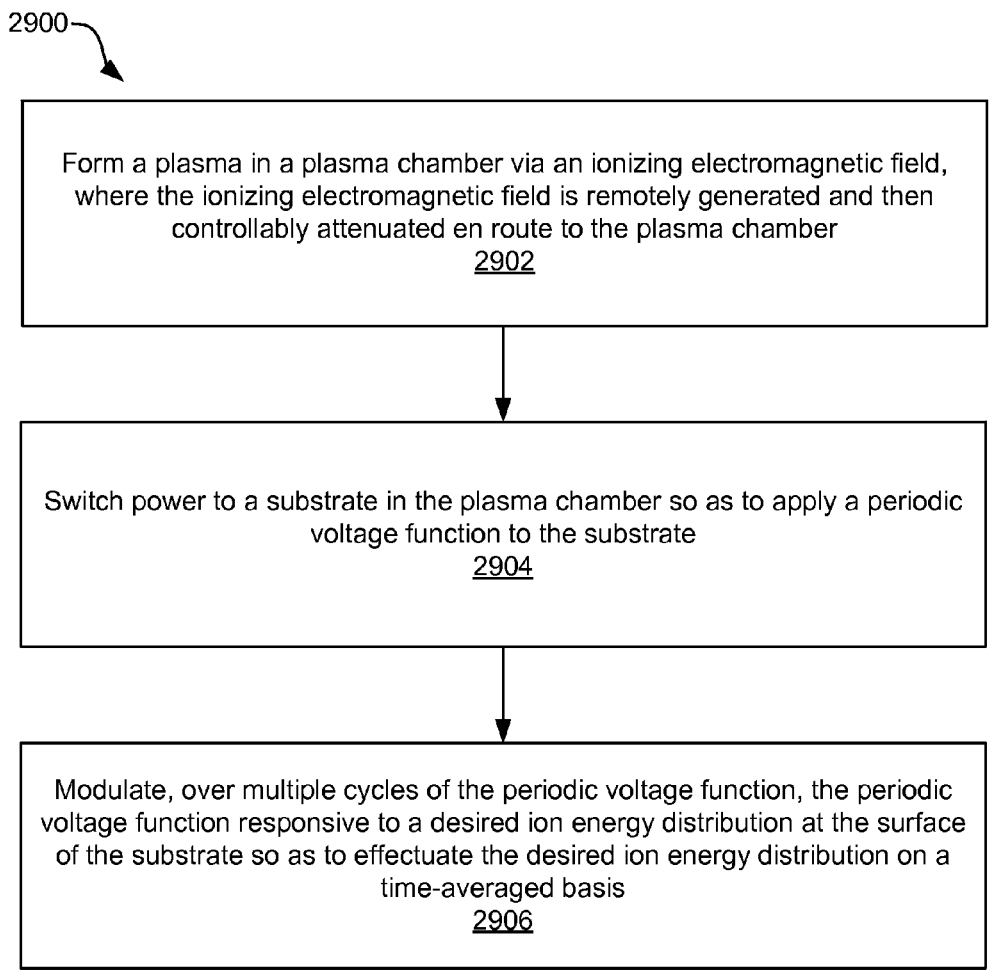
FIG. 29 illustrates a method according to one embodiment of this disclosure.

FIG. 29 illustrates one method according to an embodiment of this disclosure. The method 2900 includes a form a plasma operation 2902 that involves forming a plasma in a plasma chamber via an ionizing electromagnetic field, where the ionizing electromagnetic field is remotely generated and then controllably attenuated en route to the plasma chamber. In other words, a remote projected plasma source generates an ionizing electromagnetic field that is extended or projected to a plasma processing chamber and controllably attenuated in route, such that a plasma is ignited and sustained within the chamber, yet the field strength igniting and sustaining the plasma is low enough that it does not affect an ion energy or ion energy distribution of ions in the plasma. The method 2900 further includes a switch power operation 2904 in which power is switched to a substrate in the plasma chamber so as to apply a periodic voltage function to the substrate operation. The method 2900 also includes a modulate operation 2906 in which the periodic voltage function is modulated, over multiple cycles of the periodic voltage function, responsive to a desired ion energy distribution at the surface of the substrate so as to effectuate the desired ion energy distribution on a time-averaged basis. For instance, the modulation can be a sinusoidal or sawtooth wave to name two non-limiting examples.

Figure 30:
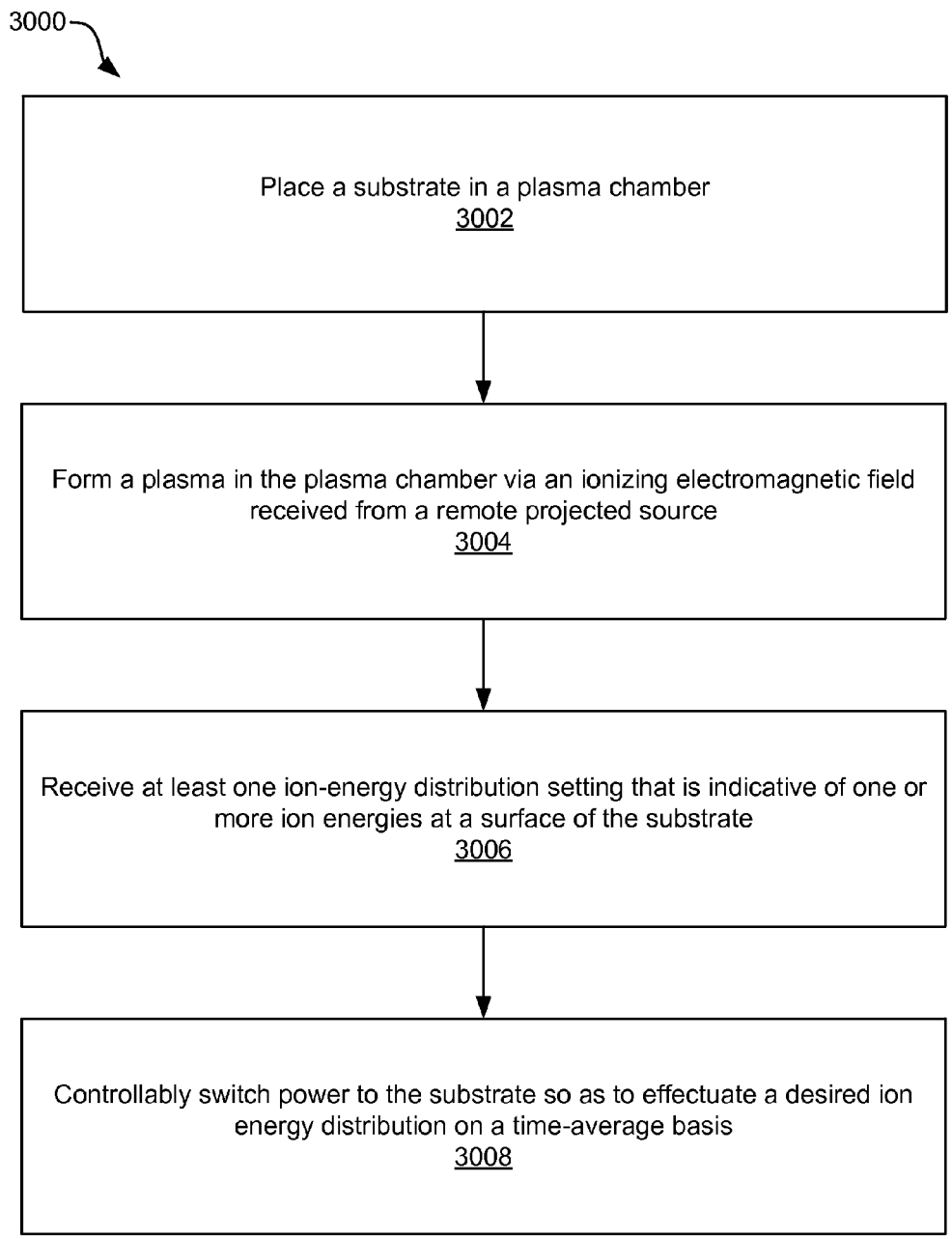
FIG. 30 illustrates a method according to one embodiment of this disclosure.

FIG. 30 illustrates another method according to an embodiment of this disclosure. The method 3000 can include placing a substrate in a plasma chamber in a place substrate operation 3002. The method 3000 can further include a form a plasma operation 3004 in which a plasma is formed in the chamber via an ionizing electromagnetic field received from a remote projected source. The ionizing electromagnetic field can be generated remotely in a remote projected plasma source. The field can then be extended or projected through a projection portion (e.g., a conductive and dielectric-coated tube) where the field can be controllably attenuated. When the field reaches the chamber, the field strength can be attenuated to such an extent that the field does not affect an ion energy and an ion energy density of ions in the plasma. The method 300 further includes a received operation 3006 in which at least one ion-energy distribution setting is received and that setting is indicative of one or more ion energies at a surface of the substrate. The method 3000 can also include a switch operation 3008 in which power to the substrate is controllably switched so as to effectuate a desired distribution of ion energies on a time-averaged basis.

In conclusion, the present disclosure provides, among other things, a method and apparatus for selectively generating desired ion energies using a switch-mode power. Those skilled in the art can readily recognize that numerous variations and substitutions may be made in the disclosure, its use, and its configuration to achieve substantially the same results as achieved by the embodiments described herein. Accordingly, there is no intention to limit the disclosure to the disclosed exemplary forms. Many variations, modifications, and alternative constructions fall within the scope and spirit of the disclosure.

What is claimed is:

1. A system for plasma-based processing, comprising:
a field generation portion that generates an ionizing electromagnetic field, wherein the ionizing electromagnetic field extends out of the field generation portion;
a plasma processing chamber configured to receive the ionizing electromagnetic field and configured to contain the plasma, wherein the plasma is sustained by the ionizing electromagnetic field, and wherein the ionizing electromagnetic field is attenuated en route to the plasma processing chamber;
a substrate support positioned within the plasma processing chamber and disposed to support a substrate;
a controllable DC power supply to provide a DC voltage that is fixed in magnitude in response to a setting for a monoenergetic distribution of ion energy at the surface of the substrate;
two switching components and a controller to alternately couple a ground potential and the DC voltage to the substrate support to apply a voltage waveform to the substrate support that includes a positive voltage peak followed by a drop in voltage to the ground potential, wherein the drop in the voltage effectuates a negative voltage at the surface of the substrate that prompts ion current in the plasma processing chamber;
a DC current source coupled to the substrate support to provide compensation current to the substrate support to compensate for the tendency of the ion current in the plasma processing chamber to change the voltage at the surface of the substrate in order to maintain the negative voltage level at the surface of the substrate;
a voltage monitor coupled to the substrate support to monitor the voltage waveform applied to the substrate support;
a compensation current controller coupled to the DC current source to fix, based upon the monitored voltage, the compensation current provided to the substrate support to maintain the negative voltage level at the surface of the substrate.

2. The system of claim 1 further comprising a field projection portion coupled between the field generation portion and the plasma processing chamber, wherein the field projection portion attenuates the ionizing electromagnetic field as it passes through the field projection portion.

3. The system of claim 2, wherein the field projection portion controllably attenuates the ionizing electromagnetic field via a controllable electrical bias applied to the field projection portion.

4. The system of claim 1, wherein the two switching components are DC-coupled to the substrate support.

5. The system of claim 1, including an additional power supply coupled to the substrate support, the additional power supply adapted to apply power to the substrate support so as to sustain the plasma in the plasma processing chamber.

6. The system of claim 1, wherein the ionizing electromagnetic field extends to the plasma processing chamber as a result of a potential difference between the field generation portion and the plasma processing chamber.

7. The system of claim 1, wherein a non-activated gas is fed into the plasma processing chamber and converted at least in part into first radicals by the ionizing electromagnetic field.

* * * * *